US012765105B2

(12) United States Patent
Akiyama et al.

(10) Patent No.: US 12,765,105 B2
(45) Date of Patent: Oct. 13, 2026

(54) SOLID-STATE IMAGING DEVICE, METHOD OF MANUFACTURING SOLID-STATE IMAGING DEVICE, AND ELECTRONIC DEVICE

(71) Applicant: SONY SEMICONDUCTOR SOLUTIONS CORPORATION, Kanagawa (JP)

(72) Inventors: Kentaro Akiyama, Kanagawa (JP); Tatsumasa Hiratsuka, Kanagawa (JP); Takahiro Kamei, Kanagawa (JP); Yosuke Nitta, Kanagawa (JP)

(73) Assignee: Sony Semiconductor Solutions Corporation, Kanagawa (JP)

(*) Notice: Subject to any disclaimer, the term of this patent is extended or adjusted under 35 U.S.C. 154(b) by 681 days.

(21) Appl. No.: 18/248,951

(22) PCT Filed: Sep. 15, 2021

(86) PCT No.: PCT/JP2021/033839
§ 371 (c)(1),
(2) Date: Apr. 13, 2023

(87) PCT Pub. No.: WO2022/091615
PCT Pub. Date: May 5, 2022

(65) Prior Publication Data

US 2023/0395636 A1 Dec. 7, 2023

(30) Foreign Application Priority Data

Oct. 26, 2020 (JP) ................................ 2020-178823

(51) Int. Cl.
*H10F 39/00* (2025.01)

(52) U.S. Cl.
CPC ......... *H10F 39/811* (2025.01); *H10F 39/018* (2025.01); *H10F 39/809* (2025.01)

(58) Field of Classification Search
CPC ....... H01L 2224/80896; H01L 25/0652; H01L 25/167; H01L 25/041; H10D 62/731;
(Continued)

(56) References Cited

U.S. PATENT DOCUMENTS

2018/0026067 A1 1/2018 Lee et al.
2018/0286910 A1* 10/2018 Kobayashi ............ H10F 39/802
(Continued)

FOREIGN PATENT DOCUMENTS

EP 3706169 A1 9/2020
JP 2019134078 A 8/2019
(Continued)

OTHER PUBLICATIONS

International Search Report and Written Opinion prepared by the Japan Patent Office on Nov. 11, 2021, for International Application No. PCT/JP2021/033839, 3 pgs.

*Primary Examiner* — Alia Sabur
(74) *Attorney, Agent, or Firm* — SHERIDAN ROSS P.C.

(57) ABSTRACT

To provide a solid-state imaging device capable of further improving quality and reliability of the solid-state imaging device. Provided is a solid-state imaging device including: a first substrate; a second substrate laminated on the first substrate by direct bonding on a side opposite to a light incident side of the first substrate, the second substrate having a size different from a size of the first substrate; a third substrate provided on a side opposite to a light incident side of the second substrate; and an insulating layer formed between the first substrate and the third substrate, in which the third substrate includes a well formed on a light incident side of the third substrate.

20 Claims, 42 Drawing Sheets

(58) Field of Classification Search
CPC ... H10D 62/102; H10F 39/018; H10F 39/809; H04N 25/70; H10W 90/10
See application file for complete search history.

(56) References Cited

U.S. PATENT DOCUMENTS

| | | | | |
|---|---|---|---|---|
| 2019/0237495 | A1 | 8/2019 | Shoyama | |
| 2019/0333957 | A1 | 10/2019 | Kim et al. | |
| 2019/0355706 | A1* | 11/2019 | Enquist | H01L 25/18 |
| 2020/0091217 | A1* | 3/2020 | Horikoshi | H10F 39/811 |
| 2020/0258924 | A1* | 8/2020 | Takachi | H10F 39/199 |
| 2021/0005658 | A1* | 1/2021 | Yukawa | H10F 39/809 |
| 2022/0005858 | A1* | 1/2022 | Saito | H10F 39/809 |
| 2022/0037382 | A1* | 2/2022 | Komai | H10F 39/809 |
| 2022/0149102 | A1 | 5/2022 | Nishioka | |

FOREIGN PATENT DOCUMENTS

| | | | | | |
|---|---|---|---|---|---|
| JP | 2019165312 | A | * | 9/2019 | H04N 25/70 |
| JP | 2020-150112 | | | 9/2020 | |
| WO | WO-2018186191 | A1 | * | 10/2018 | H04N 25/70 |
| WO | WO 2019/087764 | | | 5/2019 | |
| WO | WO 2020/129686 | | | 6/2020 | |
| WO | WO-2020184478 | A1 | | 9/2020 | |

* cited by examiner

SOLID-STATE IMAGING DEVICE, METHOD OF MANUFACTURING SOLID-STATE IMAGING DEVICE, AND ELECTRONIC DEVICE

CROSS REFERENCE TO RELATED APPLICATIONS

This application is a national stage application under 35 U.S.C. 371 and claims the benefit of PCT Application No. PCT/JP2021/033839, having an international filing date of 15 Sep. 2021, which designated the United States, which PCT application claimed the benefit of Japanese Patent Application No. 2020-178823, filed 26 Oct. 2020, the entire disclosures of each of which are incorporated herein by reference.

TECHNICAL FIELD

The present technology relates to a solid-state imaging device, a method of manufacturing the solid-state imaging device, and an electronic device.

BACKGROUND ART

In general, solid-state imaging devices such as complementary metal oxide semiconductor (CMOS) image sensors and charge coupled devices (CCD) are widely used in digital still cameras, digital video cameras, and the like.

In recent years, as a bonding technology that enables cost reduction of an image sensor for a large-sized camera and mixed mounting of a plurality of types of logic and memory chips, chip on wafer (CoW) or chip on chip (CoC) that directly bonds a chip to a wafer or a chip has been actively developed (For example, see Patent Document 1.).

CITATION LIST

Patent Document

Patent Document 1: WO 2019/087764 A

SUMMARY OF THE INVENTION

Problems to be Solved by the Invention

However, the technology proposed in Patent Document 1 may not be able to further improve the quality and reliability of the solid-state imaging device.

Therefore, the present technology has been made in view of such a situation, and a main object thereof is to provide a solid-state imaging device and a method of manufacturing the solid-state imaging device capable of further improving quality and reliability of the solid-state imaging device, and an electronic device equipped with the solid-state imaging device.

Solutions to Problems

As a result of intensive research to solve the above-described object, the present inventors have succeeded in further improving the quality and reliability of the solid-state imaging device, and have completed the present technology.

That is, in the present technology, as a first aspect, provided is a solid-state imaging device including:

a first substrate;

a second substrate laminated on the first substrate by direct bonding on a side opposite to a light incident side of the first substrate, the second substrate having a size different from a size of the first substrate;

a third substrate provided on a side opposite to a light incident side of the second substrate; and an insulating layer formed between the first substrate and the third substrate, in which the third substrate includes a well formed on a light incident side of the third substrate.

In the solid-state imaging device according to the first aspect of the present technology, the third substrate may be in contact with the second substrate, and the third substrate may be in contact with the insulating layer.

The well included in the third substrate may be formed to separate a different potential region included in the second substrate.

In the solid-state imaging device according to the first aspect of the present technology, the well included in the third substrate may be formed up to a region corresponding to an end surface of the second substrate facing the insulating layer, and an end surface of the well and the end surface of the second substrate may be substantially flush with each other.

In the solid-state imaging device according to the first aspect of the present technology, the well included in the third substrate may be formed up to a region corresponding to an outside of an end surface of the second substrate facing the insulating layer, an end surface of the well may not be flush with the end surface of the second substrate, and the end surface of the well may be located in a region corresponding to the insulating layer.

In the solid-state imaging device according to the first aspect of the present technology, the second substrate may include a well formed on a side opposite to a light incident side of the second substrate.

In the solid-state imaging device according to the first aspect of the present technology, the third substrate may include a well formed on a light incident side of the third substrate and a substrate, and at least one of at least a part of the well or at least a part of the substrate may be electrically connected to the second substrate.

In the solid-state imaging device according to the first aspect of the present technology, at least a partial region of a surface of the third substrate in contact with the second substrate may have a resistance of 1 Ωcm or more.

In the solid-state imaging device according to the first aspect of the present technology, a surface of the second substrate in contact with the third substrate and a surface of the insulating layer in contact with the third substrate may be substantially flush with each other.

In the solid-state imaging device according to the first aspect of the present technology, the insulating layer may include at least one of an inorganic oxide film or an organic film.

Furthermore, in the present technology, as a second aspect, provided is a solid-state imaging device including:

a first substrate;

a second substrate laminated on the first substrate by direct bonding on a side opposite to a light incident side of the first substrate, the second substrate having a size different from a size of the first substrate;

a third substrate provided on a side opposite to a light incident side of the second substrate; and an insulating layer formed between the first substrate and the third substrate, in which the third substrate is in contact with the second substrate, and the third substrate is in contact with the insulating layer.

In the solid-state imaging device according to the second aspect of the present technology, the third substrate may include a well formed on a light incident side of the third substrate.

In the solid-state imaging device according to the second aspect of the present technology, the well included in the third substrate may be formed to separate a different potential region included in the second substrate.

In the solid-state imaging device according to the second aspect of the present technology, the well included in the third substrate may be formed up to a region corresponding to an end surface of the second substrate facing the insulating layer, and an end surface of the well and the end surface of the second substrate may be substantially flush with each other.

In the solid-state imaging device according to the second aspect of the present technology, the well included in the third substrate may be formed up to a region corresponding to an outside of an end surface of the second substrate facing the insulating layer, an end surface of the well may not be flush with the end surface of the second substrate, and the end surface of the well may be located in a region corresponding to the insulating layer.

In the solid-state imaging device according to the second aspect of the present technology, the second substrate may include a well formed on a side opposite to a light incident side of the second substrate.

In the solid-state imaging device according to the second aspect of the present technology, the third substrate may include a well formed on a light incident side of the third substrate and a substrate, and at least one of at least a part of the well or at least a part of the substrate may be electrically connected to the second substrate.

In the solid-state imaging device according to the second aspect of the present technology, at least a partial region of a surface of the third substrate in contact with the second substrate may have a resistance of 1 Ωcm or more.

In the solid-state imaging device according to the second aspect of the present technology, a surface of the second substrate in contact with the third substrate and a surface of the insulating layer in contact with the third substrate may be substantially flush with each other.

In the solid-state imaging device according to the second aspect of the present technology, the insulating layer may include at least one of an inorganic oxide film or an organic film.

Moreover, in the present technology, as a third aspect, provided is a solid-state imaging device including:

a first substrate;

a second substrate laminated on the first substrate by direct bonding on a side opposite to a light incident side of the first substrate, the second substrate having a size different from a size of the first substrate;

a third substrate provided on a side opposite to a light incident side of the second substrate;

an insulating layer formed between the first substrate and the third substrate; and at least one film formed between the first substrate and the third substrate and including a material different from a material constituting the insulating layer, in which the insulating layer and the at least one film are formed in order from a light incident side, the at least one film is in contact with the second substrate, the at least one film is in contact with the insulating layer, and the at least one film is in contact with the third substrate.

In the solid-state imaging device according to the third aspect of the present technology, a surface of the second substrate in contact with the at least one film may be substantially flush with a surface of the insulating layer in contact with the at least one film.

In the solid-state imaging device according to the third aspect of the present technology, a surface of the second substrate in contact with the at least one film may not be flush with a surface of the insulating layer in contact with the at least one film, and the surface of the insulating layer in contact with the at least one film may be located closer to a side of the first substrate than the surface of the second substrate in contact with the at least one film.

In the solid-state imaging device according to the third aspect of the present technology, the insulating layer may include at least one of an inorganic oxide film or an organic film.

A solid-state imaging device according to the third aspect of the present technology may further include a metal diffusion prevention film, in which the metal diffusion prevention film may be formed to cover a surface of the insulating layer that is not in contact with the at least one film, and the metal diffusion prevention film may be disposed between the second substrate and the insulating layer and between the first substrate and the insulating layer.

In the solid-state imaging device according to the third aspect of the present technology, the at least one film may include at least one selected from a group consisting of a heat dissipation member, a member having a film stress larger than a film stress of Si, and a member having a linear expansion coefficient larger than a linear expansion coefficient of Si.

In the solid-state imaging device according to the third aspect of the present technology, the heat dissipation member may contain at least one selected from a group consisting of SiC, AlN, SiN, Cu, Al, and C.

In the solid-state imaging device according to the third aspect of the present technology, the member having a film stress larger than the film stress of Si may contain at least one selected from a group consisting of $SiO_2$, SiN, Cu, Al, and C.

Furthermore, in the present technology, as a fourth aspect, provided is a solid-state imaging device including:

a first substrate;

a second substrate laminated on the first substrate by direct bonding on a side opposite to a light incident side of the first substrate, the second substrate having a size different from a size of the first substrate;

a third substrate provided on a side opposite to a light incident side of the second substrate; and a cavity formed between the first substrate and the third substrate, in which the third substrate is in contact with the second substrate, and the third substrate is in contact with the cavity.

In the solid-state imaging device according to the fourth aspect of the present technology, provided is the solid-state imaging device according to [20], in which the third substrate includes a well formed on a light incident side of the third substrate.

In the solid-state imaging device according to the fourth aspect of the present technology, the well included in the third substrate may be formed to separate a different potential region included in the second substrate.

In the solid-state imaging device according to the fourth aspect of the present technology, the well included in the third substrate may be formed up to a region corresponding to an end surface of the second substrate facing the cavity, and an end surface of the well and the end surface of the second substrate may be substantially flush with each other.

In the solid-state imaging device according to the fourth aspect of the present technology, the well included in the third substrate may be formed up to a region corresponding to an outside of an end surface of the second substrate facing the cavity, an end surface of the well may not be flush with the end surface of the second substrate, and the end surface of the well may be located in a region corresponding to the cavity.

In the solid-state imaging device according to the fourth aspect of the present technology, the second substrate may include a well formed on a side opposite to a light incident side of the second substrate.

In the solid-state imaging device according to the fourth aspect of the present technology, the third substrate may include a well formed on a light incident side of the third substrate and a substrate, and at least one of at least a part of the well or at least a part of the substrate may be electrically connected to the second substrate.

In the solid-state imaging device according to the fourth aspect of the present technology, at least a partial region of a surface of the third substrate in contact with the second substrate may have a resistance of 1 Ωcm or more.

In the solid-state imaging device according to the fourth aspect of the present technology, a surface of the second substrate in contact with the third substrate and a surface of the cavity in contact with the third substrate may be substantially flush with each other.

Furthermore, in the present technology, as a fifth aspect, provided is a solid-state imaging device including:

a first substrate;

a second substrate laminated on the first substrate by direct bonding on a side opposite to a light incident side of the first substrate, the second substrate having a size different from a size of the first substrate;

a third substrate provided on a side opposite to a light incident side of the second substrate;

a cavity formed between the first substrate and the third substrate; and at least one film formed between the first substrate and the third substrate, in which the cavity and the at least one film are formed in order from a light incident side, the at least one film is in contact with the second substrate, the at least one film is in contact with the cavity, and the at least one film is in contact with the third substrate.

In a solid-state imaging device according to the fifth aspect of the present technology, a surface of the second substrate in contact with the at least one film may be substantially flush with a surface of the cavity in contact with the at least one film.

In a solid-state imaging device according to the fifth aspect of the present technology, a surface of the second substrate in contact with the at least one film may not be flush with a surface of the cavity layer in contact with the at least one film, and the surface of the cavity in contact with the at least one film may be located closer to a side of the first substrate than the surface of the second substrate in contact with the at least one film.

A solid-state imaging device according to the fifth aspect of the present technology may further include a metal diffusion prevention film, in which the metal diffusion prevention film may be formed to cover a surface of the cavity that is not in contact with the at least one film, and the metal diffusion prevention film may be disposed between the second substrate and the cavity and between the first substrate and the cavity layer.

In a solid-state imaging device according to the fifth aspect of the present technology, the at least one film may include at least one selected from a group consisting of a heat dissipation member, a member having a film stress larger than a film stress of Si, and a member having a linear expansion coefficient larger than a linear expansion coefficient of Si.

In a solid-state imaging device according to the fifth aspect of the present technology, the heat dissipation member may contain at least one selected from a group consisting of SiC, AlN, SiN, Cu, Al, and C.

In a solid-state imaging device according to the fifth aspect of the present technology, three member having a film stress larger than the film stress of Si may contain at least one selected from a group consisting of $SiO_2$, SiN, Cu, Al, and C.

As a sixth aspect, the present technology provides an electronic device equipped with any one of solid-state imaging devices according to the first to fifth aspects of the present technology.

The present technology provides, as a seventh aspect, a method of manufacturing a solid-state imaging device, the solid-state imaging device including:

a first substrate;

a second substrate laminated on the first substrate by direct bonding on a side opposite to a light incident side of the first substrate, the second substrate having a size different from a size of the first substrate;

a third substrate provided on a side opposite to a light incident side of the second substrate; and an insulating layer formed between the first substrate and the third substrate, in which the third substrate is in contact with the second substrate, and the third substrate is in contact with the insulating layer, the method including:

bonding the first substrate formed by a semiconductor process, and the second substrate determined to be a non-defective product by an electrical inspection out of the second substrates formed by a semiconductor process;

depositing an insulating layer on the first substrate and the second substrate from a side of the second substrate after the bonding; and thinning the second substrate and the insulating layer until the second substrate is exposed after depositing the layer.

In the method of manufacturing the solid-state imaging device according to the seventh aspect of the present technology, a surface of the second substrate obtained by the thinning may be substantially flush with a surface of the insulating layer obtained by the thinning.

In the method of manufacturing the solid-state imaging device according to the seventh aspect of the present technology, a surface of the second substrate obtained by the thinning and a surface of the insulating layer obtained by the thinning may not be flush with each other, and the surface of the insulating layer may be located closer to a side of the first substrate than the surface of the second substrate.

According to the present technology, it is possible to further improve the quality and reliability of the solid-state imaging device. Note that the effects described herein are not necessarily limited, and may be any of the effects described in the present disclosure.

BRIEF DESCRIPTION OF DRAWINGS

FIG. 27 is a diagram for explaining an example of a manufacturing method for the solid-state imaging device according to the first embodiment to which the present technology is applied.

FIG. 28 is a diagram for explaining an example of a manufacturing method for the solid-state imaging device according to the first embodiment to which the present technology is applied.

FIG. 34 is a cross-sectional view illustrating a configuration example of the solid-state imaging device according to the sixth embodiment to which the present technology is applied.

FIG. 39 is a diagram for explaining a method of manufacturing a solid-state imaging device according to a seventh embodiment to which the present technology is applied.

FIG. 40 is a diagram for explaining an example of a method of manufacturing the solid-state imaging device.

MODE FOR CARRYING OUT THE INVENTION

Figure 1A:
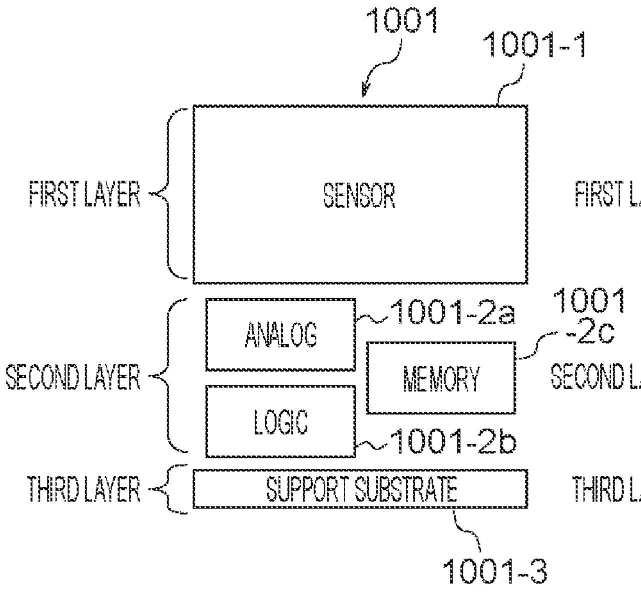
FIGS. 1A and 1B are block diagrams illustrating a configuration example of a solid-state imaging device to which the present technology is applied.

Hereinafter, preferred embodiments for carrying out the present technology will be described. The embodiments described below illustrate an example of a representative embodiment of the present technology, and the scope of the present technology is not narrowly interpreted by this. Note that, in the drawings, unless otherwise specified, "upper" means an upper direction or an upper side in the drawings, "lower" means a lower direction or a lower side in the drawings, "left" means a left direction or a left side in the drawings, and "right" means a right direction or a right side in the drawings. Furthermore, in the drawings, the same or equivalent elements or members are denoted by the same reference signs, and redundant description is omitted.

The description will be given in the following order.

1. Overview of present technology
2. First embodiment (first example of solid-state imaging device)
3. Second embodiment (second example of solid-state imaging device)
4. Third embodiment (third example of solid-state imaging device)
5. Fourth embodiment (fourth example of solid-state imaging device)
6. Fifth Embodiment (fifth example of solid-state imaging device)
7. Sixth embodiment (sixth example of solid-state imaging device)
8. Seventh embodiment (first example of method of manufacturing solid-state imaging device)
9. Eighth embodiment (example of electronic device)
10. Usage example of solid-state imaging device to which present technology is applied
11. Application example to endoscopic surgery system
12. Application example to mobile body

1. Overview of Present Technology

An outline of the present technology will be described.

Figure 29:
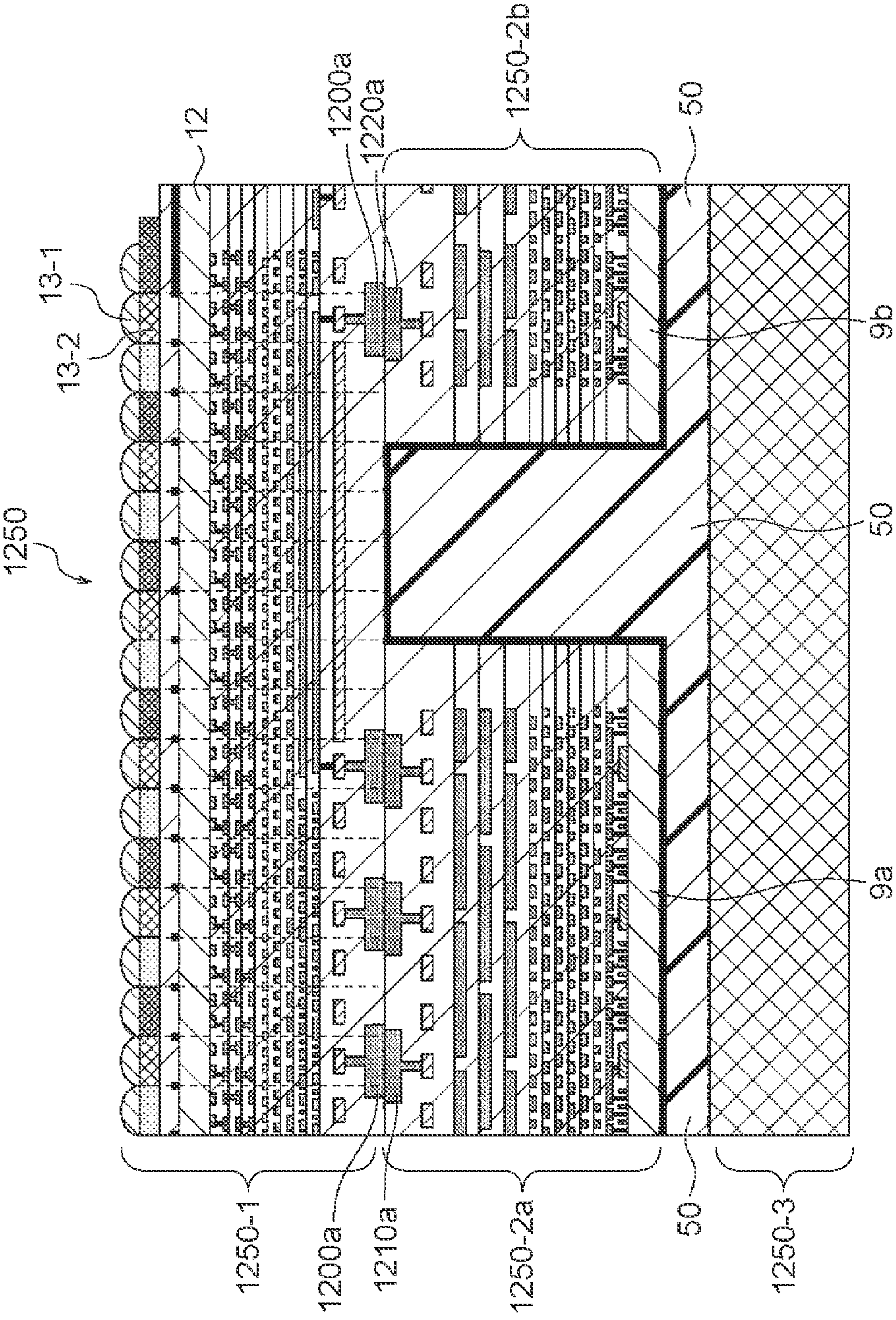
FIG. 29 is a cross-sectional view illustrating a first example of a configuration of a solid-state imaging device.

First, a solid-state imaging device according to a first technical example will be described with reference to FIG. 29. FIG. 29 is a cross-sectional view illustrating a configuration of the solid-state imaging device according to the first technical example.

A solid-state imaging device 1250 illustrated in FIG. 29 includes a first substrate 1250-1, second substrates 1250-2*a* and 1250-2*b* that are laminated on the first substrate 1250-1 by direct bonding on an opposite side (the lower side in FIG. 29) of the first substrate 1250-1 with respect to a light incident side (the upper side in FIG. 29) and have a size different from a size of the first substrate 1250-1, a third substrate 1250-3 provided on the opposite side (the lower side in FIG. 29) of the second substrates 1250-2*a* and 1250-2*b* with respect to the light incident side (the upper side in FIG. 29), and an insulating layer 50 (It may be referred to as an insulating film 50.) formed between the first substrate 1250-1 and the third substrate 1250-3. In the solid-state imaging device 1250, the third substrate 1250-3 is in contact with only the insulating layer 50.

The first substrate 1250-1 is a sensor substrate on which photodiodes, a plurality of transistors, and the like constituting pixels are formed. The second substrate 1250-2*a* is, for example, any one of an analog circuit board on which an analog circuit is formed, a logic circuit board on which a logic circuit is formed, and a memory circuit board on which a memory circuit is formed, and the second substrate 1250-2*b* is also, for example, any one of an analog circuit board on which an analog circuit is formed, a logic circuit board on which a logic circuit is formed, and a memory circuit board on which a memory circuit is formed. The third substrate 1250-3 is a support substrate.

In the solid-state imaging device 1250, the diced second substrates 1250-2*a* and 1250-2*b* are bonded below (the lower side in FIG. 29) the first substrate 1250-1. After the second substrates 1250-2*a* and 1250-2*b* are filled with the insulating film 50 and then planarized and bonded to the support substrate 1250-3, a structure on the light incident surface side (upper side in FIG. 29) of the first substrate 1250-1 (for example, a structure related to the on-chip lens 13-1 and the color filter 13-2) is constructed.

When heat is generated in the circuits of the second substrates 1250-2*a* and 1250-2*b*, since the semiconductor substrate (silicon (Si) substrate) is covered with the insulating film 50, thermal conductivity is poor, and variations in pixel characteristics due to local thermal distribution unevenness may be caused.

Furthermore, in order to improve the heat dissipation between the second substrates 1250-2*a* and 1250-2*b* and the support substrate 1250-3, in a case where the insulating layer (insulating film) between the second substrates 1250-2*a* and 1250-2*b* and the support substrate 1250-3 is extremely thin or eliminated, conduction between the second substrates 1250-2*a* and 1250-2*b* may occur via the support substrate 1250-3. This can also occur between different potentials in the same second substrate (that is, in the second substrate 1250-2*a* or 1250-2*b*).

Next, a solid-state imaging device according to a second technical example and a method of manufacturing the solid-state imaging device according to the second technical example will be described with reference to FIGS. 40A-40F and 41. FIG. 41 is a cross-sectional view illustrating a configuration of the solid-state imaging device according to the second technical example, and FIGS. 40A, 40B, 40C, 40D, 40E and 40F are diagrams explaining the method of manufacturing the solid-state imaging device according to the second technical example.

Figures 40A, 40B, 40C, 40D, 40E, 40F:
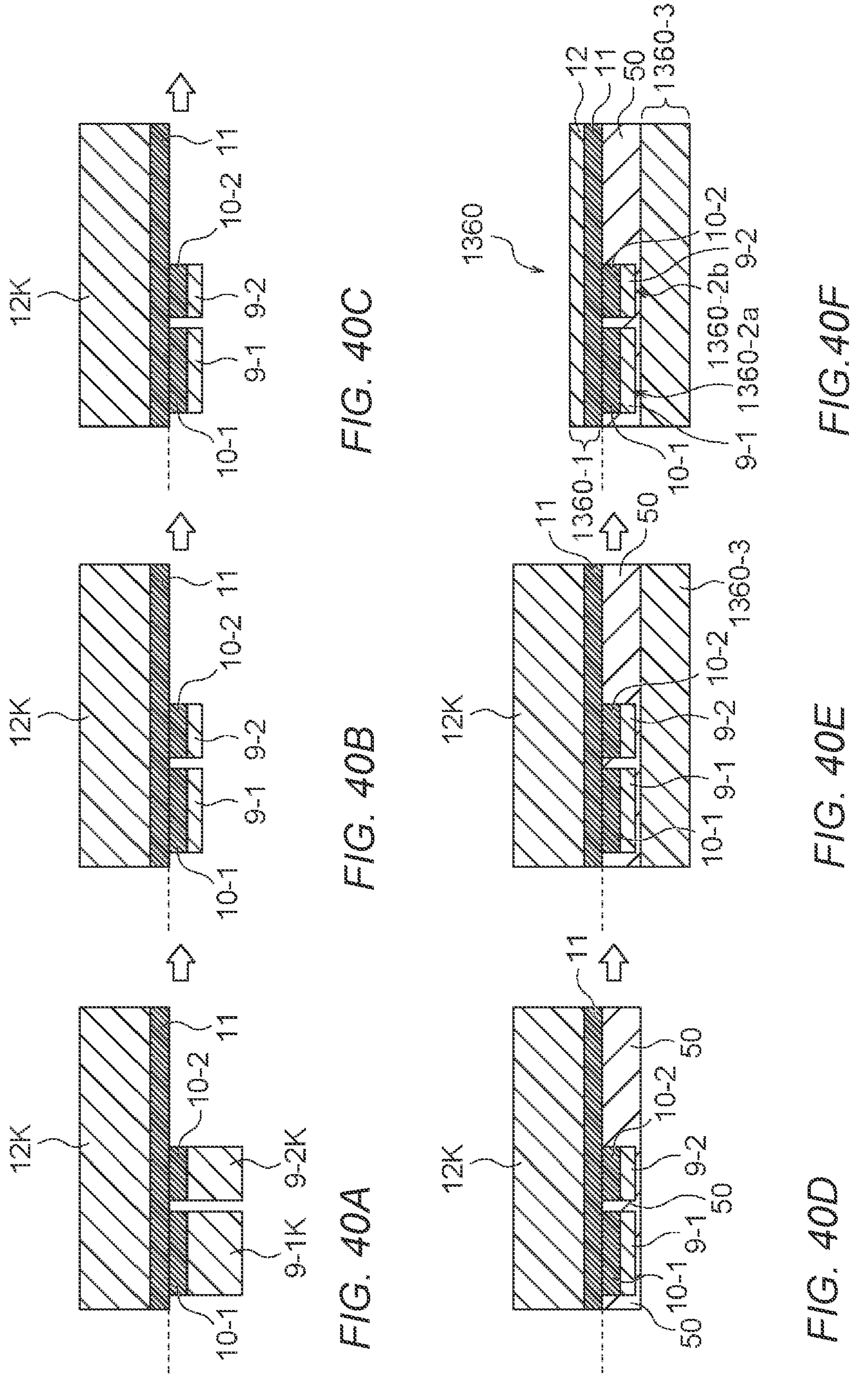
FIGS. 40A, 40B, 40C, 40D, 40E and 40F are diagrams explaining an example of a method of manufacturing the solid-state imaging device.
Figure 41:
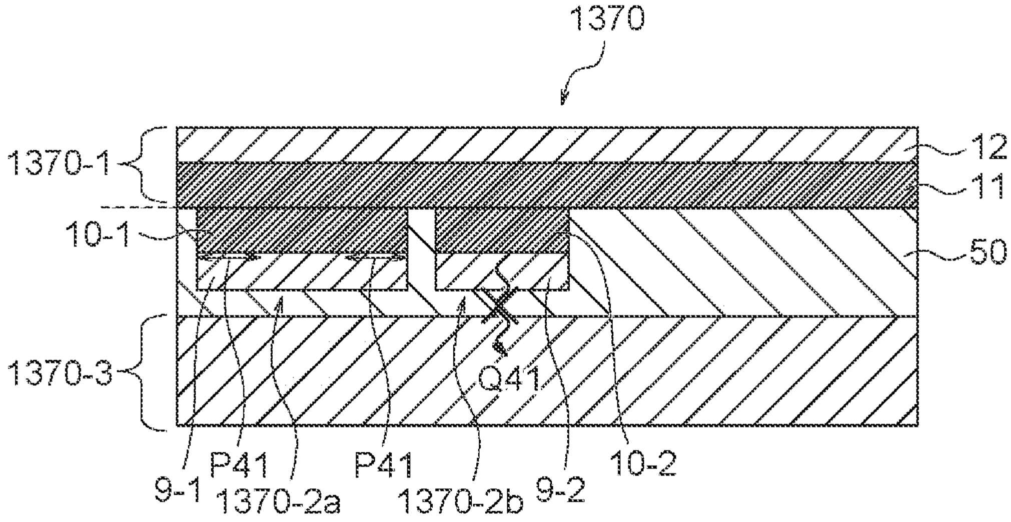
FIG. 41 is a cross-sectional view illustrating a second example of the configuration of the solid-state imaging device.

As illustrated in FIG. 40A, a semiconductor substrate 12K and semiconductor substrates 9-1K and 9-2K are bonded via wiring layers 11, 10-1, and 10-2. As illustrated in FIG. 40B, the semiconductor substrates 9-1K and 9-2K are thinned (Semiconductor substrates 9-1 and 9-2 are formed), and as illustrated in FIG. 40C, the temperature is raised in order to form an insulating film (oxide film) 50 so as to be embedded on the semiconductor substrates 9-1K and 9-2K and the semiconductor substrate 12K (the lower side in FIG. 40C). As illustrated in FIG. 40D, the insulating film (oxide film) 50 is formed and cooled. As illustrated in FIG. 40E, a support substrate 1360-3 is bonded. As illustrated in FIG. 40F, the semiconductor substrate 12K is thinned (A semiconductor substrate 12 is formed), an on-chip lens, a color filter, and the like (not illustrated) are formed and customized, and a solid-state imaging device 1360 is manufactured.

As described above, after the substrates (The chips may be disposed on each other.) are bonded to each other, the substrate (A chip may be used.) is thinned and embedded with the oxide film, and the support substrate is bonded to the substrate subjected to the planarization treatment, thereby realizing the CoW process.

A solid-state imaging device 1370 illustrated in FIG. 41 includes a first substrate 1370-1, second substrates 1370-2*a* and 1370-2*b* that are laminated on the first substrate 1370-1 by direct bonding on an opposite side (the lower side in FIG. 41) of the first substrate 1370-1 with respect to a light incident side (the upper side in FIG. 29) and have a size different from a size of the first substrate 1370-1, a third substrate 1370-3 provided on the opposite side (the lower side in FIG. 41) of the second substrates 1370-2*a* and 1370-2*b* with respect to the light incident side (the upper side in FIG. 41), and an insulating layer 50 formed between the first substrate 1370-1 and the third substrate 1370-3. In the solid-state imaging device 1370, the third substrate 1370-3 is in contact with only the insulating layer 50.

The first substrate 1370-1 is a sensor substrate on which photodiodes, a plurality of transistors, and the like constituting pixels are formed. The second substrate 1370-2*a* is, for example, any one of an analog circuit board on which an analog circuit is formed, a logic circuit board on which a logic circuit is formed, and a memory circuit board on which a memory circuit is formed, and the second substrate 1370-2*b* is also, for example, any one of an analog circuit board on which an analog circuit is formed, a logic circuit board on which a logic circuit is formed, and a memory circuit board on which a memory circuit is formed. The third substrate 1370-3 is a support substrate.

As illustrated in the solid-state imaging device 1370 in FIG. 41, the lower surfaces (lower surfaces of FIG. 41 on a support 1370-3 side) of the second substrates 1370-2*a* and 1370-2*b* are completely covered with the oxide film (insulating film) 50. Therefore, stress and strain caused by embedding cannot be alleviated (an arrow P41 illustrated in FIG. 41), and variations in transistor (Tr) characteristics in the second substrates 1370-2*a* and 1370-2*b* and misalignment at the time of installing an on-chip lens (OCL) on a first substrate 1370-1 side may occur. Furthermore, there is a concern that the thermal conductivity is low, and there is no route through which the heat (an arrow Q 41 illustrated in FIG. 41) generated in the second substrates 1370-2*a* and 1370-2*b* escapes. Note that it has been confirmed that the mobility of electrons and holes specifically fluctuates at the chip end due to the influence of stress regarding the characteristic fluctuation of the transistor (Tr).

The present technology has been made in view of the above circumstances. A solid-state imaging device according to the present technology is a solid-state imaging device including: a first substrate; a second substrate laminated on the first substrate by direct bonding on a side opposite to a light incident side of the first substrate and having a size different from a size of the first substrate; a third substrate provided on a side opposite to a light incident side of the second substrate; and an insulating layer formed between the first substrate and the third substrate, in which the third substrate has a well formed on a light incident side of the third substrate.

Furthermore, the solid-state imaging device according to the present technology may be a solid-state imaging device including: a first substrate; a second substrate laminated on the first substrate by direct bonding on a side opposite to a light incident side of the first substrate, the second substrate having a size different from a size of the first substrate; a third substrate provided on a side opposite to a light incident side of the second substrate; and an insulating layer formed between the first substrate and the third substrate, in which the third substrate is in contact with the second substrate, and the third substrate is in contact with the insulating layer.

According to the solid-state imaging device according to the present technology, it is possible to further improve quality and reliability of the solid-state imaging device. Specifically, according to the solid-state imaging device according to the present technology, stress applied to the substrate (particularly, the second substrate) can be relaxed, and thermal conductivity can be improved. Furthermore, according to the solid-state imaging device according to the present technology, by adopting a structure in which the substrate (particularly, the second substrate) and the semiconductor substrate (silicon (Si) substrate) of the support substrate are thinned or brought into contact with each other, heat generated in the circuit of the substrate (particularly, the second substrate) is released to a package (PKG) via the semiconductor substrate (silicon (Si) substrate) of the support substrate, so that heat transferred to the first substrate (sensor substrate or the like) side can be suppressed, and variations in pixel characteristics and noise due to heat can be reduced. Then, in the solid-state imaging device according to the present technology, by forming an electrically separated well structure on the support substrate or increasing the resistance of the entire surface of the support substrate, it is possible to electrically separate, for example, different potential portions between the substrates (particularly the second substrate) or in the substrate (particularly the second substrate) on the surface side of the support substrate while reducing variations in pixel characteristics and noise due to heat, and to prevent leakage current via the support substrate.

Figure 30:
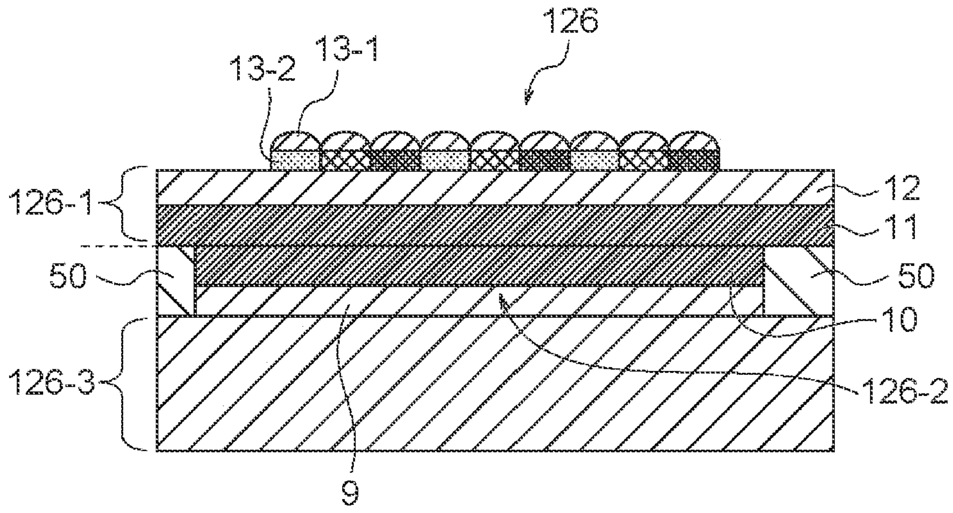
FIG. 30 is a cross-sectional view illustrating a configuration example of a solid-state imaging device to which the present technology is applied.

The solid-state imaging device according to the present technology will be further described with reference to FIGS. 1 to 3 and 30. FIGS. 1 to 3 are block diagrams illustrating a configuration example of a solid-state imaging device according to the present technology. FIG. 30 is a cross-sectional view illustrating a configuration example of the solid-state imaging device according to the present technology.

A solid-state imaging device 1001 illustrated in FIG. 1A has a three-layer structure. Specifically, the solid-state imaging device 1001 includes, in order from a light incident side (upper side in FIG. 1A), a sensor substrate 1001-1 that is a first substrate as a first layer, an analog circuit substrate 1001-2*a*, a logic circuit substrate 1001-2*b*, and a memory circuit substrate 1001-2*c* (That is, a total of three second substrates are formed in the same layer.) that are three second substrates having a size different from a size of the first substrate (That is, in FIG. 1A, the size is smaller than the size of the first substrate.) as a second layer, and a support substrate 1001-3 that is a third substrate as a third layer.

Figure 1B:
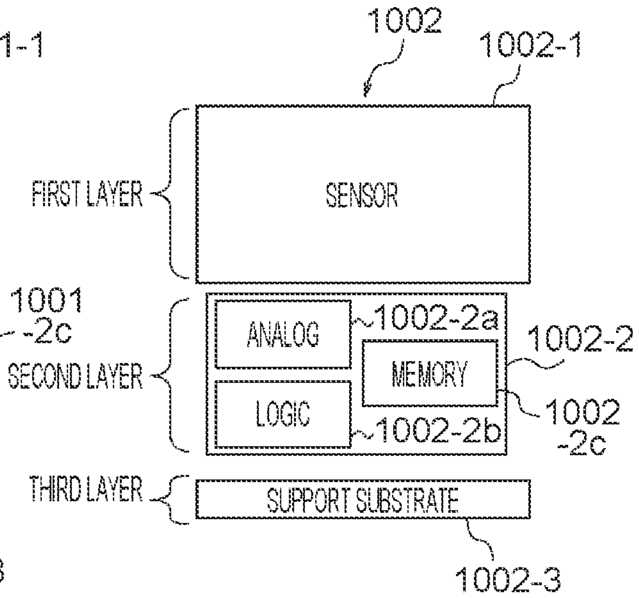

A solid-state imaging device 1002 illustrated in FIG. 1B has a three-layer structure. Specifically, the solid-state imaging device 1002 includes, in order from a light incident side (upper side in FIG. 1B), a sensor substrate 1002-1 that is a first substrate as a first layer, a circuit substrate 1002-2 that is one second substrate having a size different from a size of the first substrate (That is, in FIG. 1B, the size is smaller than the size of the first substrate.) as a second layer, and a support substrate 1002-3 that is a third substrate as a third layer. On the second substrate 1002-2, an analog circuit 1002-2*a*, a logic circuit 1002-2*b*, and a memory circuit 1002-2*c* (That is, a total of three circuits) are formed.

Figure 2A:
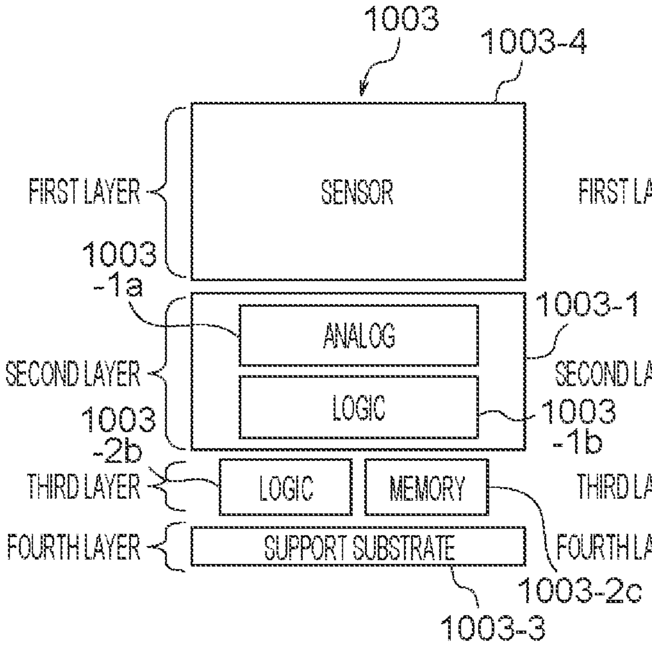
FIGS. 2A and 2B are block diagrams illustrating a configuration example of a solid-state imaging device to which the present technology is applied.
Figure 3:
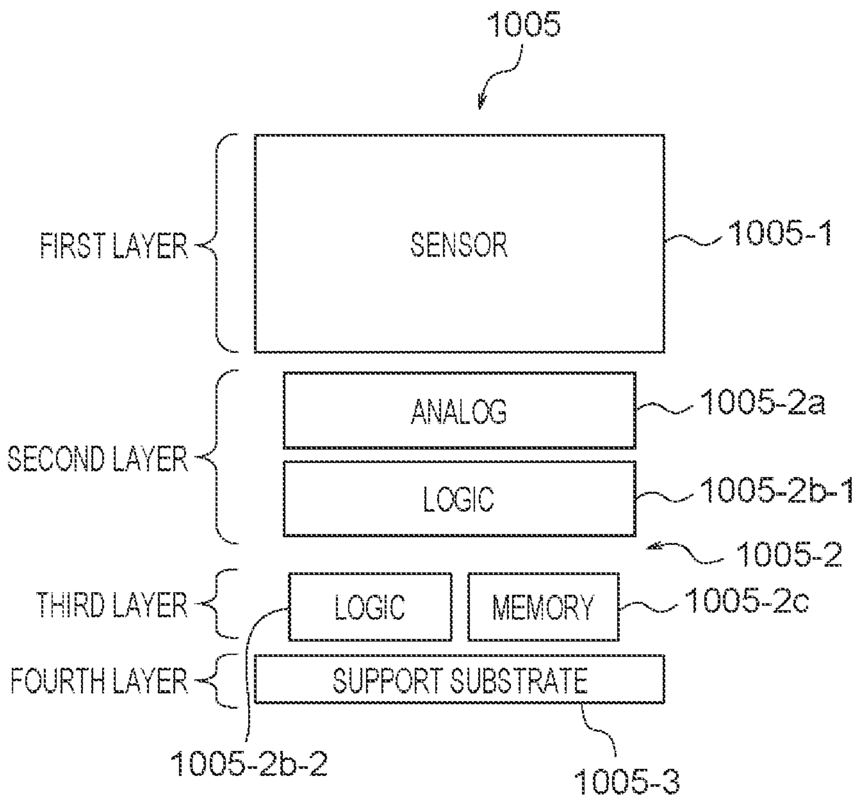
FIG. 3 is a block diagram illustrating a configuration example of a solid-state imaging device to which the present technology is applied.

A solid-state imaging device 1003 illustrated in FIG. 2A has a four-layer structure. Specifically, the solid-state imaging device 1003 includes, in order from a light incident side (upper side in FIG. 2A), a sensor substrate 1003-4 that is a fourth substrate as a first layer, a circuit substrate 1003-1 that is a first substrate having a size substantially the same as a size of the fourth substrate (That is, in FIG. 2A, the size is substantially equal to the size of the fourth substrate.) as a second layer, a logic circuit substrate 1003-2*b* and a memory circuit substrate 1003-2*c* (That is, a total of two second substrates are formed in the same layer.) that are two second substrates having a size different from the size of the first substrate (That is, in FIG. 2A, the size is smaller than the size of the first substrate.) as a third layer, and a support substrate 1003-3 that is a third substrate as a fourth layer. An analog circuit 1003-1*a* and a logic circuit 1003-1*b* (that is, a total of two circuits) are formed on the first substrate (circuit board) 1003-1.

Figure 2B:
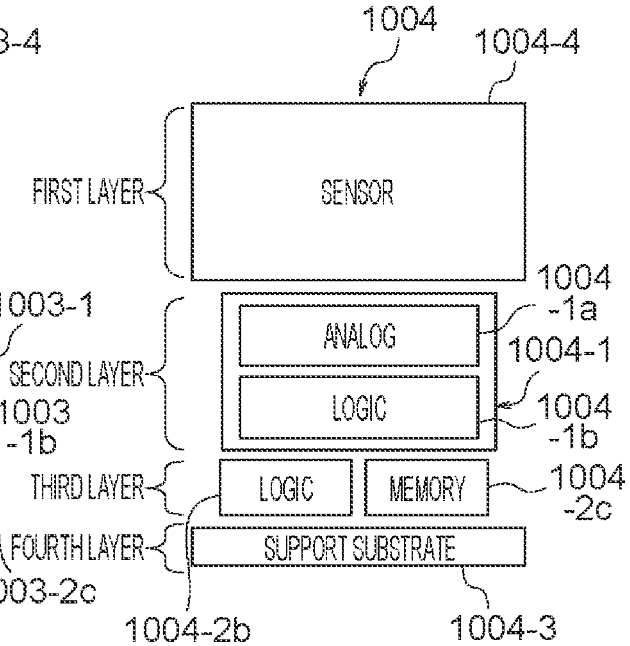

A solid-state imaging device 1004 illustrated in FIG. 2B has a four-layer structure. Specifically, the solid-state imaging device 1004 includes, in order from a light incident side (upper side in FIG. 2B), a sensor substrate 1004-4 that is a fourth substrate as a first layer, a circuit substrate 1004-1 that is a first substrate having a size different from a size of the fourth substrate (That is, in FIG. 2B, the size is smaller than the size of the fourth substrate.) as a second layer, a logic circuit substrate 1004-2*b* and a memory circuit substrate 1004-2*c* (That is, a total of two second substrates are formed in the same layer.) that are two second substrates having a size different from the size of the first substrate (That is, in FIG. 2B, the size is smaller than the size of the first substrate.) as a third layer, and a support substrate 1004-3 that is a third substrate as a fourth layer. An analog circuit 1004-1*a* and a logic circuit 1004-1*b* (that is, a total of two circuits) are formed on the first substrate (circuit board) 1004-1.

A solid-state imaging device 1005 illustrated in FIG. 3 has a four-layer structure. Specifically, the solid-state imaging device 1005 includes, in order from a light incident side (upper side in FIG. 3), a sensor substrate 1005-1 as a first substrate as a first layer, an analog circuit substrate 1005-2*a* and a logic circuit substrate 1005-2*b*-1 (That is, a total of two second substrates are formed in the same layer as the second layer.) as two second substrates having a size different from a size of the first substrate (That is, in FIG. 3, the size is smaller than the size of the first substrate.) as a second layer, a logic circuit substrate 1005-2*b*-2 and a memory circuit substrate 1005-2*c* (That is, a total of two second substrates are formed in the same layer as the third layer.) as two second substrates having a size different from the size of the first substrate (That is, in FIG. 3, the size is smaller than the size of the first substrate.) as a third layer, and a support substrate 1005-3 as a third substrate as a fourth layer. In the solid-state imaging device 1005, four second substrates are configured as the second layer and the third layer, and have a laminated structure.

Note that, in the above description, an example in which the solid-state imaging device according to the present technology has a three-layer structure or a four-layer structure has been described. However, the solid-state imaging device according to the present technology may have a structure of five or more layers.

A solid-state imaging device 126 illustrated in FIG. 30 includes a first substrate 126-1, a second substrate 126-2 laminated on the first substrate 126-1 by direct bonding on an opposite side (lower side in FIG. 30) to a light incident side (upper side in FIG. 30) of the first substrate 126-1 and having a size different from a size of the first substrate 126-1, a third substrate 126-3 provided on the opposite side (lower side in FIG. 30) to the light incident side (upper side in FIG. 30) of the second substrate 126-2, and two insulating layers 50 (It can also be said that the insulating layer 50 is formed on each of the left and right side surfaces of the second substrate 127-2.) formed between the first substrate 126-1 and the third substrate 126-3. In the solid-state imaging device 126, the third substrate 126-3 is in contact with the second substrate 126-2 and is in contact with the two insulating layers 50.

The first substrate 126-1 is a sensor substrate on which photodiodes, a plurality of transistors, and the like constituting pixels are formed. Specifically, the first substrate 126-1 (sensor substrate) includes on-chip lenses 13-1, color filters 13-2, a semiconductor substrate 12, and a wiring layer 11 in this order from the light incident side (upper side in FIG. 30). A photodiode (PD) (not illustrated) is formed on the semiconductor substrate 12. Furthermore, transistors and the like (not illustrated) constituting a pixel circuit are formed on the semiconductor substrate 12 (interface between the semiconductor substrate 12 and the wiring layer 11).

The second substrate 126-2 is, for example, any one circuit board of an analog circuit board on which an analog circuit is formed, a logic circuit board on which a logic circuit is formed, and a memory circuit board on which a memory circuit is formed. Specifically, the second substrate 126-2 includes a wiring layer 10 and a semiconductor substrate 9 in order from the light incident side. Any one circuit of an analog circuit, a logic circuit, and a memory circuit is formed on the semiconductor substrate 9 (interface between the semiconductor substrate 9 and the wiring layer 10). The third substrate 127-3 is a support substrate.

Examples of the direct bonding between the first substrate 126-1 and the second substrate 126-2 include, for example, bonding (CuCu bonding, inter-substrate electrode bonding structure) between an electrode including Cu (copper) and formed on the wiring layer 11 included in the first substrate 126-1 and an electrode including Cu (copper) and formed on the wiring layer 10 included in the second substrate 126-2.

Hereinafter, preferred embodiments for carrying out the present technology will be described in detail with reference to the drawings. The embodiments described below illustrate an example of a representative embodiment of the present technology, and the scope of the present technology is not narrowly interpreted by this.

2. First Embodiment (First Example of Solid-State Imaging Device)

A solid-state imaging device according to a first embodiment (first example of a solid-state imaging device) of the present technology will be described with reference to FIGS. 4 to 23 and FIGS. 27 and 28.

Each of FIGS. 4 to 15 is a cross-sectional view illustrating a configuration example of the solid-state imaging device of the first embodiment according to the present technology, and each of FIGS. 16 to 23 is a diagram for explaining that the solid-state imaging device of the first embodiment according to the present technology can prevent a leakage current. FIGS. 27 and 28 are diagrams for explaining an example of a manufacturing method for the solid-state imaging device of the first embodiment according to the present technology.

First, description will be made with reference to FIGS. 4 to 15.

Figure 4:
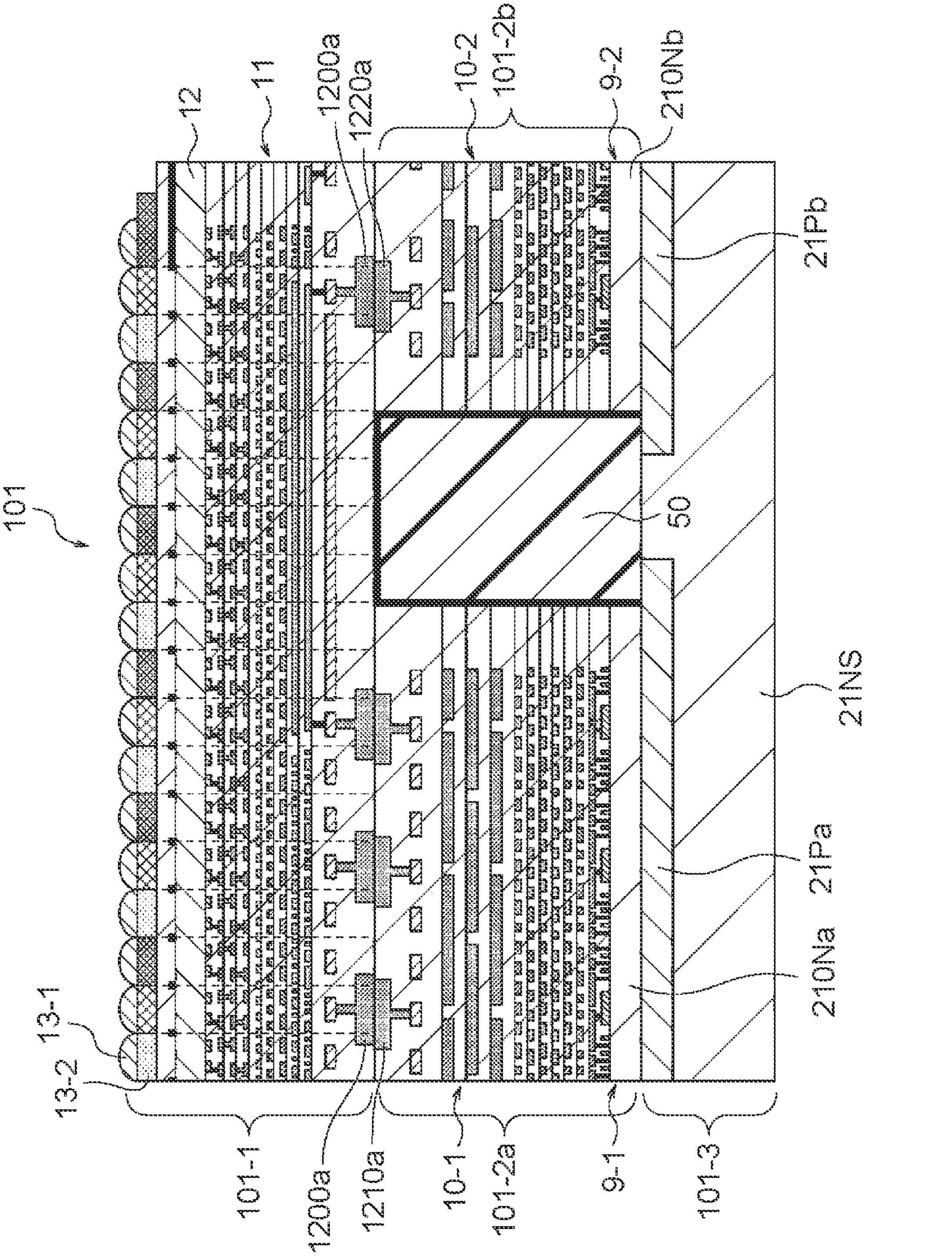
FIG. 4 is a cross-sectional view illustrating a configuration example of a solid-state imaging device according to a first embodiment to which the present technology is applied.

A solid-state imaging device 101 illustrated in FIG. 4 includes a first substrate 101-1, second substrates 101-2*a* and 101-2*b* that are laminated on the first substrate 101-1 by direct bonding (For example, as illustrated in FIG. 4, CuCu junctions 1200*a* and 1210*a* and CuCu junctions 1200*a* and 1220*a* are exemplified.) on an opposite side (lower side in FIG. 4) of a light incident side (upper side in FIG. 4) of the first substrate 101-1 and have a size different from a size of the first substrate 101-1, a third substrate 101-3 provided on the opposite side (lower side in FIG. 4) of the light incident side (upper side in FIG. 4) of the second substrates 101-2*a* and 101-2*b*, and an insulating layer 50 formed between the first substrate 101-1 and the third substrate 101-3. In the solid-state imaging device 101, the third substrate 101-3 is in contact with the second substrates 101-2*a* and 101-2*b*, and is in contact with the insulating layer 50.

The first substrate 101-1 is a sensor substrate on which photodiodes, a plurality of transistors, and the like constituting pixels are formed. The second substrate 101-2*a* is, for example, any one of an analog circuit board on which an analog circuit is formed, a logic circuit board on which a logic circuit is formed, and a memory circuit board on which a memory circuit is formed, and the second substrate 101-2*b* is also, for example, any one of an analog circuit board on which an analog circuit is formed, a logic circuit board on which a logic circuit is formed, and a memory circuit board on which a memory circuit is formed. The third substrate 101-3 is a support substrate.

An N-type well 210Na is formed in a semiconductor substrate 9-1 included in the second substrate 101-2*a*, and an N-type well 210Nb is formed in a semiconductor substrate 9-2 included in the second substrate 101-2*b*.

The third substrate 101-3 has an N-type substrate 21NS, and a P-type wells 21Pa and 21Pb (floating) are formed, so that it is possible to electrically separate different potential portions between the second substrate 101-2*a* and the second substrate 101-2*b*, or in the second substrate 101-2*a* or in the second substrate 101-2*b*, and to prevent a leakage current through the support substrate 101-3.

The P-type well 21Pa is formed up to a region corresponding to an outside of an end surface of the second substrate 101-2*a* facing the insulating layer 50, an end surface of the P-type well 21Pa and the end surface of the second substrate 101-2*a* are not flush with each other in a vertical direction, and a right end surface of the P-type well 21*a* is located in a region corresponding to the insulating layer 50.

On the other hand, the P-type well 21Pb is formed up to a region corresponding to an outside of an end surface of the second substrate 101-2*b* facing the insulating layer 50, an end surface of the P-type well 21Pb and the end surface of the second substrate 101-2*b* are not flush with each other in the vertical direction, and a left end surface of the P-type well 21*b* is located in a region corresponding to the insulating layer 50.

Figure 5:
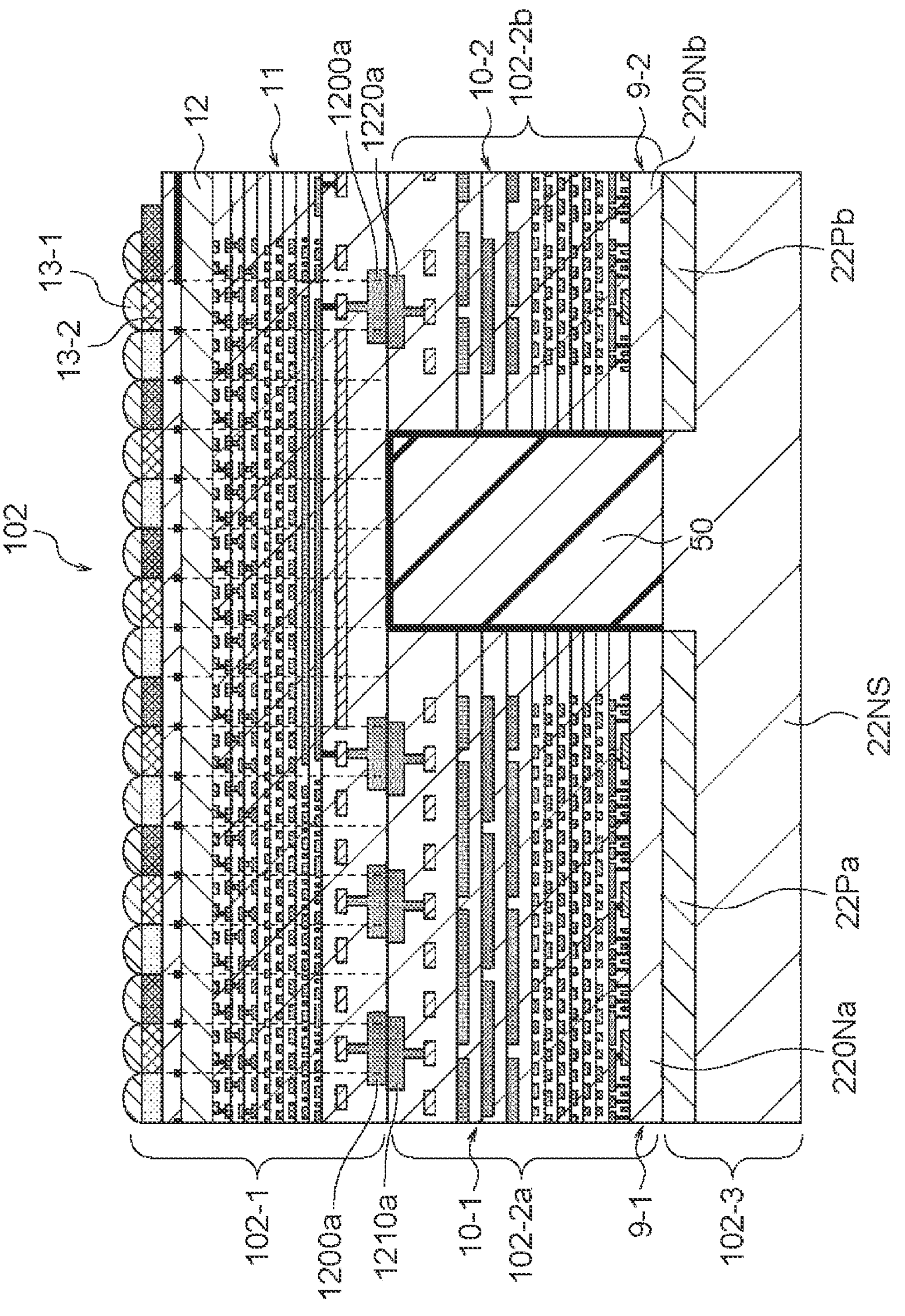
FIG. 5 is a cross-sectional view illustrating a configuration example of the solid-state imaging device according to the first embodiment to which the present technology is applied.

A solid-state imaging device 102 illustrated in FIG. 5 includes a first substrate 102-1, second substrates 102-2*a* and 102-2*b* that are laminated on the first substrate 102-1 by direct bonding on an opposite side (lower side in FIG. 5) of a light incident side (upper side in FIG. 5) of the first substrate 102-1 and have a size different from a size of the first substrate 102-1, a third substrate 102-3 provided on the opposite side (lower side in FIG. 5) of the light incident side (upper side in FIG. 5) of the second substrates 102-2*a* and 102-2*b*, and an insulating layer 50 formed between the first substrate 102-1 and the third substrate 102-3. In the solid-state imaging device 102, the third substrate 102-3 is in contact with the second substrates 102-2*a* and 102-2*b*, and is in contact with the insulating layer 50.

The first substrate 102-1 is a sensor substrate on which photodiodes, a plurality of transistors, and the like constituting pixels are formed. The second substrate 102-2*a* is, for example, any one of an analog circuit board on which an analog circuit is formed, a logic circuit board on which a logic circuit is formed, and a memory circuit board on which a memory circuit is formed, and the second substrate 102-2*b* is also, for example, any one of an analog circuit board on which an analog circuit is formed, a logic circuit board on which a logic circuit is formed, and a memory circuit board on which a memory circuit is formed. The third substrate 102-3 is a support substrate.

An N-type well 220Na is formed in a semiconductor substrate 9-1 included in the second substrate 102-2*a*, and an N-type well 220Nb is formed in a semiconductor substrate 9-2 included in the second substrate 102-2*b*.

The third substrate 102-3 has an N-type substrate 22NS, and P-type wells 22Pa and 22Pb (floating) are formed, so that it is possible to electrically separate different potential portions between the second substrate 102-2*a* and the second substrate 101-2*b*, or in the second substrate 102-2*a* or in the second substrate 102-2*b*, and to prevent a leakage current through the support substrate 102-3.

The P-type well 22Pa is formed up to a region corresponding to an end surface of the second substrate 102-2*a* facing the insulating layer 50, and an end surface of the P-type well 22Pa and the end surface of the second substrate 102-2*a* are flush with each other in the vertical direction.

On the other hand, the P-type well 22Pb is formed up to a region corresponding to an end surface of the second substrate 102-2*b* facing the insulating layer 50, and an end surface of the P-type well 22Pb and the end surface of the second substrate 102-2*b* are flush with each other in the vertical direction.

Figure 6:
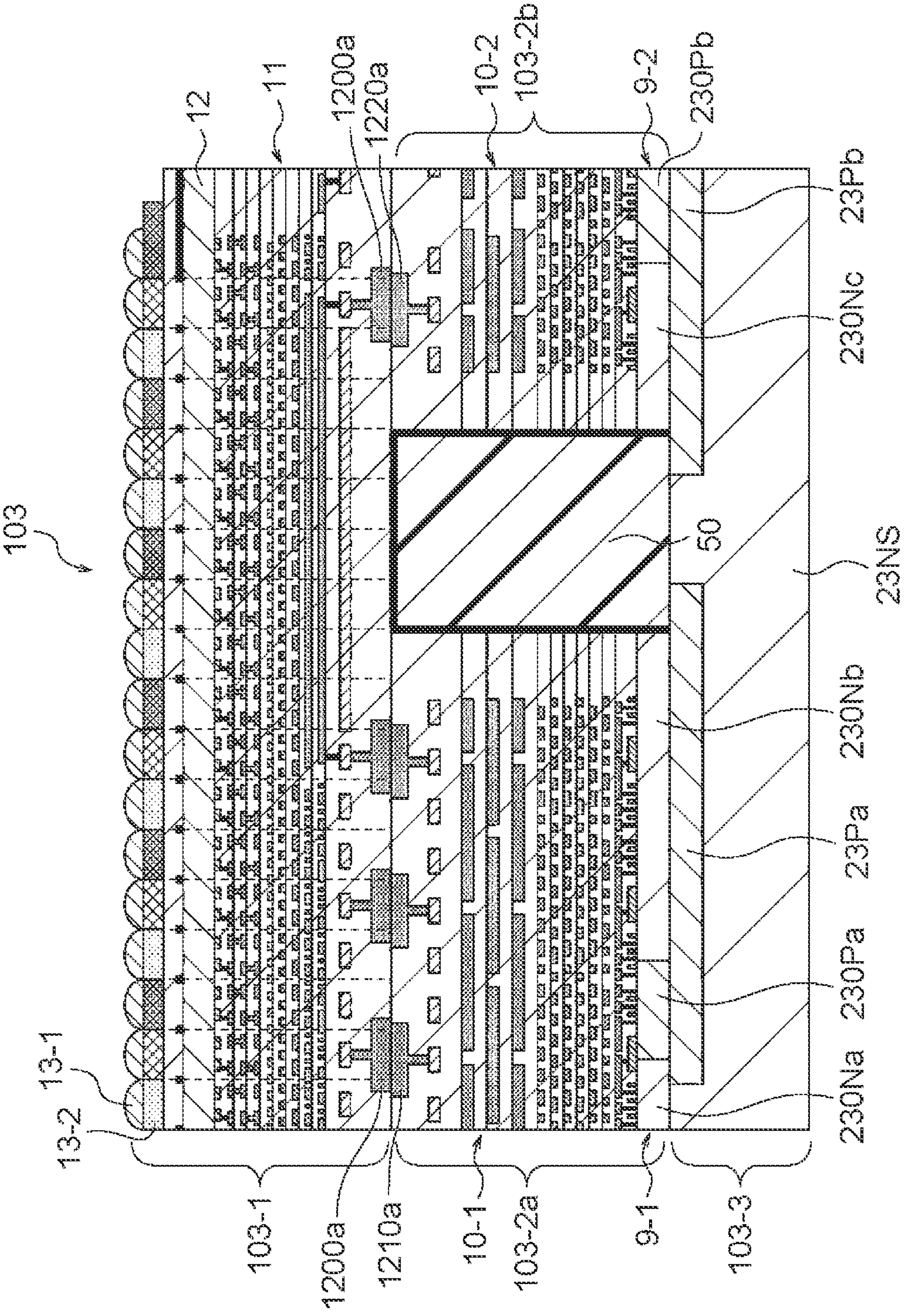
FIG. 6 is a cross-sectional view illustrating a configuration example of the solid-state imaging device according to the first embodiment to which the present technology is applied.

A solid-state imaging device 103 illustrated in FIG. 6 includes a first substrate 103-1, second substrates 103-2*a* and 103-2*b* that are laminated on the first substrate 103-1 by direct bonding on an opposite side (lower side in FIG. 6) of a light incident side (upper side in FIG. 6) of the first substrate 103-1 and have a size different from a size of the first substrate 103-1, a third substrate 103-3 provided on the opposite side (lower side in FIG. 6) of the light incident side (upper side in FIG. 6) of the second substrates 103-2*a* and 103-2*b*, and an insulating layer 50 formed between the first substrate 103-1 and the third substrate 103-3. In the solid-state imaging device 103, the third substrate 103-3 is in contact with the second substrates 103-2*a* and 103-2*b*, and is in contact with the insulating layer 50.

The first substrate 103-1 is a sensor substrate on which photodiodes, a plurality of transistors, and the like constituting pixels are formed. The second substrate 103-2*a* is, for example, any one of an analog circuit board on which an analog circuit is formed, a logic circuit board on which a logic circuit is formed, and a memory circuit board on which a memory circuit is formed, and the second substrate 103-2*b* is also, for example, any one of an analog circuit board on which an analog circuit is formed, a logic circuit board on which a logic circuit is formed, and a memory circuit board on which a memory circuit is formed. The third substrate 103-3 is a support substrate.

In a semiconductor substrate 9-1 included in the second substrate 103-2*a*, an N-type well 230Na is formed, a P-type well 230Pa is formed, and an N-type well 230Nb is formed in this order from the left side of FIG. 6. In a semiconductor substrate 9-2 included in the second substrate 103-2*b*, an N-type well 230Nc and a P-type well 230Pb are formed in this order from the left side of FIG. 6.

The third substrate 103-3 includes an N-type substrate 23NS, and P-type wells 23Pa and 23Pb are formed, so that different potential portions between the second substrate 103-2*a* and the second substrate 103-2*b* or in the second substrate 103-2*a* or in the second substrate 103-2*b* can be electrically separated, and a leakage current through the support substrate 103-3 can be prevented. Furthermore, since the N-type substrate 23NS and the N-type well 230Na are electrically connected, the P-type well 23Pa and the P-type well 230Pa are electrically connected, the P-type well 23Pb and the P-type well 230Pb are electrically connected, and the potential of the third substrate (support substrate) 103-3 is fixed, it is possible to more reliably prevent a leakage current.

The P-type well 23Pa is formed up to a region corresponding to an outside of an end surface of the second substrate 103-2*a* facing the insulating layer 50, an end surface of the P-type well 23Pa and the end surface of the second substrate 103-2*a* are not flush with each other in the vertical direction, and a right end surface of the P-type well 23*a* is located in a region corresponding to the insulating layer 50.

On the other hand, the P-type well 23Pb is formed up to a region corresponding to an outside of an end surface of the second substrate 103-2*b* facing the insulating layer 50, an end surface of the P-type well 23Pb and the end surface of the second substrate 103-2*b* are not flush with each other in the vertical direction, and a left end surface of the P-type well 23*b* is located in a region corresponding to the insulating layer 50.

Figure 7:
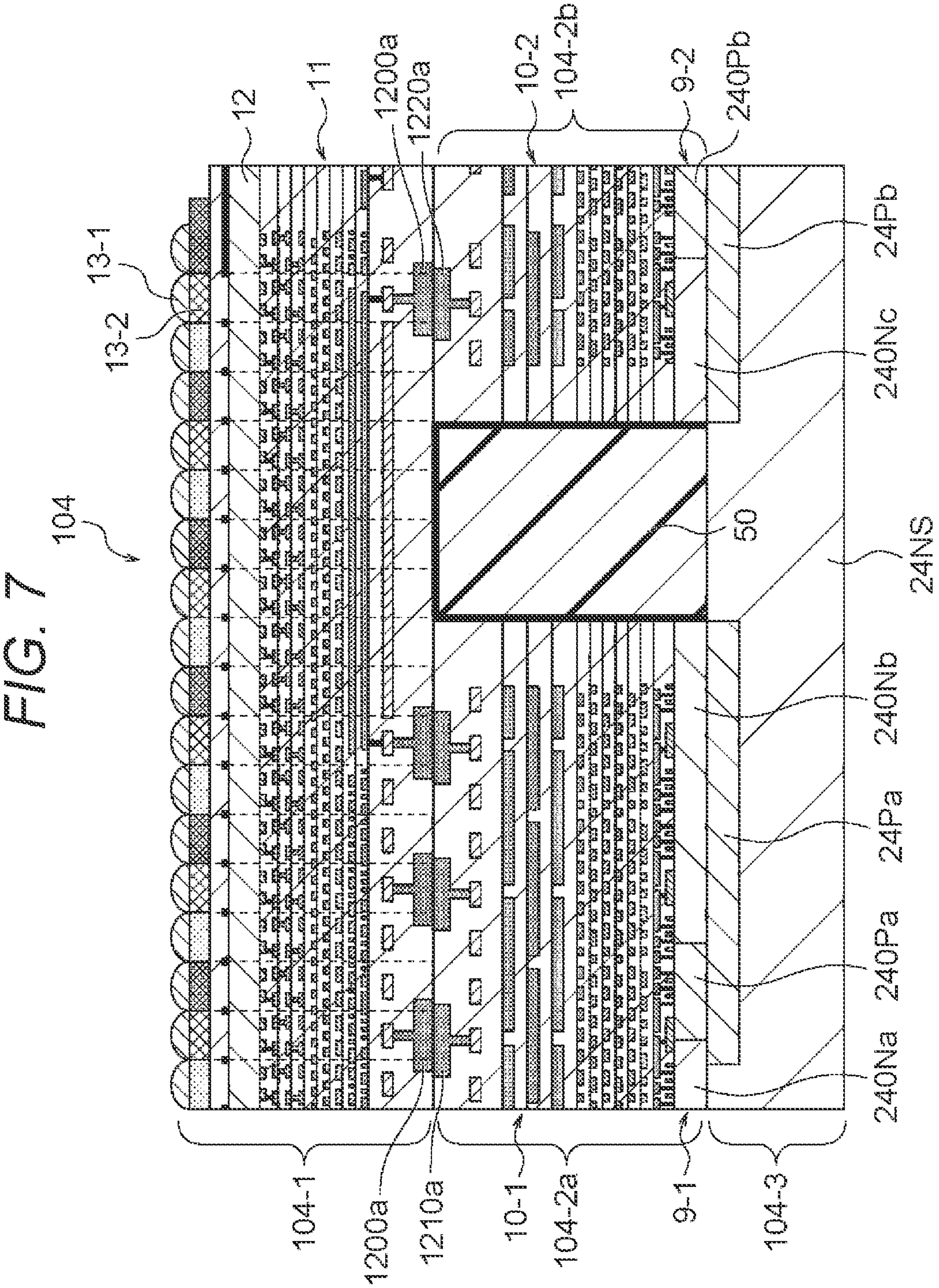
FIG. 7 is a cross-sectional view illustrating a configuration example of the solid-state imaging device according to the first embodiment to which the present technology is applied.

A solid-state imaging device 104 illustrated in FIG. 7 includes a first substrate 104-1, second substrates 104-2*a* and 104-2*b* that are laminated on the first substrate 104-1 by direct bonding on an opposite side (lower side in FIG. 7) of a light incident side (upper side in FIG. 7) of the first substrate 104-1 and have a size different from a size of the first substrate 104-1, a third substrate 104-3 provided on the opposite side (lower side in FIG. 7) of the light incident side (upper side in FIG. 7) of the second substrates 104-2*a* and 104-2*b*, and an insulating layer 50 formed between the first substrate 104-1 and the third substrate 104-3. In the solid-state imaging device 104, the third substrate 104-3 is in contact with the second substrates 104-2*a* and 104-2*b*, and is in contact with the insulating layer 50.

The first substrate 104-1 is a sensor substrate on which photodiodes, a plurality of transistors, and the like constituting pixels are formed. The second substrate 104-2*a* is, for example, any one of an analog circuit board on which an analog circuit is formed, a logic circuit board on which a logic circuit is formed, and a memory circuit board on which a memory circuit is formed, and the second substrate 104-2*b* is also, for example, any one of an analog circuit board on which an analog circuit is formed, a logic circuit board on which a logic circuit is formed, and a memory circuit board on which a memory circuit is formed. The third substrate 104-3 is a support substrate.

In a semiconductor substrate 9-1 included in the second substrate 104-2*a*, an N-type well 240Na is formed, a P-type well 240Pa is formed, and an N-type well 240Nb is formed in this order from the left side of FIG. 6. In a semiconductor substrate 9-2 included in the second substrate 104-2*b*, an N-type well 240Nc and a P-type well 240Pb are formed in this order from the left side of FIG. 6.

The third substrate 104-3 includes an N-type substrate 24NS, and P-type wells 24Pa and 24Pb are formed, so that different potential portions between the second substrate 104-2*a* and the second substrate 104-2*b* or in the second substrate 104-2*a* or in the second substrate 104-2*b* can be electrically separated, and a leakage current through the support substrate 104-3 can be prevented. Furthermore, since the N-type substrate 24NS and the N-type well 240Na are electrically connected, the P-type well 24Pa and the P-type well 240Pa are electrically connected, the P-type well 24Pb and the P-type well 240Pb are electrically connected, and the potential of the third substrate (support substrate) 104-3 is fixed, it is possible to more reliably prevent a leakage current.

The P-type well 24Pa is formed up to a region corresponding to an end surface of the second substrate 104-2*a* facing the insulating layer 50, and an end surface of the P-type well 24Pa and the end surface of the second substrate 104-2*a* are flush with each other in the vertical direction.

On the other hand, the P-type well 24Pb is formed up to a region corresponding to an end surface of the second substrate 104-2*b* facing the insulating layer 50, and an end surface of the P-type well 24Pb and the end surface of the second substrate 104-2*b* are flush with each other in the vertical direction.

Figure 8:
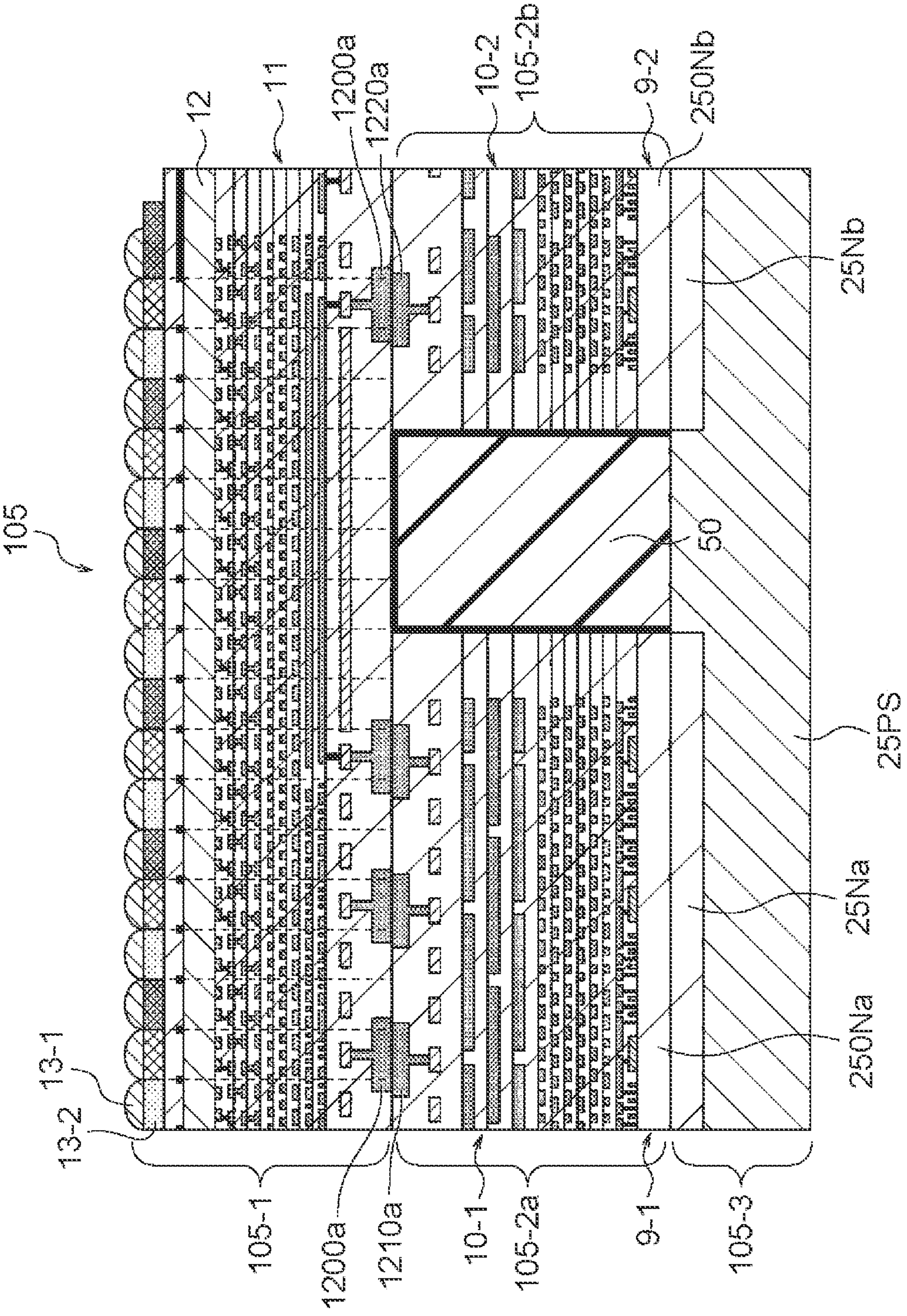
FIG. 8 is a cross-sectional view illustrating a configuration example of the solid-state imaging device according to the first embodiment to which the present technology is applied.

A solid-state imaging device 105 illustrated in FIG. 8 includes a first substrate 105-1, second substrates 105-2*a* and 105-2*b* that are laminated on the first substrate 105-1 by direct bonding on an opposite side (lower side in FIG. 8) of a light incident side (upper side in FIG. 8) of the first substrate 105-1 and have a size different from a size of the first substrate 105-1, a third substrate 105-3 provided on the opposite side (lower side in FIG. 8) of the light incident side (upper side in FIG. 8) of the second substrates 105-2*a* and 105-2*b*, and an insulating layer 50 formed between the first substrate 105-1 and the third substrate 105-3. In the solid-state imaging device 105, the third substrate 105-3 is in contact with the second substrates 105-2*a* and 105-2*b*, and is in contact with the insulating layer 50.

The first substrate 105-1 is a sensor substrate on which photodiodes, a plurality of transistors, and the like constituting pixels are formed. The second substrate 105-2*a* is, for example, any one of an analog circuit board on which an analog circuit is formed, a logic circuit board on which a logic circuit is formed, and a memory circuit board on which a memory circuit is formed, and the second substrate 105-2*b* is also, for example, any one of an analog circuit board on which an analog circuit is formed, a logic circuit board on which a logic circuit is formed, and a memory circuit board on which a memory circuit is formed. The third substrate 105-3 is a support substrate.

An N-type well 250Na is formed in a semiconductor substrate 9-1 included in the second substrate 105-2*a*, and an N-type well 250Nb is formed in a semiconductor substrate 9-2 included in the second substrate 105-2*b*.

Since N-type wells 25Na and 25Nb (floating) are formed in the third substrate 105-3 and the third substrate 105-3 has P-type substrate 25PS, it is possible to electrically separate different potential portions between the second substrate 105-2*a* and the second substrate 105-2*b*, or in the second substrate 105-2*a* or in the second substrate 105-2*b*, and to prevent a leakage current through the support substrate 105-3.

The N-type well 25Na is formed up to a region corresponding to an end surface of the second substrate 105-2*a* facing the insulating layer 50, and a right end surface of the N-type well 25Na and the end surface of the second substrate 105-2*a* are flush with each other in the vertical direction.

On the other hand, the N-type well 25Nb is formed up to a region corresponding to an end surface of the second substrate 105-2*b* facing the insulating layer 50, and a left end surface of the N-type well 25Nb and the end surface of the second substrate 105-2*b* are flush with each other in the vertical direction.

Figure 9:
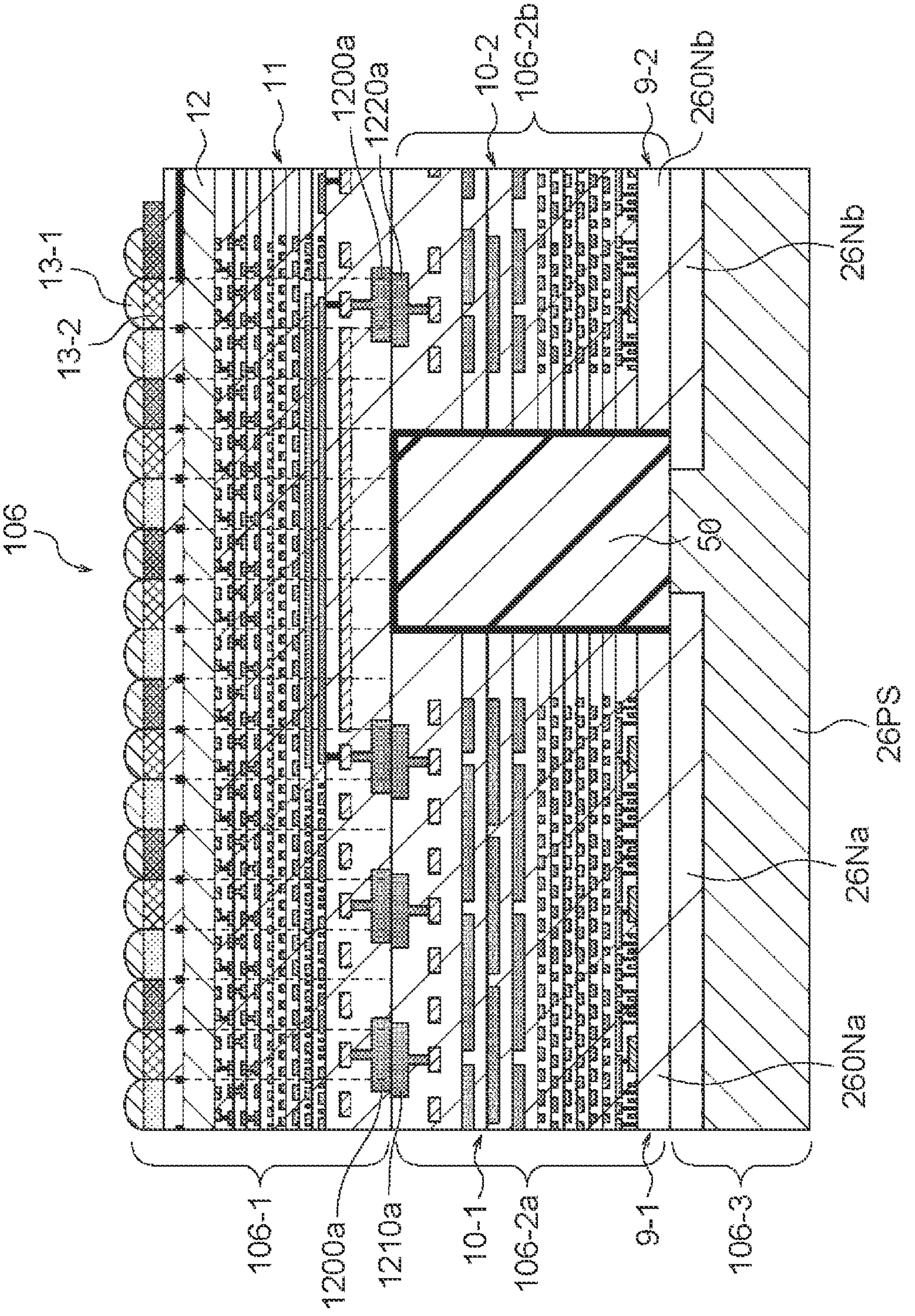
FIG. 9 is a cross-sectional view illustrating a configuration example of the solid-state imaging device according to the first embodiment to which the present technology is applied.

A solid-state imaging device 106 illustrated in FIG. 9 includes a first substrate 106-1, second substrates 106-2*a* and 106-2*b* that are laminated on the first substrate 106-1 by direct bonding on an opposite side (lower side in FIG. 9) of a light incident side (upper side in FIG. 9) of the first substrate 106-1 and have a size different from a size of the first substrate 106-1, a third substrate 106-3 provided on the opposite side (lower side in FIG. 9) of the light incident side (upper side in FIG. 9) of the second substrates 106-2*a* and 106-2*b*, and an insulating layer 50 formed between the first substrate 106-1 and the third substrate 106-3. In the solid-state imaging device 106, the third substrate 106-3 is in contact with the second substrates 106-2*a* and 106-2*b*, and is in contact with the insulating layer 50.

The first substrate 106-1 is a sensor substrate on which photodiodes, a plurality of transistors, and the like constituting pixels are formed. The second substrate 106-2*a* is, for example, any one of an analog circuit board on which an analog circuit is formed, a logic circuit board on which a logic circuit is formed, and a memory circuit board on which a memory circuit is formed, and the second substrate 106-2*b* is also, for example, any one of an analog circuit board on which an analog circuit is formed, a logic circuit board on which a logic circuit is formed, and a memory circuit board on which a memory circuit is formed. The third substrate 106-3 is a support substrate.

An N-type well 260Na is formed in a semiconductor substrate 9-1 included in the second substrate 106-2*a*, and an N-type well 260Nb is formed in a semiconductor substrate 9-2 included in the second substrate 106-2*b*.

Since N-type wells 26Na and 26Nb (floating) are formed in the third substrate 106-3 and the third substrate 106-3 has P-type substrate 26PS, it is possible to electrically separate different potential portions between the second substrate 106-2*a* and the second substrate 106-2*b*, or in the second substrate 106-5*a* or in the second substrate 106-2*b*, and to prevent a leakage current through the support substrate 106-3.

The N-type well 26Na is formed up to a region corresponding to an outside of an end surface of the second substrate 106-2*a* facing the insulating layer 50, an end surface of the N-type well 26Na and the end surface of the second substrate 106-2*a* are not flush with each other in the vertical direction, and a right end surface of the N-type well 26*a* is located in a region corresponding to the insulating layer 50.

On the other hand, the N-type well 26Nb is formed up to a region corresponding to an outside of an end surface of the second substrate 106-2*b* facing the insulating layer 50, an end surface of the N-type well 26Nb and the end surface of the second substrate 106-2*b* are not flush with each other in the vertical direction, and a left end surface of the N-type well 26*b* is located in a region corresponding to the insulating layer 50.

Figure 10:
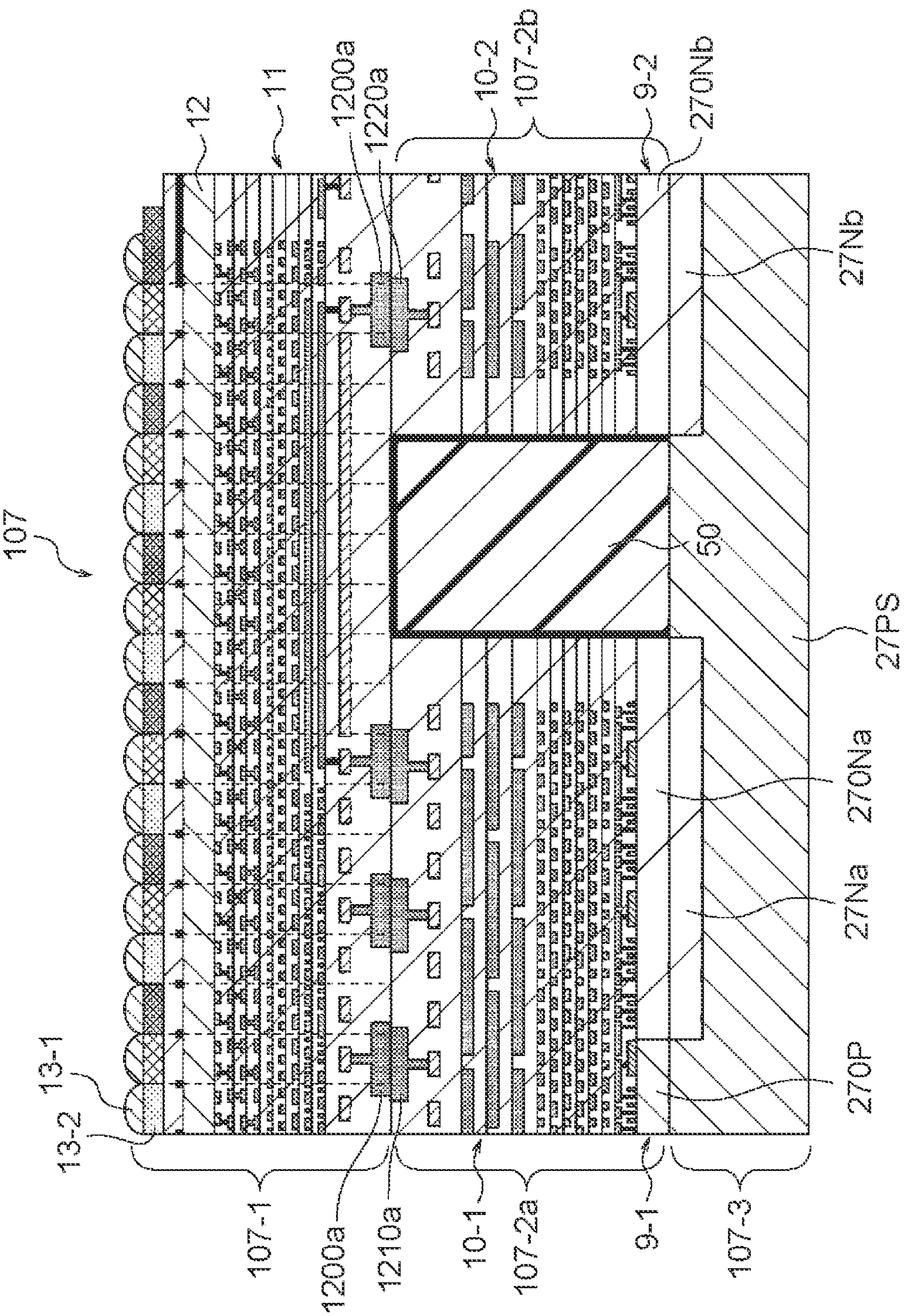
FIG. 10 is a cross-sectional view illustrating a configuration example of the solid-state imaging device according to the first embodiment to which the present technology is applied.

A solid-state imaging device 107 illustrated in FIG. 10 includes a first substrate 107-1, second substrates 107-2*a* and 107-2*b* that are laminated on the first substrate 107-1 by direct bonding on an opposite side (the lower side in FIG. 10) with respect to the light incident side (the upper side in FIG. 10) of the first substrate 107-1 and have a size different from a size of the first substrate 107-1, a third substrate 107-3 provided on the opposite side (the lower side in FIG. 10) with respect to the light incident side (the upper side in FIG. 10) of the second substrates 107-2*a* and 107-2*b*, and an insulating layer 50 formed between the first substrate 107-1 and the third substrate 107-3. In the solid-state imaging device 107, the third substrate 107-3 is in contact with the second substrates 107-2*a* and 107-2*b*, and is in contact with the insulating layer 50.

The first substrate 107-1 is a sensor substrate on which photodiodes, a plurality of transistors, and the like constituting pixels are formed. The second substrate 107-2*a* is, for example, any one of an analog circuit board on which an analog circuit is formed, a logic circuit board on which a logic circuit is formed, and a memory circuit board on which a memory circuit is formed, and the second substrate 107-2*b* is also, for example, any one of an analog circuit board on which an analog circuit is formed, a logic circuit board on which a logic circuit is formed, and a memory circuit board on which a memory circuit is formed. The third substrate 107-3 is a support substrate.

In a semiconductor substrate 9-1 included in the second substrate 107-2*a*, a P-type well 270P and an N-type well 270Na are formed in this order from the left side of FIG. 10. An N-type well 270Nb is formed in a semiconductor substrate 9-2 included in the second substrate 107-2*b*.

Since an N-type well 27Na is formed in the third substrate 107-3 and the third substrate 107-3 has a P-type substrate 27PS, it is possible to electrically separate different potential portions between the second substrate 107-2*a* and the second substrate 107-2*b*, or in the second substrate 107-2*a* or in the second substrate 107-2*b*, and to prevent a leakage current through the support substrate 107-3. Furthermore, the leakage current can be more reliably prevented by electrically connecting the N-type substrate 27PS and the P-type well 270P and fixing the potential of the third substrate (support substrate) 107-3.

The N-type well 27Na is formed up to a region corresponding to an end surface of the second substrate 107-2*a* facing the insulating layer 50, and a right end surface of the N-type well 27Na and the end surface of the second substrate 107-2*a* are flush with each other in the vertical direction.

On the other hand, the N-type well 27Nb is formed up to a region corresponding to an end surface of the second substrate 107-2*b* facing the insulating layer 50, and a left end surface of the N-type well 27Nb and the end surface of the second substrate 107-2*b* are flush with each other in the vertical direction.

Figure 11:
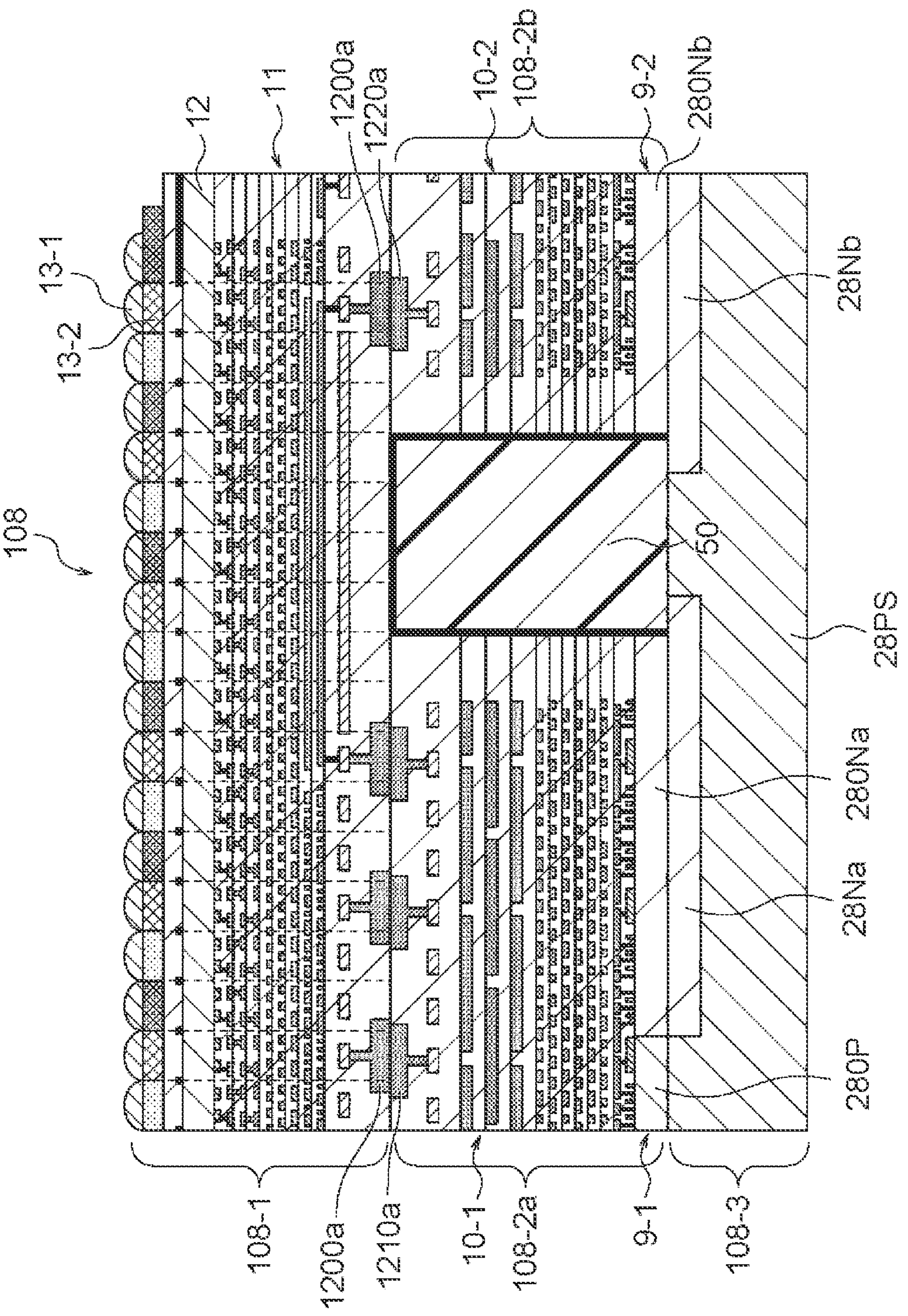
FIG. 11 is a cross-sectional view illustrating a configuration example of the solid-state imaging device according to the first embodiment to which the present technology is applied.

A solid-state imaging device 108 illustrated in FIG. 11 includes a first substrate 108-1, second substrates 108-2*a* and 108-2*b* that are laminated on the first substrate 108-1 by direct bonding on an opposite side (the lower side in FIG. 11) with respect to a light incident side (the upper side in FIG. 11) of the first substrate 108-1 and have a size different from a size of the first substrate 108-1, a third substrate 108-3 provided on the opposite side (the lower side in FIG. 11) with respect to the light incident side (the upper side in FIG. 11) of the second substrates 108-2*a* and 108-2*b*, and an insulating layer 50 formed between the first substrate 108-1 and the third substrate 108-3. In the solid-state imaging device 108, the third substrate 108-3 is in contact with the second substrates 108-2*a* and 108-2*b*, and is in contact with the insulating layer 50.

The first substrate 108-1 is a sensor substrate on which photodiodes, a plurality of transistors, and the like constituting pixels are formed. The second substrate 108-2*a* is, for example, any one of an analog circuit board on which an analog circuit is formed, a logic circuit board on which a logic circuit is formed, and a memory circuit board on which a memory circuit is formed, and the second substrate 108-2*b* is also, for example, any one of an analog circuit board on which an analog circuit is formed, a logic circuit board on which a logic circuit is formed, and a memory circuit board on which a memory circuit is formed. The third substrate 108-3 is a support substrate.

In a semiconductor substrate 9-1 included in the second substrate 108-2*a*, a P-type well 280P and an N-type well 280Na are formed in this order from the left side of FIG. 11. An N-type well 280Nb is formed in a semiconductor substrate 9-2 included in the second substrate 108-2*b*.

Since an N-type well 28Na is formed in the third substrate 108-3 and the third substrate 108-3 has a P-type substrate 28PS, it is possible to electrically separate different potential portions between the second substrate 108-2*a* and the second substrate 108-2*b*, or in the second substrate 108-2*a* or in the second substrate 108-2*b*, and to prevent a leakage current through the support substrate 108-3. Furthermore, the leakage current can be more reliably prevented by electrically connecting the N-type substrate 28PS and the P-type well 280P and fixing the potential of the third substrate (support substrate) 108-3.

The N-type well 28Na is formed up to a region corresponding to an outside of an end surface of the second substrate 108-2*a* facing the insulating layer 50, an end surface of the N-type well 28Na and the end surface of the second substrate 108-2*a* are not flush with each other in the vertical direction, and a right end surface of the N-type well 28*a* is located in a region corresponding to the insulating layer 50.

On the other hand, the N-type well 28Nb is formed up to a region corresponding to an outside of an end surface of the second substrate 108-2*b* facing the insulating layer 50, an end surface of the N-type well 28Nb and the end surface of the second substrate 108-2*b* are not flush with each other in the vertical direction, and a left end surface of the N-type well 28*b* is located in a region corresponding to the insulating layer 50.

Figure 12:
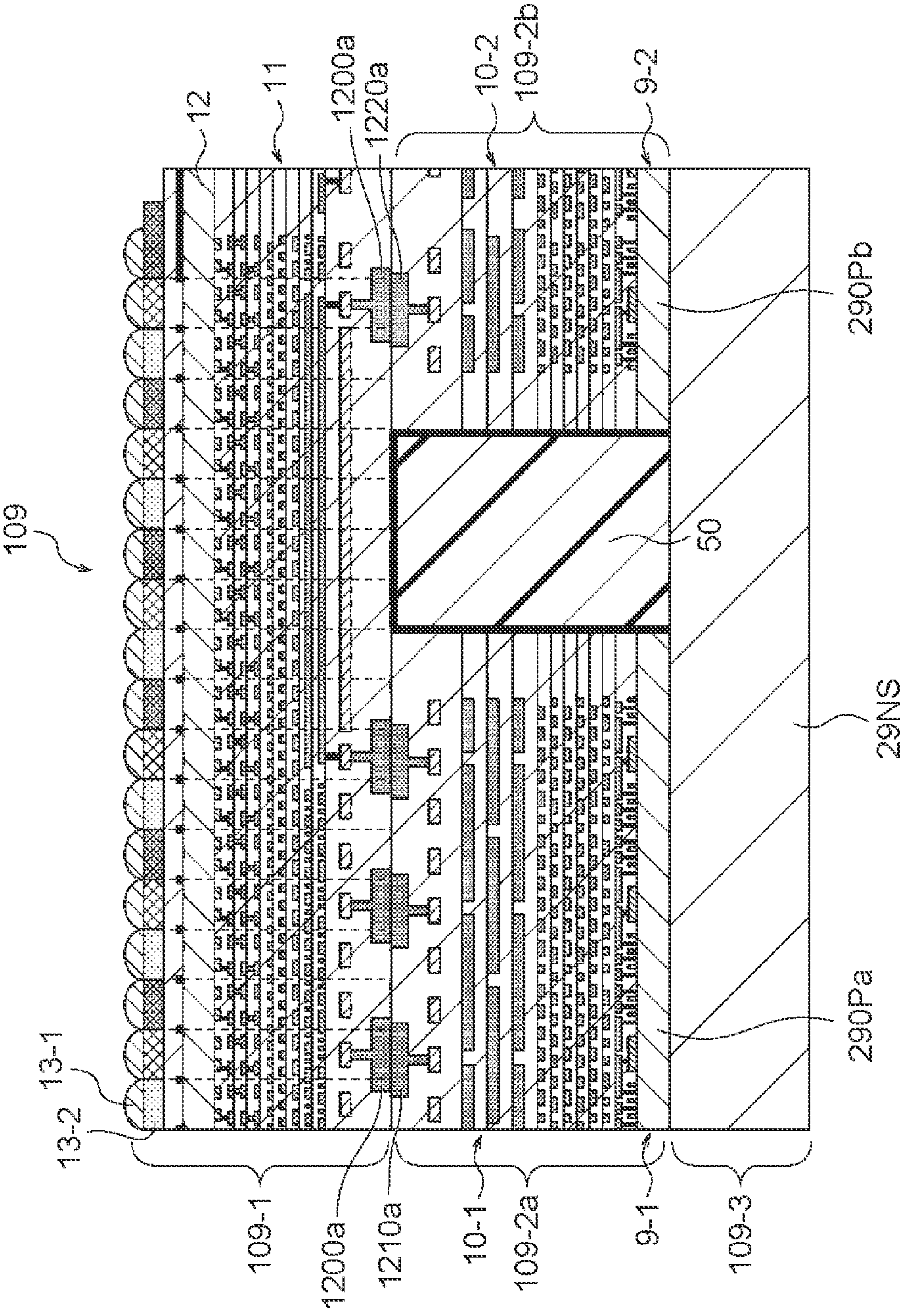
FIG. 12 is a cross-sectional view illustrating a configuration example of the solid-state imaging device according to the first embodiment to which the present technology is applied.

A solid-state imaging device 109 illustrated in FIG. 12 includes a first substrate 109-1, second substrates 109-2*a* and 109-2*b* that are laminated on the first substrate 109-1 by direct bonding on an opposite side (the lower side in FIG. 12) with respect to a light incident side (the upper side in FIG. 12) of the first substrate 109-1 and have a size different from a size of the first substrate 109-1, a third substrate 109-3 provided on the opposite side (the lower side in FIG. 12) with respect to the light incident side (the upper side in FIG. 12) of the second substrates 109-2*a* and 109-2*b*, and an insulating layer 50 formed between the first substrate 109-1 and the third substrate 109-3. In the solid-state imaging device 109, the third substrate 109-3 is in contact with the second substrates 109-2*a* and 109-2*b*, and is in contact with the insulating layer 50.

The first substrate 109-1 is a sensor substrate on which photodiodes, a plurality of transistors, and the like constituting pixels are formed. The second substrate 109-2*a* is, for example, any one of an analog circuit board on which an analog circuit is formed, a logic circuit board on which a logic circuit is formed, and a memory circuit board on which a memory circuit is formed, and the second substrate 109-2*b* is also, for example, any one of an analog circuit board on which an analog circuit is formed, a logic circuit board on which a logic circuit is formed, and a memory circuit board on which a memory circuit is formed. The third substrate 109-3 is a support substrate.

A P-type well 290Pa is formed in a semiconductor substrate 9-1 included in the second substrate 109-2*a*, and a P-type well 290Pb is formed in a semiconductor substrate 9-2 included in the second substrate 109-2*b*.

The third substrate 109-3 is an N-type (reference sign 29NS), and at least a partial region of a surface in contact with the second substrates 109-2*a* and 109-2*b* has a resistance of 1 Ωcm or more (high resistance), so that it is possible to electrically separate different potential portions between the second substrate 109-2*a* and the second substrate 109-2*b*, or in the second substrate 109-2*a* or in the second substrate 109-2*b*, and to prevent a leakage current through the support substrate 109-3.

Figure 13:
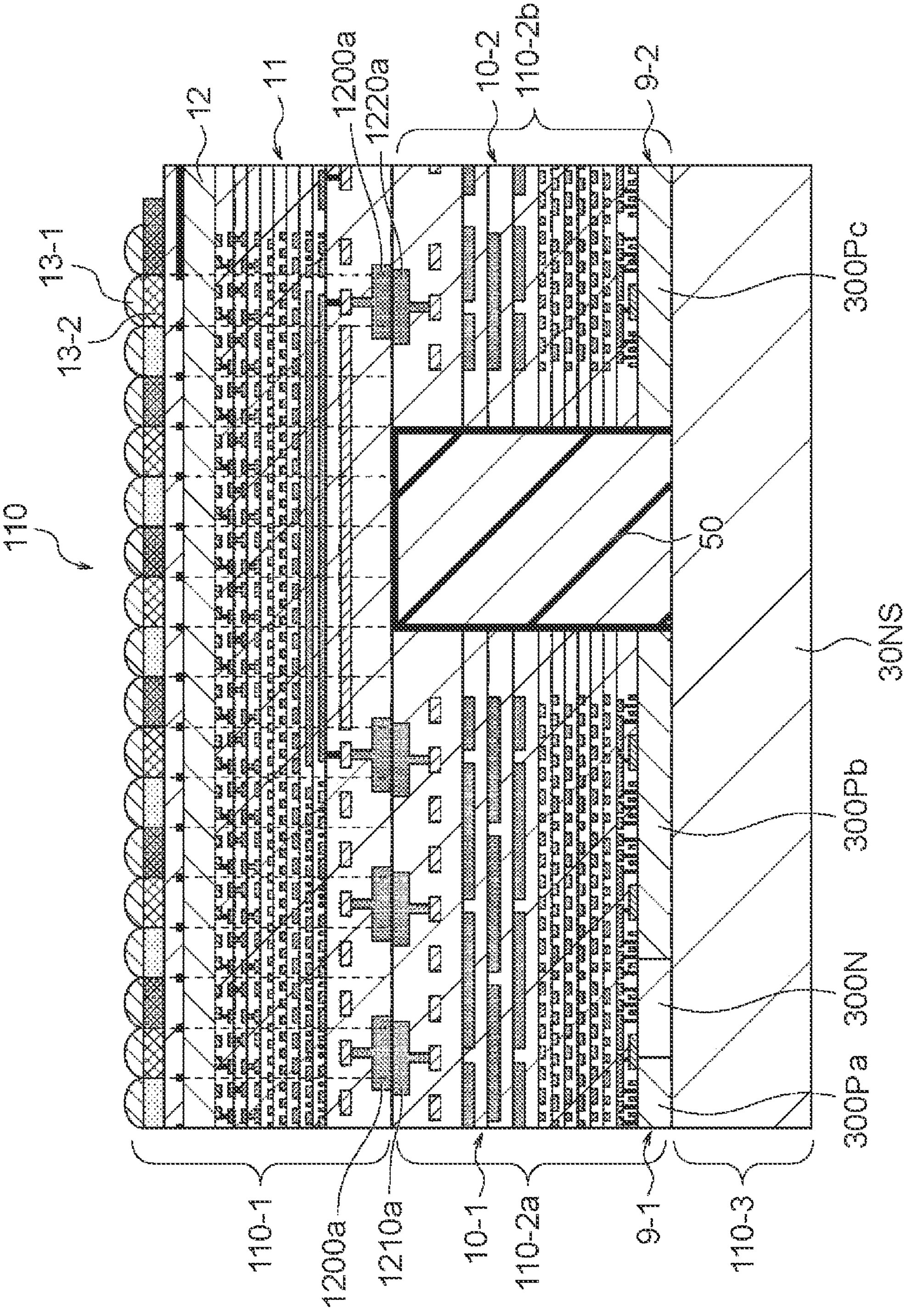
FIG. 13 is a cross-sectional view illustrating a configuration example of the solid-state imaging device according to the first embodiment to which the present technology is applied.

A solid-state imaging device 110 illustrated in FIG. 13 includes a first substrate 110-1, second substrates 110-2*a* and 110-2*b* that are laminated on the first substrate 110-1 by direct bonding on an opposite side (the lower side in FIG. 13) with respect to a light incident side (the upper side in FIG. 13) of the first substrate 110-1 and have a size different from a size of the first substrate 110-1, a third substrate 110-3 provided on the opposite side (the lower side in FIG. 13) with respect to the light incident side (the upper side in FIG. 13) of the second substrates 110-2*a* and 110-2*b*, and an insulating layer 50 formed between the first substrate 110-1 and the third substrate 110-3. In the solid-state imaging device 110, the third substrate 110-3 is in contact with the second substrates 110-2*a* and 110-2*b*, and is in contact with the insulating layer 50.

The first substrate 110-1 is a sensor substrate on which photodiodes, a plurality of transistors, and the like constituting pixels are formed. The second substrate 110-2*a* is, for example, any one of an analog circuit board on which an analog circuit is formed, a logic circuit board on which a logic circuit is formed, and a memory circuit board on which a memory circuit is formed, and the second substrate 110-2*b* is also, for example, any one of an analog circuit board on which an analog circuit is formed, a logic circuit board on which a logic circuit is formed, and a memory circuit board on which a memory circuit is formed. The third substrate 110-3 is a support substrate.

In a semiconductor substrate 9-1 included in the second substrate 110-2*a*, a P-type well 300Pa is formed, an N-type well 300N is formed, and a P-type well 300Pb is formed in this order from the left side of FIG. 13. A P-type well 300Pc is formed in a semiconductor substrate 9-2 included in the second substrate 110-2*b*.

The third substrate 110-3 is an N-type (reference sign 30NS), and at least a partial region of a surface in contact with the second substrates 110-2*a* and 110-2*b* has a resistance of 1 Ωcm or more (high resistance), so that it is possible to electrically separate different potential portions between the second substrate 110-2*a* and the second substrate 110-2*b*, or in the second substrate 110-2*a* or in the second substrate 110-2*b*, and to prevent a leakage current through the support substrate 110-3. Furthermore, since the N-type third substrate 110-3 and the N-type well 300N are electrically connected and the potential of the third substrate (support substrate) 110-3 is fixed, a leakage current can be more reliably prevented.

Figure 14:
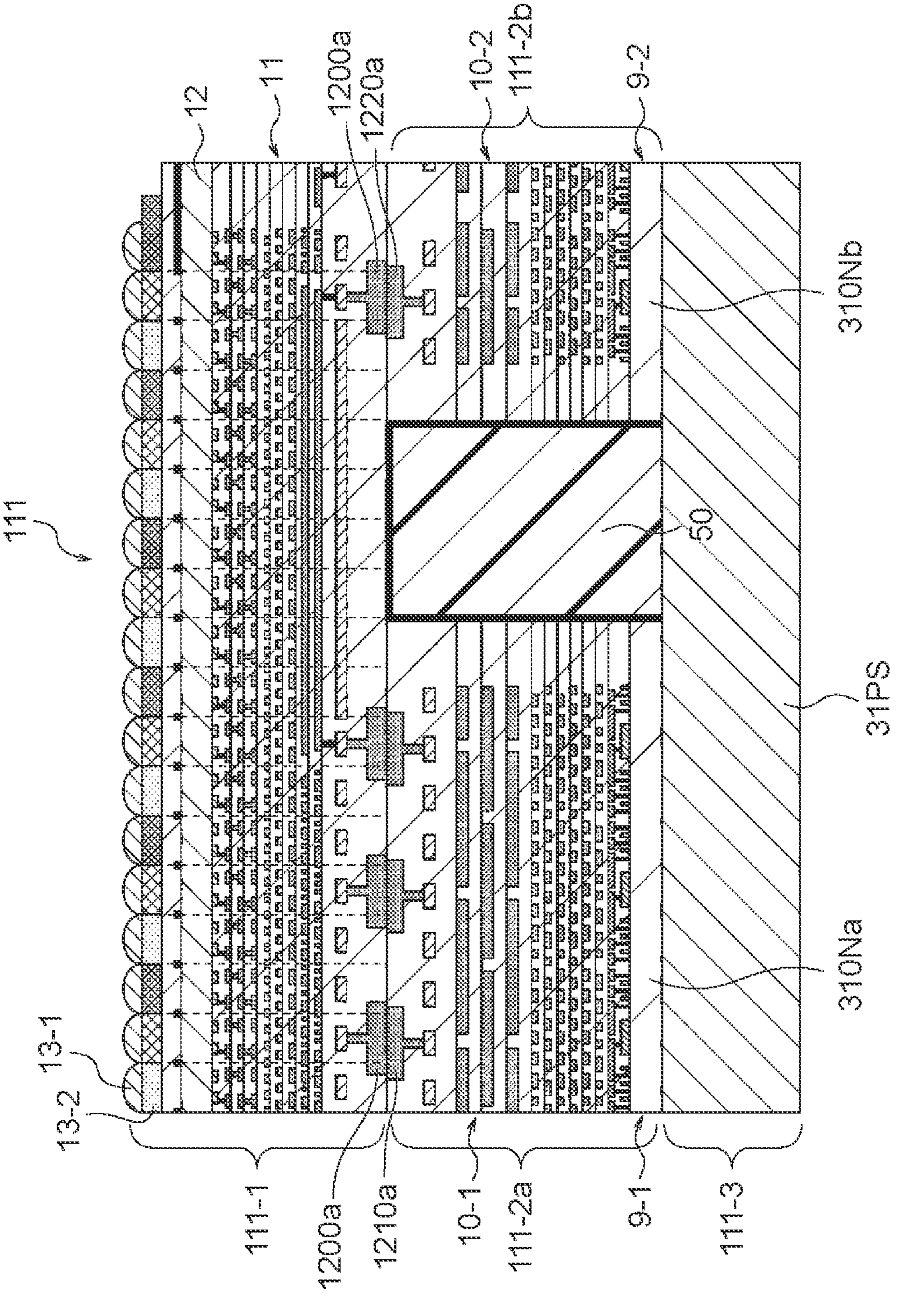
FIG. 14 is a cross-sectional view illustrating a configuration example of the solid-state imaging device according to the first embodiment to which the present technology is applied.

A solid-state imaging device 111 illustrated in FIG. 14 includes a first substrate 111-1, second substrates 111-2*a* and 111-2*b* that are laminated on the first substrate 111-1 by direct bonding on an opposite side (the lower side in FIG. 14) with respect to a light incident side (the upper side in FIG. 14) of the first substrate 111-1 and have a size different from a size of the first substrate 111-1, a third substrate 111-3 provided on the opposite side (the lower side in FIG. 14) with respect to the light incident side (the upper side in FIG. 14) of the second substrates 111-2*a* and 111-2*b*, and an insulating layer 50 formed between the first substrate 111-1 and the third substrate 111-3. In the solid-state imaging device 111, the third substrate 111-3 is in contact with the second substrates 111-2*a* and 111-2*b*, and is in contact with the insulating layer 50.

The first substrate 111-1 is a sensor substrate on which photodiodes, a plurality of transistors, and the like constituting pixels are formed. The second substrate 111-2*a* is, for example, any one of an analog circuit board on which an analog circuit is formed, a logic circuit board on which a logic circuit is formed, and a memory circuit board on which a memory circuit is formed, and the second substrate 111-2*b* is also, for example, any one of an analog circuit board on which an analog circuit is formed, a logic circuit board on which a logic circuit is formed, and a memory circuit board on which a memory circuit is formed. The third substrate 111-3 is a support substrate.

An N-type well 310Na is formed in a semiconductor substrate 9-1 included in the second substrate 111-2*a*, and an N-type well 310Nc is formed in a semiconductor substrate 9-2 included in the second substrate 111-2*b*.

The third substrate 111-3 is a P-type (reference sign 31PS), and at least a partial region of a surface in contact with the second substrates 111-2*a* and 111-2*b* has a resistance of 1 Ωcm or more (high resistance), so that it is possible to electrically separate different potential portions between the second substrate 111-2*a* and the second substrate 111-2*b*, or in the second substrate 111-2*a* or in the second substrate 111-2*b*, and to prevent a leakage current through the support substrate 111-3.

Figure 15:
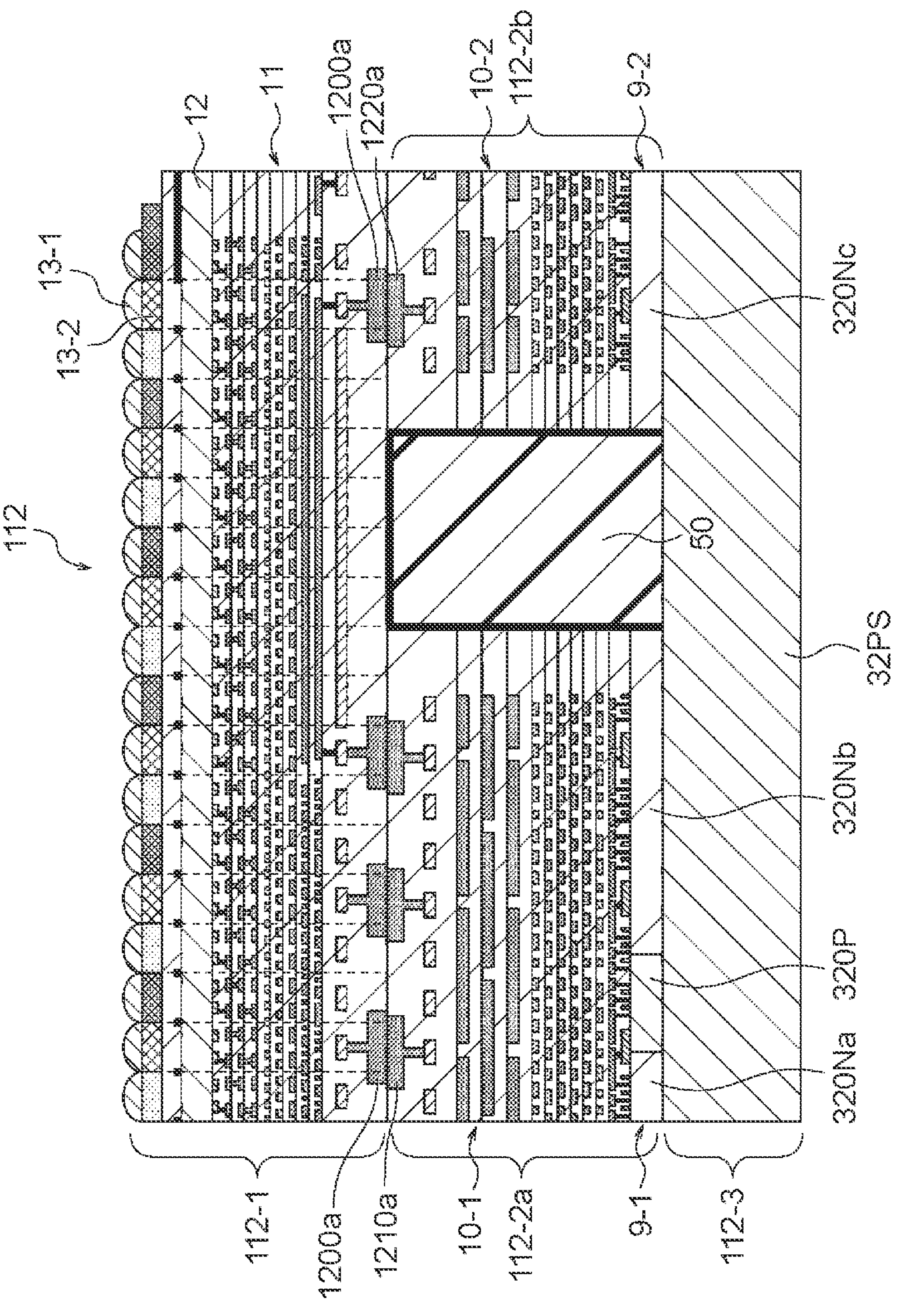
FIG. 15 is a cross-sectional view illustrating a configuration example of the solid-state imaging device according to the first embodiment to which the present technology is applied.

A solid-state imaging device 112 illustrated in FIG. 15 includes a first substrate 112-1, second substrates 112-2*a* and 112-2*b* that are laminated on the first substrate 112-1 by direct bonding on an opposite side (the lower side in FIG. 15) with respect to a light incident side (the upper side in FIG. 15) of the first substrate 112-1 and have a size different from a size of the first substrate 112-1, a third substrate 112-3 provided on the opposite side (the lower side in FIG. 15) with respect to the light incident side (the upper side in FIG. 15) of the second substrates 112-2*a* and 112-2*b*, and an insulating layer 50 formed between the first substrate 112-1 and the third substrate 112-3. In the solid-state imaging device 112, the third substrate 112-3 is in contact with the second substrates 112-2*a* and 112-2*b*, and is in contact with the insulating layer 50.

The first substrate 112-1 is a sensor substrate on which photodiodes, a plurality of transistors, and the like constituting pixels are formed. The second substrate 112-2*a* is, for example, any one of an analog circuit board on which an analog circuit is formed, a logic circuit board on which a logic circuit is formed, and a memory circuit board on which a memory circuit is formed, and the second substrate 112-2*b* is also, for example, any one of an analog circuit board on which an analog circuit is formed, a logic circuit board on which a logic circuit is formed, and a memory circuit board on which a memory circuit is formed. The third substrate 112-3 is a support substrate.

In a semiconductor substrate 9-1 included in the second substrate 112-2*a*, an N-type well 320Na is formed, a P-type well 320P is formed, and an N-type well 320Nb is formed from the left side of FIG. 15. An N-type well 310Nc is formed in a semiconductor substrate 9-2 included in the second substrate 112-2*b*.

The third substrate 112-3 is a P-type (reference sign 32PS), and at least a partial region of a surface in contact with the second substrates 112-2*a* and 112-2*b* has a resistance of 1 Ωcm or more (high resistance), so that it is possible to electrically separate different potential portions between the second substrate 112-2*a* and the second substrate 112-2*b*, or in the second substrate 112-2*a* or in the second substrate 112-2*b*, and to prevent a leakage current through the support substrate 112-3. Furthermore, since the P-type third substrate 112-3 and the P-type well 320P are electrically connected and the potential of the third substrate (support substrate) 112-3 is fixed, a leakage current can be more reliably prevented.

Next, prevention of a leakage current will be described with reference to FIGS. 16 to 23.

Figure 16A:
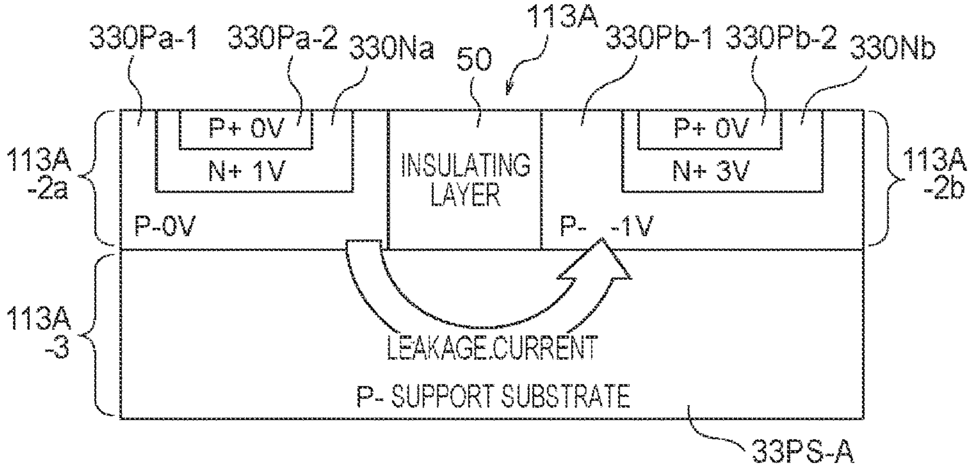
FIGS. 16A, 16B and 16C are diagrams explaining that the solid-state imaging device according to the first embodiment to which the present technology is applied can prevent leakage current.

A P-well 330Pa-1 (0 V) (The P-well 330Pa-1 and a P-support substrate 113A-3 are in contact with each other.), an N+well 330Na (+1 V), and a P+well 330Pa-2 (0 V) are formed in order from a P-support substrate 113A-3 side on a semiconductor substrate 113A-2*a* of a second substrate on the left side constituting a solid-state imaging device 113A illustrated in FIG. 16A, and a P-well 330Pb-1 (−1 V) (The P-well 330Pb-1 and the P-support substrate 113A-3 are in contact with each other.), an N+well 330Nb (+3 V), and a P+well 330Pb-2 (0 V) are formed in order from the P-support substrate 113A-3 side on a semiconductor substrate 113A-2*b* of the second substrate on the right side constituting the solid-state imaging device 113A. Then, a leakage current flows from the P-well 330Pa-1 (0 V) to the P-well 330Pb-1 (−1 V) via the P-support substrate 113A-3 to conduct.

Figure 16B:
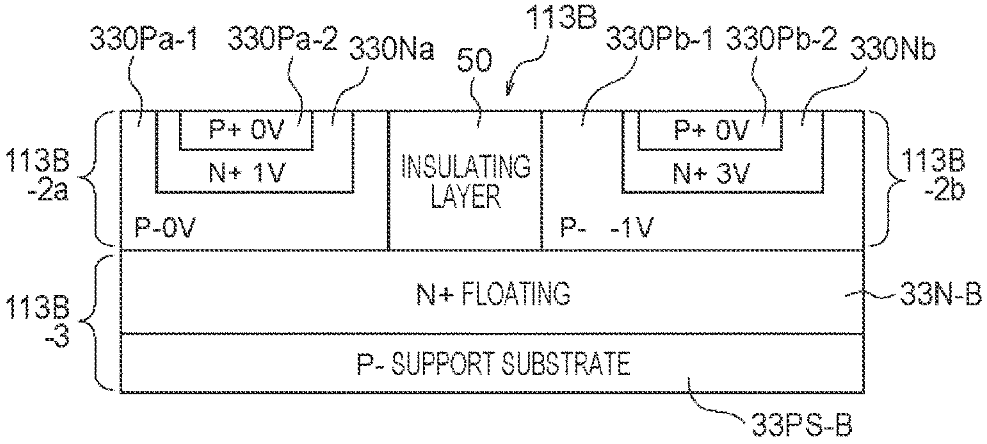

In FIG. 16B, a third substrate (support substrate) 113B-3 constituting a solid-state imaging device 113B has an N+well 33N-B (floating) in contact with a P-well 330Pa-1 (0 V) and a P-well 330Pb-1 (−1 V), whereby a leakage current can be prevented.

Figure 16C:
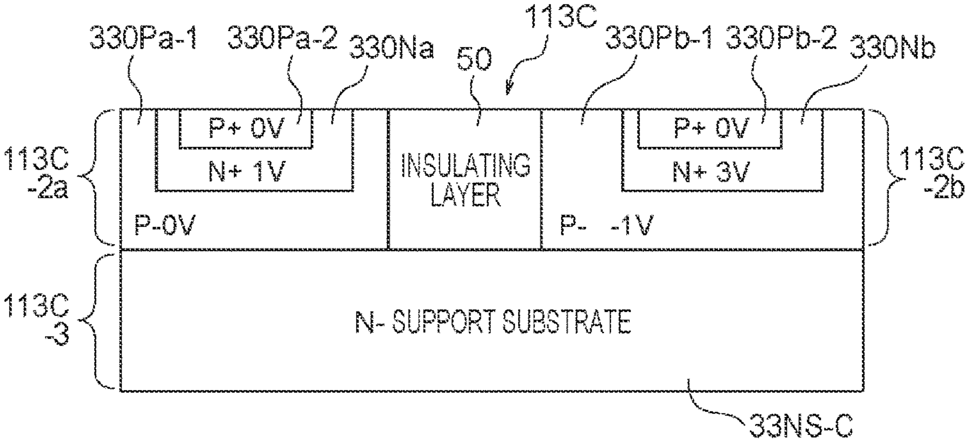

In FIG. 16C, since a third substrate (support substrate) 113C-3 constituting a solid-state imaging device 113C is of an N− type, a leakage current can be prevented.

Figure 17A:
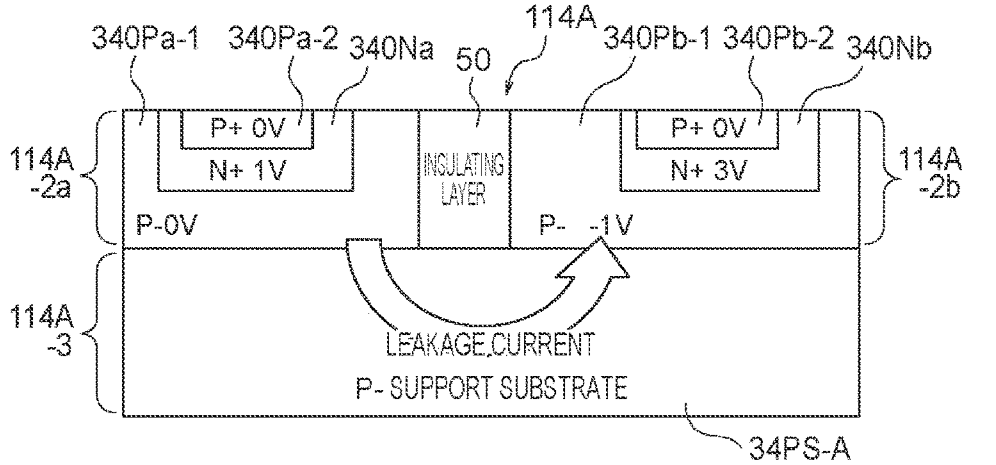
FIGS. 17A, 17B and 17C are diagrams explaining that the solid-state imaging device according to the first embodiment to which the present technology is applied can prevent leakage current.

A P-well 340Pa-1 (0 V) (The P-well 340Pa-1 and a P-support substrate 114A-3 are in contact with each other.), an N+well 340Na (+1 V), and a P+well 340Pa-2 (0 V) are formed in order from a P-support substrate 114A-3 side on a semiconductor substrate 114A-2*a* of a second substrate on the left side constituting a solid-state imaging device 114A illustrated in FIG. 17A, and a P-well 340Pb-1 (−1 V) (The P-well 340Pb-1 and the P-support substrate 114A-3 are in contact with each other.), an N+well 340Nb (+3 V), and a P+well 340Pb-2 (0 V) are formed in order from the P-support substrate 114A-3 side on a semiconductor substrate 114A-2*b* of the second substrate on the right side constituting the solid-state imaging device 114A. Then, a leakage current flows from the P-well 340Pa-1 (0 V) to the P-well 340Pb-1 (−1 V) via the P-support substrate 114A-3 to conduct.

Figure 17B:
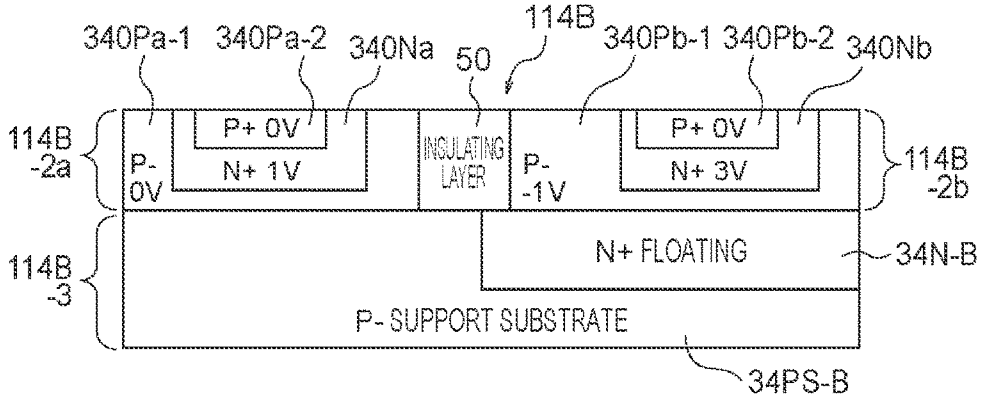

In FIG. 17B, a third substrate (support substrate) 114B-3 constituting a solid-state imaging device 114B has an N+well 34N-B (floating) in contact with the P-well 340Pb-1 (−1 V), whereby a leakage current can be prevented.

Figure 17C:
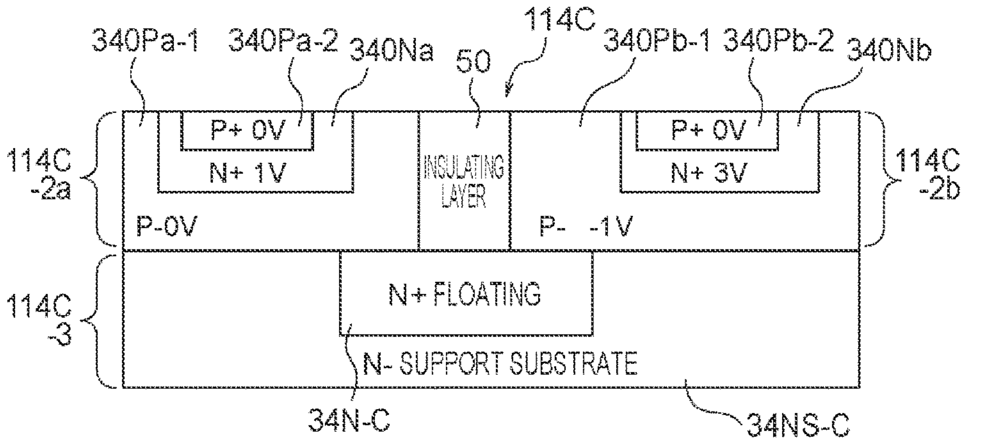

In FIG. 17C, a third substrate (support substrate) 114C-3 constituting a solid-state imaging device 113C has an N+well 34N-C (floating) in contact with a part of a P-well 340Pa-1 (0 V) and a part of a P-well 340Pb-1 (−1 V), so that a leakage current can be prevented. Note that the N+well 34N-C (floating) of the third substrate (support substrate) 114C-3 constituting the solid-state imaging device 113C may be in contact with the entire (entire surface) of the P-well 340Pa-1 (0 V) and the entire (entire surface) of the P-well 340Pb-1 (−1 V) in order to prevent a leakage current.

Figure 18A:
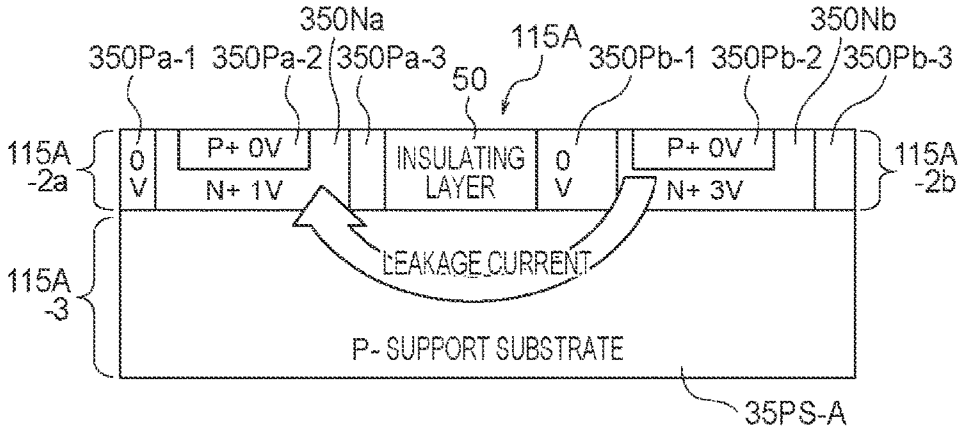
FIGS. 18A and 18B are diagrams explaining that the solid-state imaging device according to the first embodiment to which the present technology is applied can prevent leakage current.

An N+well 350Na (+1 V) (The N+well 350Na and a P-support substrate 115A-3 are in contact with each other.) and a P+well 350Pa-2 (0 V) are formed in order from a P-support substrate 115A-3 side on a semiconductor substrate 115A-2*a* of a second substrate on the left side constituting a solid-state imaging device 115A illustrated in FIG. 18A, a P-well 350Pa-1 (0 V) is formed on the left side of the N+well 350Na (+1 V) while being in contact with the P-support substrate 115A-3, and a P-well 350Pa-3 (0 V) is formed on the right side of the N+well 350Na (+1 V) while being in contact with the P-support substrate 115A-3.

An N+well 350Nb (+1 V) (The N+well 350Nb and the P-support substrate 115A-3 are in contact with each other.) and a P+well 350Pb-2 (0 V) are formed on a semiconductor substrate 115A-2*b* of the second substrate on the right side constituting the solid-state imaging device 115A in order from the P-support substrate 115A-3 side, a P-well 350Pb-1 (0 V) is formed on the left side of the N+well 350Nb (+1 V) while being in contact with the P-support substrate 115A-3, and a P-well 350Pb-3 (0 V) is formed on the right side of the N+well 350Nb (+1 V) while being in contact with the P-support substrate 115A-3. Then, a leakage current flows from the N+well 350Nb (+3 V) to the N+well 350Na (+1 V) via the P-support substrate 115A-3 to conduct.

The semiconductor substrate 115A-2*a* of the second substrate on the left side and the semiconductor substrate 115A-2*b* of the second substrate on the right side constituting the solid-state imaging device 115A are thin semiconductor substrates with respect to the semiconductor substrate 113A-2*a* of the second substrate on the left side and the semiconductor substrate 113A-2*b* of the second substrate on the right side constituting the solid-state imaging device 113A, and the semiconductor substrate 114A-2*a* of the second substrate on the left side and the semiconductor substrate 114A-2*b* of the second substrate on the right side constituting the solid-state imaging device 114A.

Figure 18B:
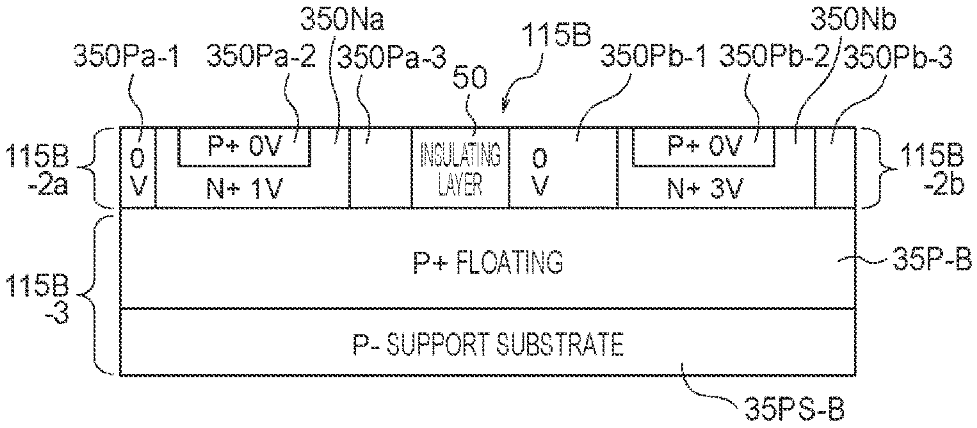

In FIG. 18B, a third substrate (support substrate) 115B-3 constituting a solid-state imaging device 115B has a P+well 35P-B (floating) in contact with an N+well 350Nb (3 V) and an N+well 350Na (1 V), so that a leakage current can be prevented.

Figure 19A:
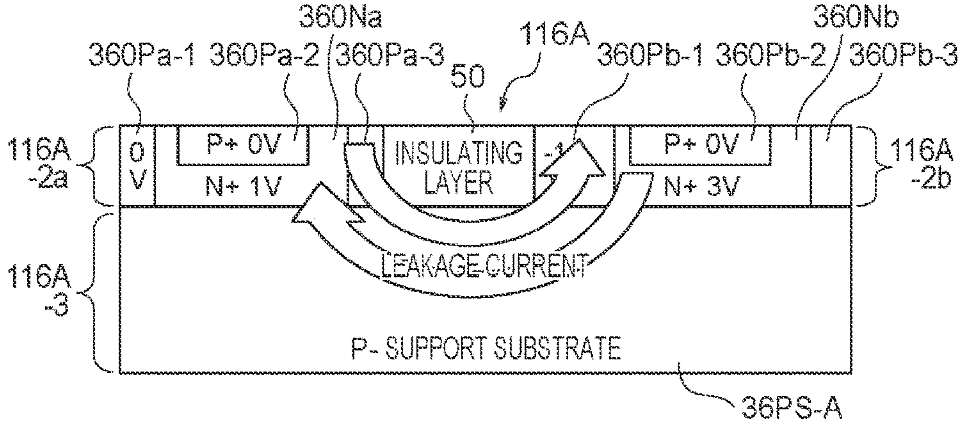
FIGS. 19A, 19B and 19C are diagrams explaining that the solid-state imaging device according to the first embodiment to which the present technology is applied can prevent leakage current.

An N+well 360Na (+1 V) (The N+well 360Na and a P-support substrate 116A-3 are in contact with each other.) and a P+well 360Pa-2 (0 V) are formed in order from a P-support substrate 116A-3 side on a semiconductor substrate 116A-2*a* of a second substrate on the left side constituting a solid-state imaging device 116A illustrated in FIG. 19A, a P-well 360Pa-1 (0 V) is formed on the left side of the N+well 360Na (+1 V) while being in contact with the P-support substrate 116A-3, and a P-well 360Pa-3 (0 V) is formed on the right side of the N+well 360Na (+1 V) while being in contact with the P-support substrate 116A-3.

An N+well 360Nb (+1 V) (The N+well 360Nb and the P-support substrate 116A-3 are in contact with each other.) and a P+well 360Pb-2 (0 V) are formed in order from the P-support substrate 116A-3 side on a semiconductor substrate 116A-2*b* of the second substrate on the right side constituting the solid-state imaging device 116A, a P-well 360Pb-1 (−1 V) is formed on the left side of the N+well 360Nb (+1 V) while being in contact with the P-support substrate 116A-3, and a P-well 360Pb-3 (0 V) is formed on the right side of the N+well 360Nb (+1 V) while being in contact with the P-support substrate 116A-3. Then, a leak current flows from the N+well 360Nb (+3 V) to the N+well 360Na (+1 V) via the P-support substrate 116A-3, and as a reverse flow, a leakage current flows from the P-well 360Pa-1 (0 V) to the P− well 360Pb-1 (−1 V) via the P-support substrate 116A-3 to conduct.

The semiconductor substrate 116A-2*a* of the second substrate on the left side and the semiconductor substrate 116A-2*b* of the second substrate on the right side constituting the solid-state imaging device 116A are thin semiconductor substrates with respect to the semiconductor substrates 113A-2*a* of the second substrate on the left side and the semiconductor substrate 113A-2*b* of the second substrate on the right side constituting the solid-state imaging device 113A, and the semiconductor substrate 114A-2*a* of the second substrate on the left side and the semiconductor substrate 114A-2*b* of the second substrate on the right side constituting the solid-state imaging device 114A.

Figure 19B:
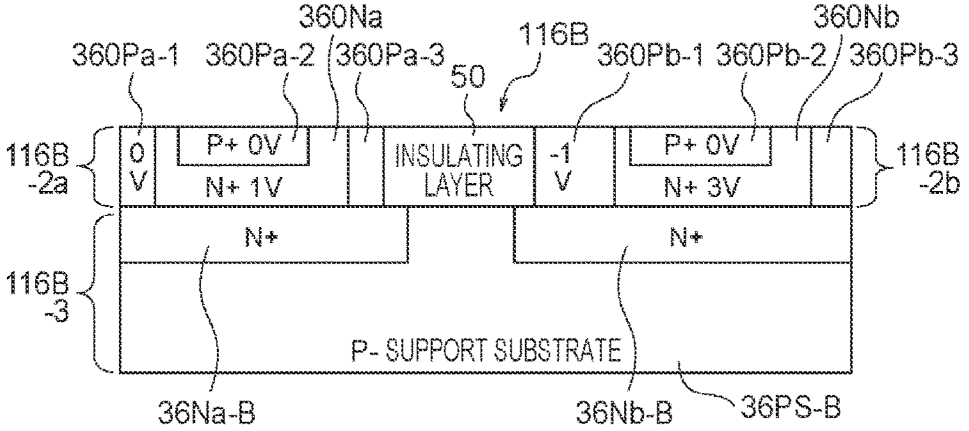

In FIG. 19B, a third substrate (support substrate) 116B-3 constituting a solid-state imaging device 116B includes an N+well 360Nb (3 V) and an N+well 360Na (1 V), and two N+wells 36Na-B and 36Nb-B in contact with a P-well 360Pa-3 (0 V) and a P-well 360Pb-3 (−1 V), whereby a leakage current can be prevented.

Figure 19C:
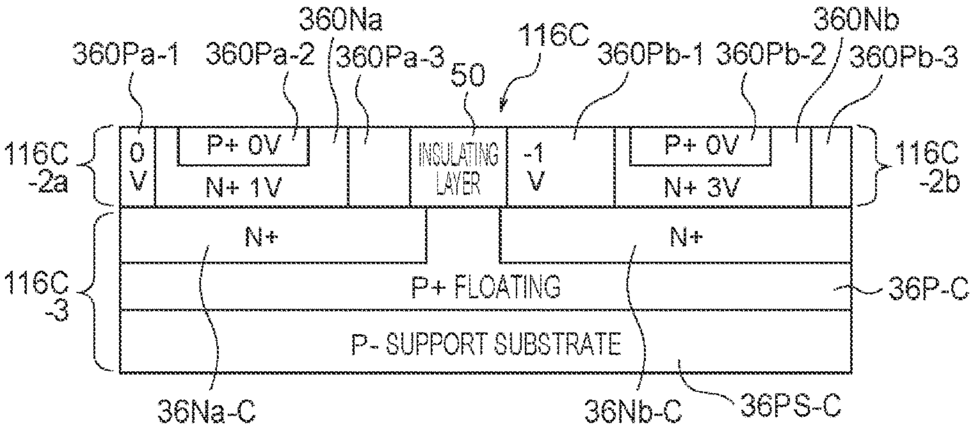

In FIG. 19C, a third substrate (support substrate) 116C-3 constituting a solid-state imaging device 116C includes an N+well 360Nb (3 V) and an N+well 360Na (1 V), two N+wells 36Na-B and 36Nb-B in contact with a P-well 360Pa-3 (0 V) and a P-well 360Pb-3 (−1 V), and a P+well 36P-C (floating) in contact with two N+wells 36Na-B and 36Nb-B, whereby a leakage current can be prevented.

Figure 20A:
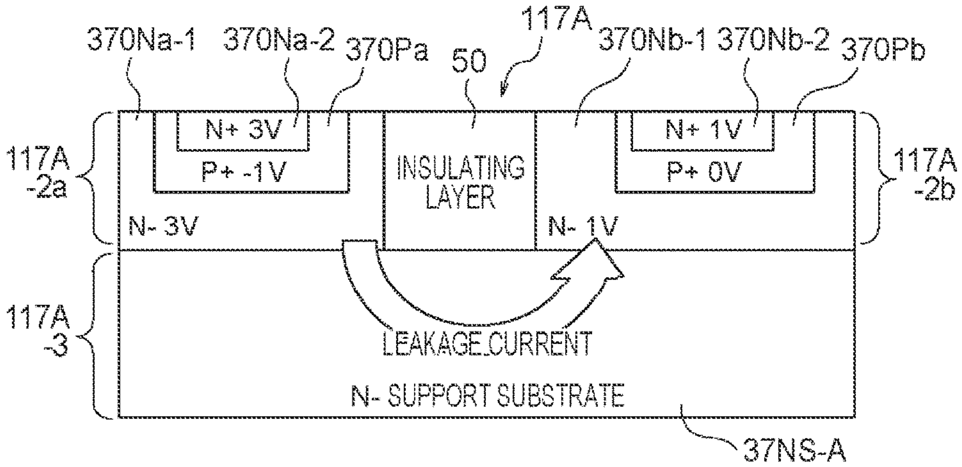
FIGS. 20A, 20B and 20C are diagrams explaining that the solid-state imaging device according to the first embodiment to which the present technology is applied can prevent leakage current.

An N−well 370Na-1 (−3 V) (The N−well 370Na-1 and an N-support substrate 117A-3 are in contact with each other.), a P+well 370Pa (−1 V), and an N+well 370Na-2 (+3 V) are formed in order from an N− support substrate 117A-3 side on a semiconductor substrate 117A-2*a* of a second substrate on the left side constituting a solid-state imaging device 117A illustrated in FIG. 20A, and an N−well 370Nb-1 (−1 V) (The N−well 370Nb-1 and the N-support substrate 117A-3 are in contact with each other.), a P+well 370Pb (0 V), and an N+well 370Nb-2 (+1 V) are formed in order from the N-support substrate 117A-3 side on a semiconductor substrate 117A-2*b* of the second substrate on the right side constituting the solid-state imaging device 117A. Then, a leakage current flows from the N−well 370Na-1 (−3 V) to the N−well 370Nb-1 (−1 V) via the N-support substrate 117A-3 to conduct.

Figure 20B:
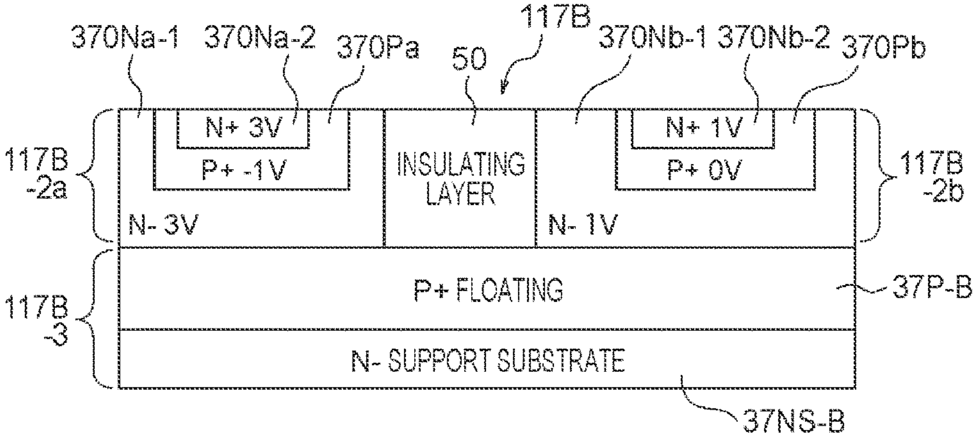

In FIG. 20B, a third substrate (support substrate) 117B-3 constituting a solid-state imaging device 117B has two P+wells 37P-B (floating) in contact with an N−well 370Na-1 (3 V) and an N−well 370Nb-1 (1 V), so that a leakage current can be prevented.

Figure 20C:
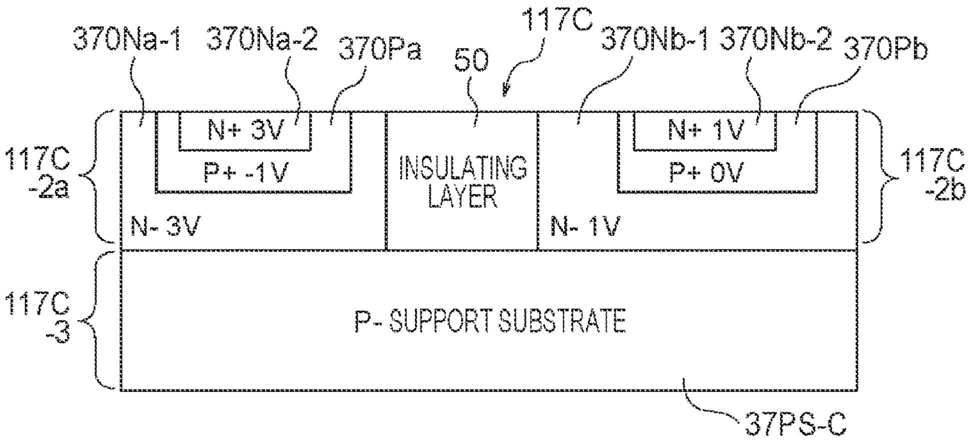

In FIG. 20C, since a third substrate (support substrate) 117C-3 constituting a solid-state imaging device 117C is of a P− type, a leakage current can be prevented.

Figure 21A:
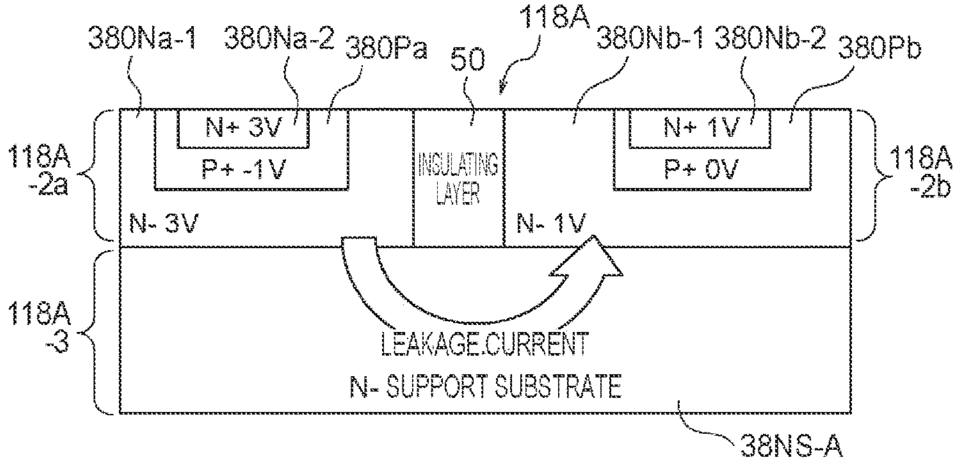
FIGS. 21A, 21B and 21C are diagrams explaining that the solid-state imaging device according to the first embodiment to which the present technology is applied can prevent leakage current.

An N−well 380Na-1 (−3 V) (The N−well 380Na-1 and an N-support substrate 118A-3 are in contact with each other.), a P+well 380Pa (−1 V), and an N+well 380Na-2 (+3 V) are formed in order from an N− support substrate 118A-3 side on a semiconductor substrate 118A-2*a* of a second substrate on the left side constituting a solid-state imaging device 118A illustrated in FIG. 21A, and an N−well 380Nb-1 (−1 V) (The N−well 380Nb-1 and the N-support substrate 118A-3 are in contact with each other.), a P+well 380Pb (0 V), and an N+well 380Nb-2 (+1 V) are formed in order from the N-support substrate 118A-3 side on a semiconductor substrate 118A-2*b* of the second substrate on the right side constituting the solid-state imaging device 118A. Then, a leakage current flows from the N−well 380Na-1 (−3 V) to the N−well 380Nb-1 (−1 V) via the N-support substrate 118A-3 to conduct.

Figure 21B:
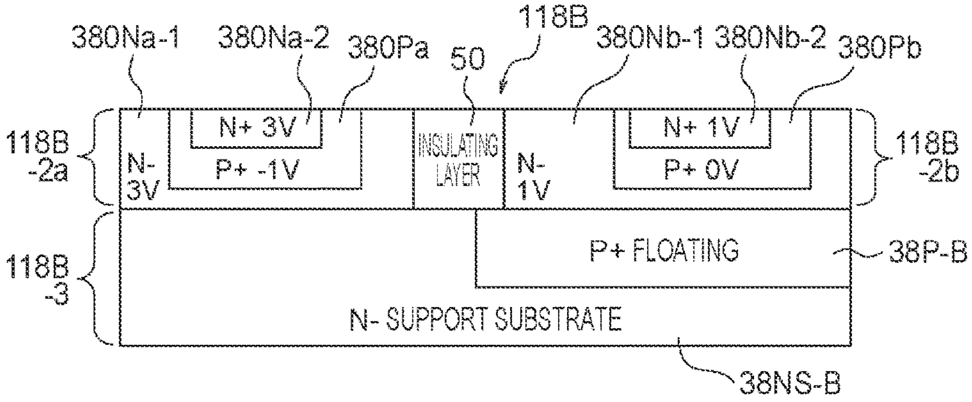

In FIG. 21B, a third substrate (support substrate) 118B-3 constituting a solid-state imaging device 118B has a P+well 38P-B (floating) in contact with an N−well 380Nb-1 (1 V), whereby a leakage current can be prevented.

Figure 21C:
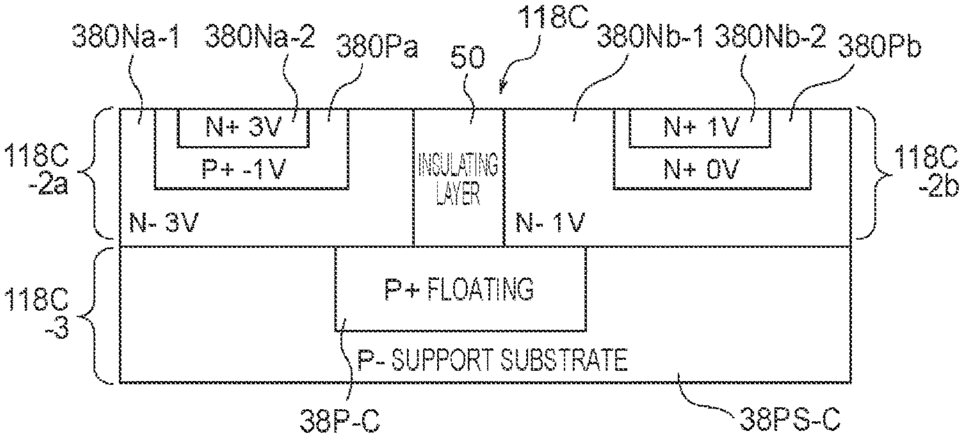

In FIG. 21C, a third substrate (support substrate) 118C-3 constituting a solid-state imaging device 118C has a P+well 38P-C (floating) in contact with a part of an N−well 380Na-1 (3 V) and a part of an N−well 380Nb-1 (1 V), whereby a leakage current can be prevented. Note that 38P-C (floating) of the third substrate (support substrate) 118C-3 constituting the solid-state imaging device 118C may be in contact with the entire (entire surface) of the N−well 380Na-1 (3 V) and the entire (entire surface) of the N−well 380Nb-1 (1 V) in order to prevent a leakage current.

Figure 22A:
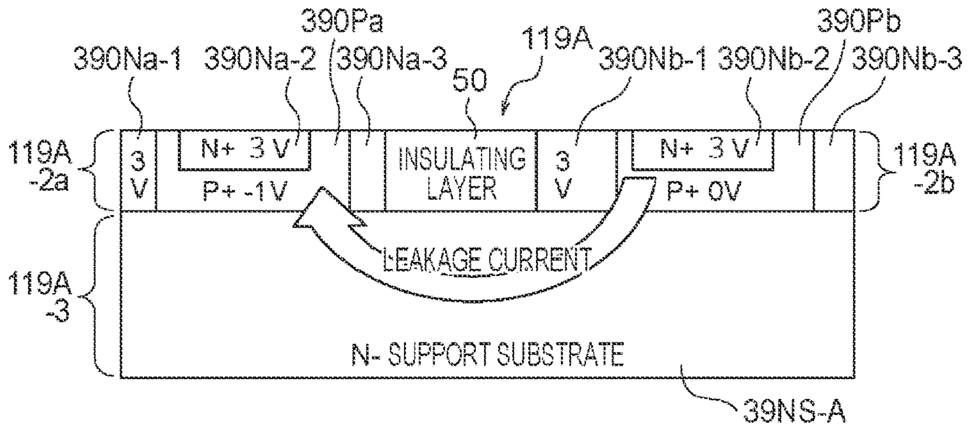
FIGS. 22A and 22B are diagrams explaining that the solid-state imaging device according to the first embodiment to which the present technology is applied can prevent leakage current.

A P+well 390Pa (−1 V) (The P+well 390Pa and an N-support substrate 119A-3 are in contact with each other.) and an N+well 390Na-2 (+3 V) are formed in order from an N-support substrate 119A-3 side on a semiconductor substrate 119A-2*a* of a second substrate on the left side constituting a solid-state imaging device 119A illustrated in FIG. 22A, an N−well 390Na-1 (3 V) is formed on the left side of the P+well 390Pa (−1 V) while being in contact with the N-support substrate 119A-3, and an N−well 390Na-3 (3 V) is formed on the right side of the P+well 390Pa (−1 V) while being in contact with the N-support substrate 119A-3.

A P+well 390Pb (0 V) (The P+well 390Pb and the N− support substrate 119A-3 are in contact with each other.) and an N+well 390Nb-2 (+3 V) are formed on a semiconductor substrate 119A-2*b* of the second substrate on the right side constituting solid-state imaging device 119A in order from the side of the N− support substrate 119A-3, an N−well 390Nb-1 (3 V) is formed on the left side of the P+well 390Pa (0 V) while being in contact with the N-support substrate 119A-3, and an N−well 390Nb-3 (3 V) is formed on the right side of the P+well 390Pa (0 V) while being in contact with the N-support substrate 119A-3. Then, a leakage current flows from the P+well 390Pb (0 V) to the P+well 390Pa (−1 V) via the N-support substrate 119A-3 to conduct.

The semiconductor substrate 119A-2*a* of the second substrate on the left side and the semiconductor substrate 119A-2*b* of the second substrate on the right side constituting the solid-state imaging device 119A are thin semiconductor substrates with respect to the semiconductor substrate 117A-2*a* of the second substrate on the left side and the semiconductor substrate 117A-2*b* of the second substrate on the right side constituting the solid-state imaging device 117A, and the semiconductor substrate 118A-2*a* of the second substrate on the left side and the semiconductor substrate 118A-2*b* of the second substrate on the right side constituting the solid-state imaging device 118A.

Figure 22B:
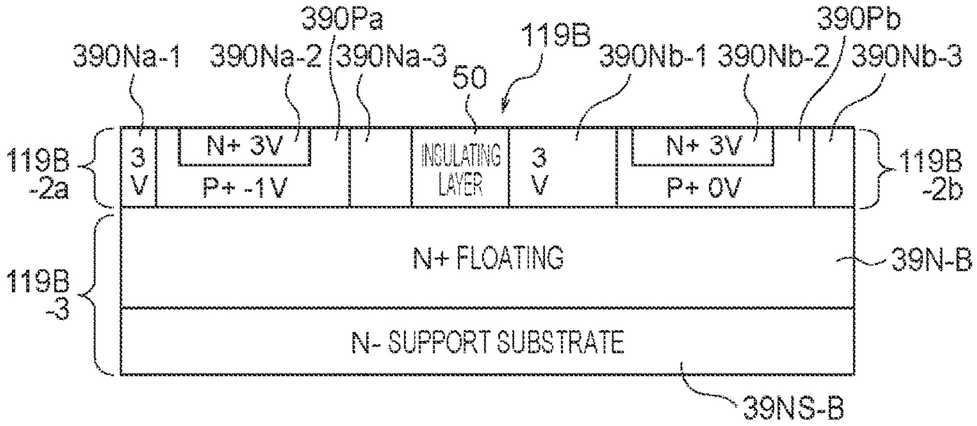

In FIG. 22B, a third substrate (support substrate) 119B-3 constituting a solid-state imaging device 119B has an N+well 39N-B (floating) in contact with a P+well 390Pb (0 V) and a P+well 390Pa (−1 V), so that a leakage current can be prevented.

Figure 23A:
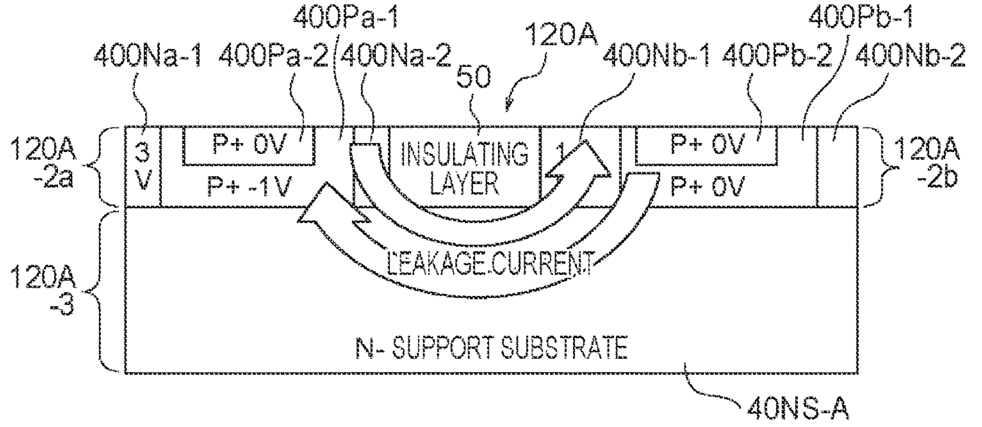
FIGS. 23A, 23B and 23C are diagrams explaining that the solid-state imaging device according to the first embodiment to which the present technology is applied can prevent leakage current.

A P+well 400Pa-1 (−1 V) (The P+well 400Pa-1 and an N-support substrate 120A-3 are in contact with each other.) and a P+well 400Pa-2 (0 V) are formed in order from an N-support substrate 120A-3 side on a semiconductor substrate 120A-2*a* of a second substrate on the left side constituting a solid-state imaging device 120A illustrated in FIG. 23A, an N−well 400Na-1 (3 V) is formed on the left side of the P+well 400Pa-1 (−1 V) while being in contact with the N-support substrate 120A-3, and an N−well 400Na-2 (3 V) is formed on the right side of the P+well 400Pa-1 (−1 V) while being in contact with the N-support substrate 120A-3.

A P+well 400Pb-1 (0 V) (The P+well 400Pb-1 and the N-support substrate 120A-3 are in contact with each other.) and a P+well 400Pb-2 (0 V) are formed on a semiconductor substrate 120A-2*b* of the second substrate on the right side constituting the solid-state imaging device 120A in order from the side of the N-support substrate 120A-3, an N−well 400Nb-1 (1 V) is formed on the left side of the P+well 400Pa-1 (0 V) while being in contact with N-support substrate 120A-3, and an N−well 400Nb-2 (1 V) is formed on the right side of the P+well 400Pb-1 (0 V) while being in contact with N-support substrate 120A-3. Then, a leakage current flows from the P+well 400Pb-1 (0 V) to the P+well 400Pa-1 (−1 V) via the N-support substrate 120A-3, and as a reverse flow, a leakage current flows from the N−well 400Na-2 (3 V) to the N−well 400Nb-1 (1 V) via the N-support substrate 120A-3 to conduct.

The semiconductor substrate 120A-2*a* of the second substrate on the left side and the semiconductor substrate 120A-2*b* of the second substrate on the right side constituting the solid-state imaging device 120A are thin semiconductor substrates with respect to the semiconductor substrate 117A-2*a* of the second substrate on the left side and the semiconductor substrate 117A-2*b* of the second substrate on the right side constituting the solid-state imaging device 117A, and the semiconductor substrate 118A-2*a* of the second substrate on the left side and the semiconductor substrate 118A-2*b* of the second substrate on the right side constituting the solid-state imaging device 118A.

Figure 23B:
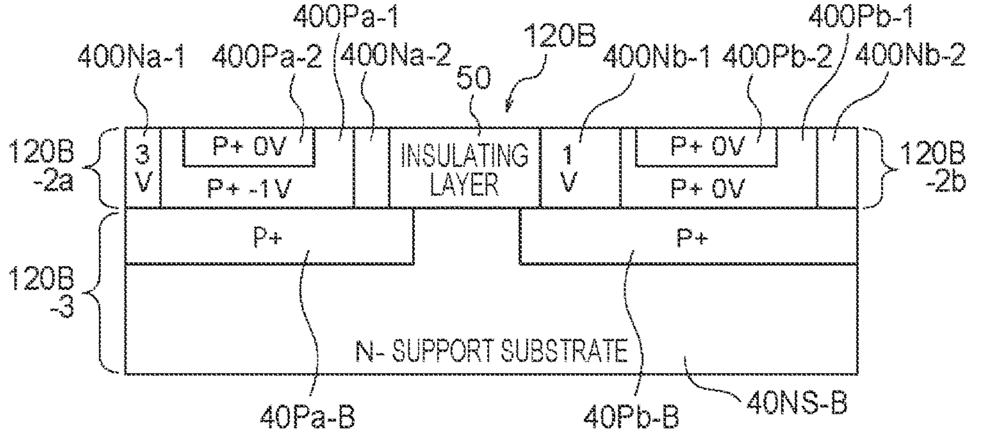

In FIG. 23B, a third substrate (support substrate) 120B-3 constituting a solid-state imaging device 120B includes a P+well 400Pb-1 (0 V) and a P+well 400Pa-1 (−1 V), and two P+wells 40Pa-B and 40Pb-B in contact with an N−well 400Na-2 (3 V) and an N−well 400Nb-1 (1 V), whereby a leakage current can be prevented.

Figure 23C:
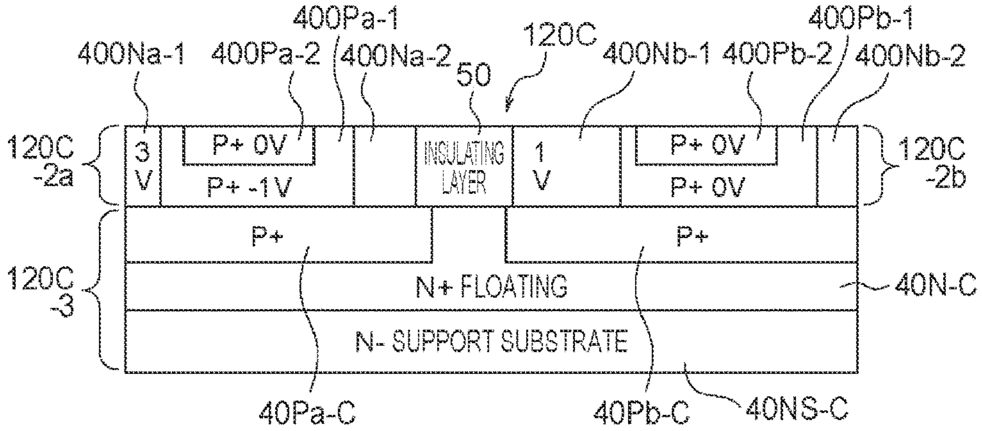

In FIG. 23C, a third substrate (support substrate) 120C-3 constituting a solid-state imaging device 120C includes a P+well 400Pb-1 (0 V) and a P+well 400Pa-1 (−1 V), two P+wells 40Pa-B and 40Pb-B in contact with an N−well 400Na-2 (3 V) and an N−well 400Nb-1 (1 V), and an N+well 40N-C (floating) in contact with the two P+wells 40Pa-B and 40Pb-B, whereby a leak current can be prevented.

Finally, an example of a manufacturing method for the solid-state imaging device according to the first embodiment according to the present technology will be described with reference to FIGS. 27 and 28.

Figures 27A, 27B, 27C, 27D, 27E, 27F:
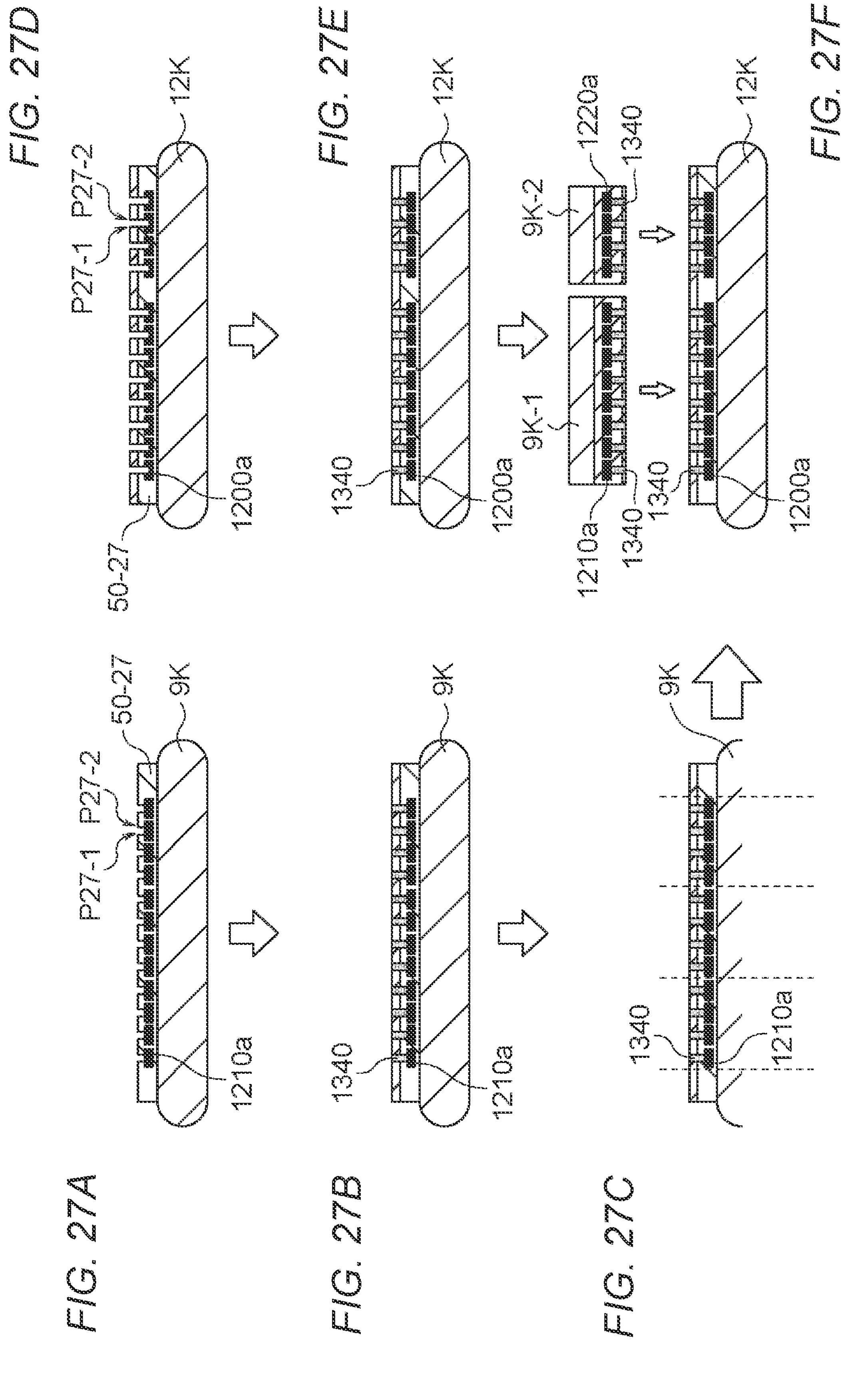
FIGS. 27A, 27B, 27C, 27D, 27E and 27F are diagrams explaining an example of a manufacturing method for the solid-state imaging device according to the first embodiment to which the present technology is applied.

As illustrated in FIGS. 27A and B, an electrode 1210*a* constituting CuCu bonding is formed on a semiconductor substrate 9K included in a second substrate (a circuit substrate such as a logic circuit substrate), KGB measurement is performed, implantation is performed after a needle, and planarization is performed to form a wiring 1340, so that a CuCu bonding surface is completed. Then, as illustrated in FIG. 27C, singulation is performed.

As illustrated in FIGS. 27D and E, an electrode 1200*a* constituting the CuCu bonding is formed on a semiconductor substrate 12K included in a first substrate (sensor substrate), KGB measurement is performed, the electrode is embedded after the needle, and flattened to form the wiring 1340, and the CuCu bonding surface is completed. Then, as illustrated in FIG. 27F, the semiconductor substrate 12K included in the first substrate (sensor substrate) and the two semiconductor substrates 9K included in the two second substrates (circuit substrates such as logic circuit substrates) are subjected to the CU—Cu bonding (direct bonding) by CoW.

Figures 28A, 28B, 28C, 28D, 28E, 28F:
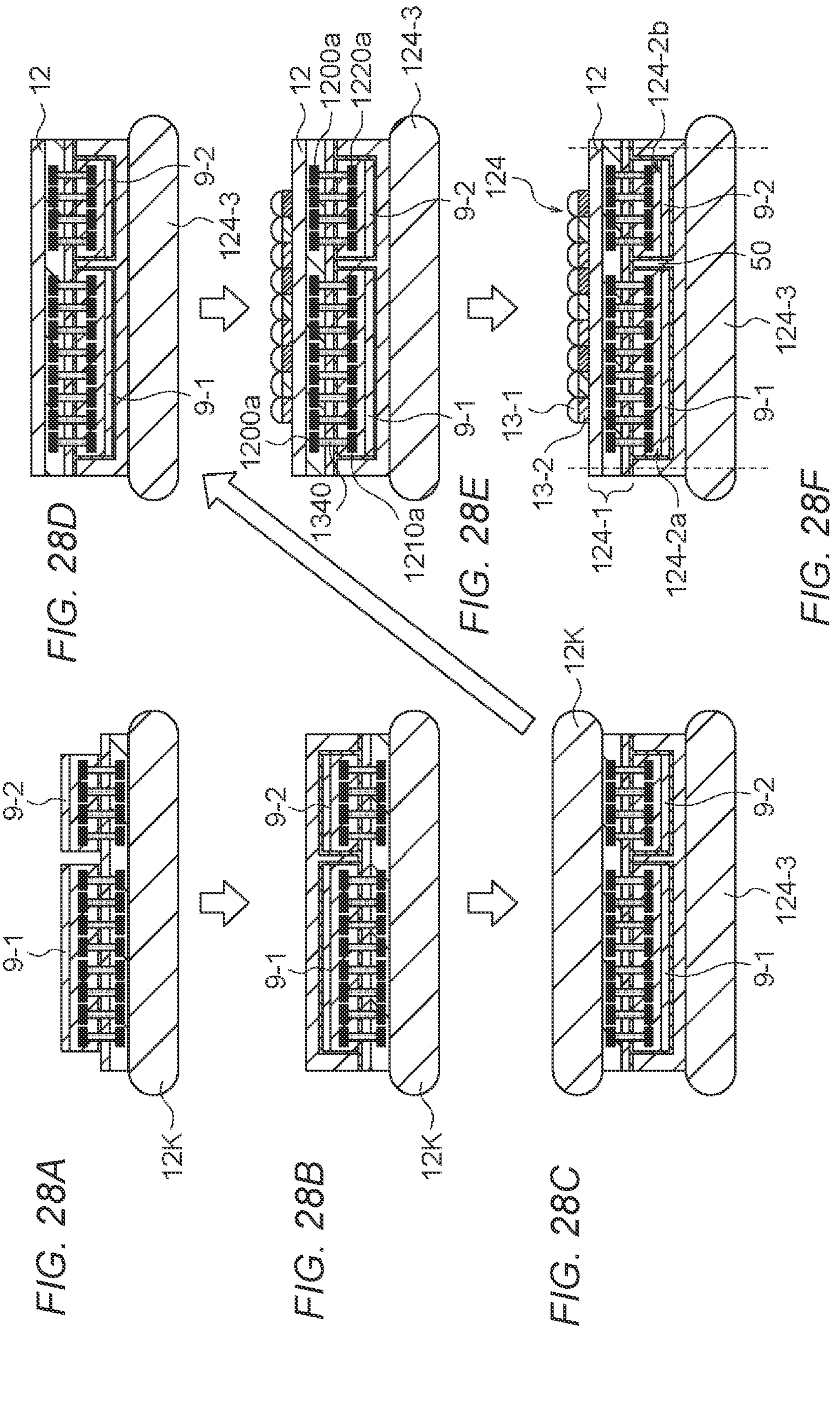
FIGS. 28A, 28B, 28C, 28D, 28E and 28F are diagrams explaining an example of a manufacturing method for the solid-state imaging device according to the first embodiment to which the present technology is applied.

A third substrate (support substrate) 124-3 on which a well is formed is bonded in FIG. 28C by thinning, step embedding, and planarization in FIGS. 28A and B. In FIGS. 28D to F, the semiconductor substrate 12K is thinned, an on-chip lens 1301 and a color filter 13-2 are formed, and singulated to manufacture a solid-state imaging device 124. In the solid-state imaging device 124, an insulating layer 50 is disposed between the third substrate (support substrate) 124-3 and the two second substrates (circuit substrates such as logic circuit substrates) 124-2*a* and 124-2*b* as illustrated in FIG. 28F, but a film (A thin film may be used.) such as a nitride film may be disposed instead of the insulating layer 50. As illustrated in FIG. 28F, the insulating layer 50 may not be disposed between the third substrate (support substrate) 124-3 and the two second substrates (circuit substrates such as logic circuit substrates) 124-2*a* and 124-2*b*, and the third substrate (support substrate) 124-3 and the two second substrates (circuit substrates such as logic circuit substrates) 124-2*a* and 124-2*b* may be in contact with each other.

As described above, the contents described for the solid-state imaging device of the first embodiment (first example of the solid-state imaging device) according to the present technology can be applied to the solid-state imaging devices of the second to sixth embodiments according to the present technology to be described later and the method of manufacturing the solid-state imaging device of the seventh embodiment according to the present technology to be described later, unless there is no particular technical contradiction.

3. Second Embodiment (Second Example of Solid-State Imaging Device)

Figure 24:
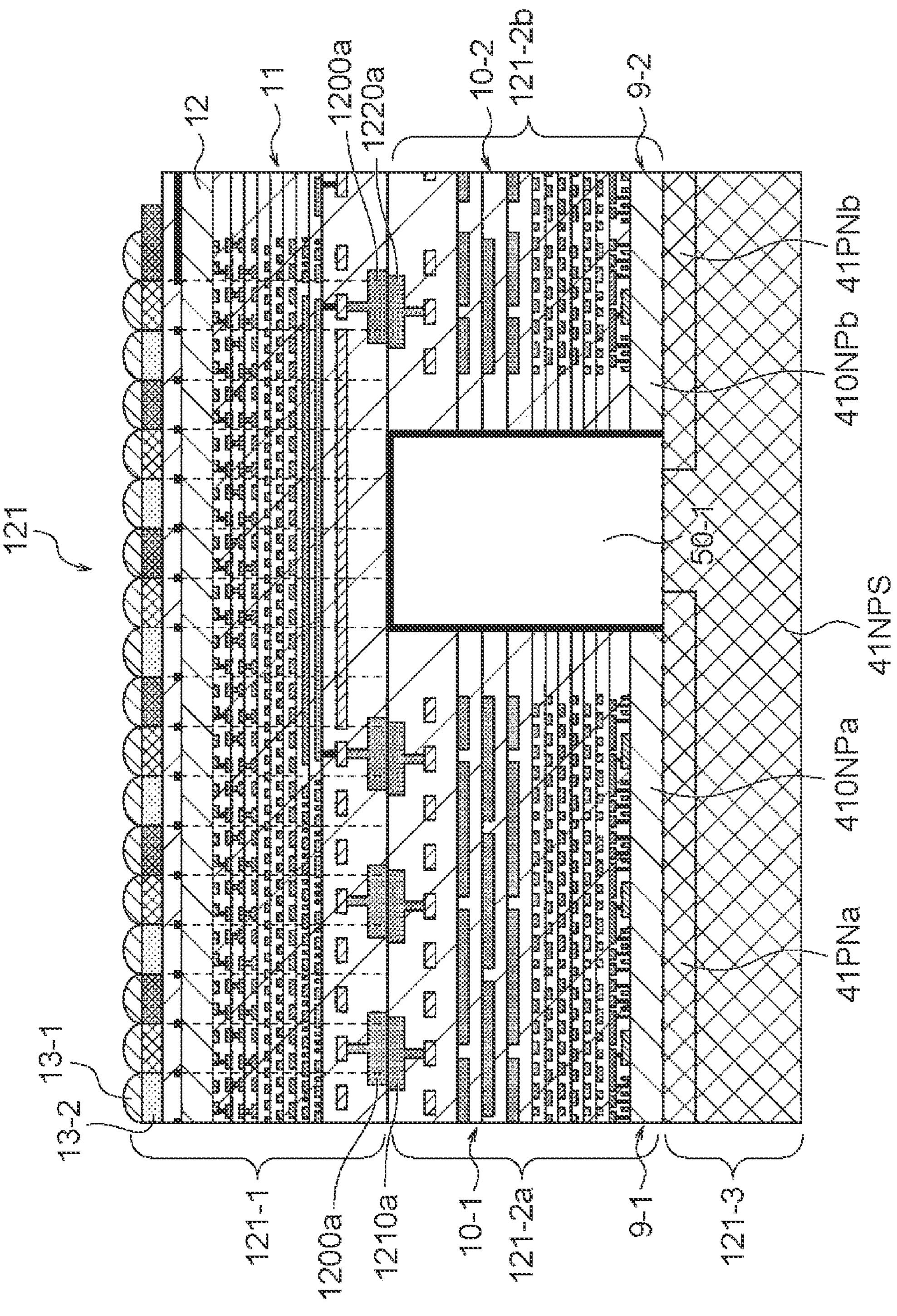
FIG. 24 is a cross-sectional view illustrating a configuration example of a solid-state imaging device according to a second embodiment to which the present technology is applied.

A solid-state imaging device according to a second embodiment (second example of a solid-state imaging device) of the present technology will be described with reference to FIG. 24. FIG. 24 is a cross-sectional view illustrating a configuration example of the solid-state imaging device according to the second embodiment of the present technology.

A solid-state imaging device 121 illustrated in FIG. 24 includes a first substrate 121-1, second substrates 121-2*a* and 121-2*b* that are laminated on the first substrate 121-1 by direct bonding on an opposite side (the lower side in FIG. 24) with respect to a light incident side (the upper side in FIG. 24) of the first substrate 121-1 and have a size different from a size of the first substrate 121-1, a third substrate 121-3 provided on the opposite side (the lower side in FIG. 24) with respect to the light incident side (the upper side in FIG. 24) of the second substrates 121-2*a* and 121-2*b*, and a cavity 50-1 (The cavities 50-1 may be an air layer or an air gap.) formed between the first substrate 121-1 and the third substrate 121-3. In the solid-state imaging device 121, the third substrate 121-3 is in contact with the second substrates 121-2*a* and 121-2*b*, and is in contact with the cavity 50-1.

The first substrate 121-1 is a sensor substrate on which photodiodes, a plurality of transistors, and the like constituting pixels are formed. The second substrate 121-2*a* is, for example, any one of an analog circuit board on which an analog circuit is formed, a logic circuit board on which a logic circuit is formed, and a memory circuit board on which a memory circuit is formed, and the second substrate 121-2*b* is also, for example, any one of an analog circuit board on which an analog circuit is formed, a logic circuit board on which a logic circuit is formed, and a memory circuit board on which a memory circuit is formed. The third substrate 121-3 is a support substrate.

For the configurations of wells 41PNa and 41PNb constituting the third substrate 121-3, and 410NPa constituting the second substrate 121-2*a* and 410 NPb constituting the second substrate 121-2*b*, the contents described in the section of the solid-state imaging device of the first embodiment (first example of the solid-state imaging device) according to the present technology can be applied as they are from the viewpoint of preventing a leakage current.

As described above, the contents described for the solid-state imaging device of the second embodiment (second example of the solid-state imaging device) according to the present technology can be applied to the above-described solid-state imaging device of the first embodiment according to the present technology, the solid-state imaging devices of the third to sixth embodiments according to the present technology to be described later, and the method of manufacturing the solid-state imaging device of the seventh embodiment according to the present technology to be described later, unless there is no particular technical contradiction.

4. Third Embodiment (Third Example of Solid-State Imaging Device)

Figure 25:
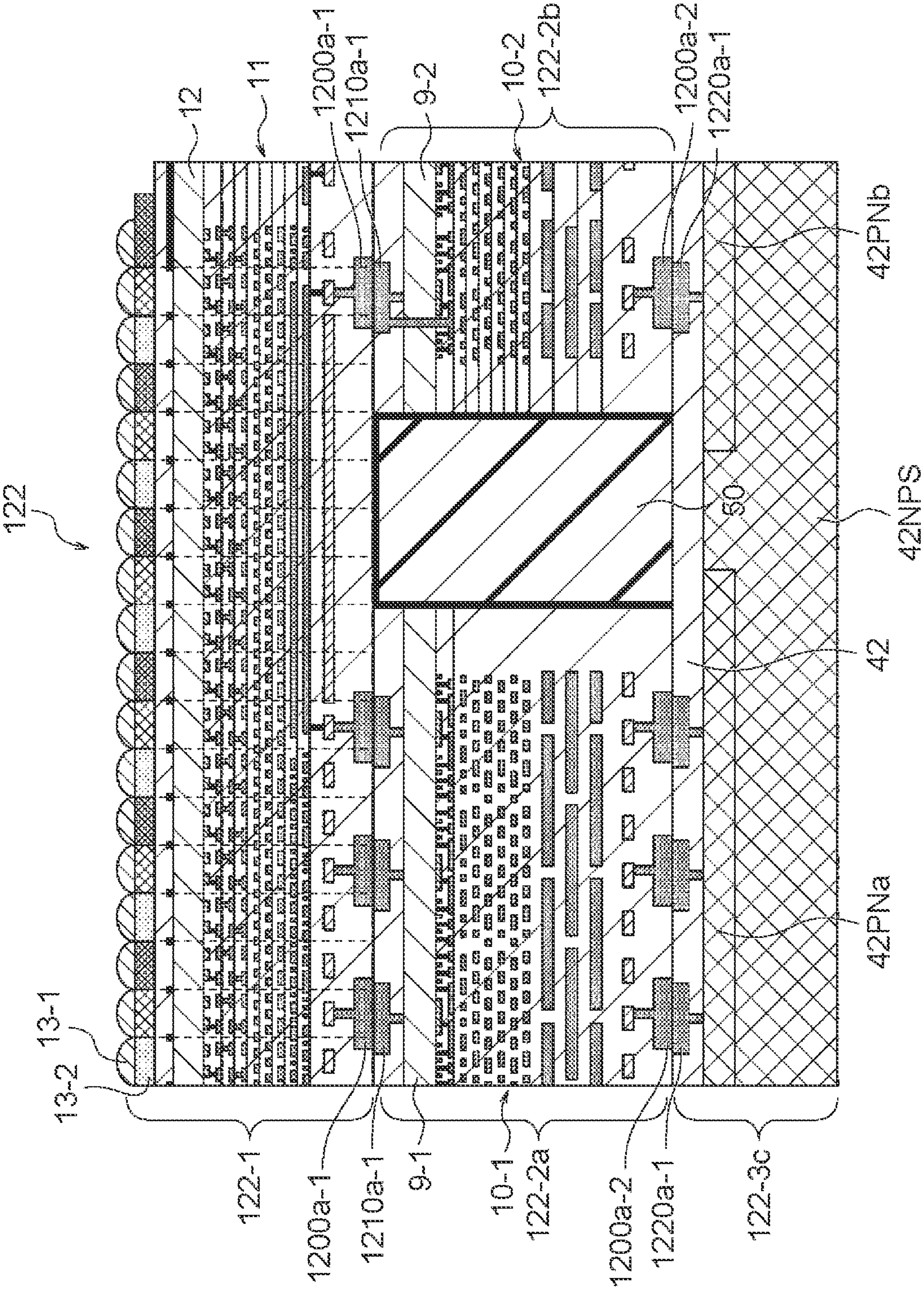
FIG. 25 is a cross-sectional view illustrating a configuration example of a solid-state imaging device according to a third embodiment to which the present technology is applied.

A solid-state imaging device according to a third embodiment (third example of a solid-state imaging device) of the present technology will be described with reference to FIG. 25. FIG. 25 is a cross-sectional view illustrating a configuration example of the solid-state imaging device according to the third embodiment of the present technology.

A solid-state imaging device 122 illustrated in FIG. 25 includes a first substrate 122-1, second substrates 122-2*a* and 122-2*b* that are laminated on the first substrate 122-1 by direct bonding on an opposite side (the lower side in FIG. 25) with respect to a light incident side (the upper side in FIG. 25) of the first substrate 122-1 and have a size different from a size of the first substrate 122-1, a third substrate 122-3 provided on the opposite side (the lower side in FIG. 25) with respect to the light incident side (the upper side in FIG. 25) of the second substrates 122-2*a* and 122-2*b*, and an insulating layer 50 formed between the first substrate 122-1 and the third substrate 122-3. In the solid-state imaging device 122, the third substrate 122-3 is in contact with the second substrates 122-2*a* and 122-2*b*, and is in contact with the insulating layer 50.

The first substrate 122-1 is a sensor substrate on which photodiodes, a plurality of transistors, and the like constituting pixels are formed. The second substrate 122-2*a* is, for example, any one of an analog circuit board on which an analog circuit is formed, a logic circuit board on which a logic circuit is formed, and a memory circuit board on which a memory circuit is formed, and the second substrate **122-2*b* is also, for example, any one of an analog circuit board on which an analog circuit is formed, a logic circuit board on which a logic circuit is formed, and a memory circuit board on which a memory circuit is formed. The third substrate 122-3** is a support substrate.

In the solid-state imaging device of the third embodiment (third example of the solid-state imaging device) according to the present technology, the second substrates **122-2*a* and 122-2*b* are opposite in direction, and wiring layers 10-1 and 10-2 are formed on a support substrate 122-3*c* side. A well of the support substrate 122-3C and the second substrates 122-2*a* and 122-2*b* are bonded (for example, CuCu bonded) by wiring metals (electrodes) 1200*a*-2 and 1220*a*-1 instead of a semiconductor substrate 9-1**.

For the configurations of wells 42PNa and 42PNb constituting the third substrate **122-3*c***, the contents described in the section of the solid-state imaging device of the first embodiment (first example of the solid-state imaging device) according to the present technology can be applied as they are from the viewpoint of preventing leakage current.

As described above, the contents described for the solid-state imaging device of the third embodiment (third example of the solid-state imaging device) according to the present technology can be applied to the solid-state imaging devices of the first to second embodiments according to the present technology described above, the solid-state imaging devices of the fourth to sixth embodiments according to the present technology described later, and the method of manufacturing the solid-state imaging device of the seventh embodiment according to the present technology described later, unless there is no particular technical contradiction.

5. Fourth Embodiment (Fourth Example of Solid-State Imaging Device)

Figure 26:
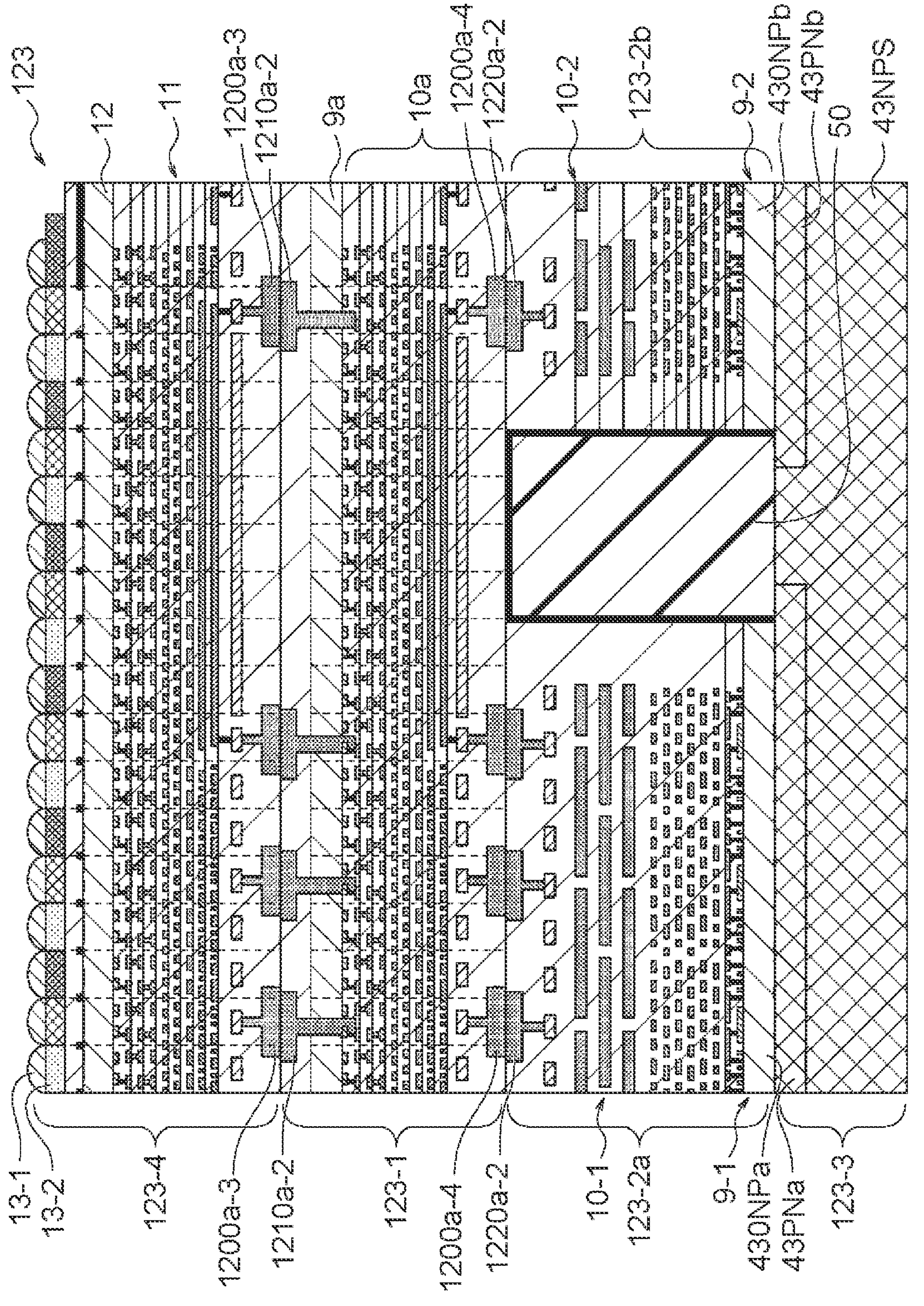
FIG. 26 is a cross-sectional view illustrating a configuration example of a solid-state imaging device according to a fourth embodiment to which the present technology is applied.

A solid-state imaging device according to a fourth embodiment (fourth example of a solid-state imaging device) of the present technology will be described with reference to FIG. 26. FIG. 26 is a cross-sectional view illustrating a configuration example of the solid-state imaging device according to the fourth embodiment of the present technology.

A solid-state imaging device 123 (four-layer configuration) illustrated in FIG. 26 includes a first substrate 123-1, second substrates **123-2*a* and 123-2*b* that are laminated on the first substrate 123-1 by direct bonding on an opposite side (the lower side in FIG. 25) with respect to a light incident side (the upper side in FIG. 26) of the first substrate 123-1 and have a size different from a size of the first substrate 123-1, a third substrate 123-3 provided on the opposite side (the lower side in FIG. 26) with respect to the light incident side (the upper side in FIG. 26) of the second substrates 123-2*a* and 123-2*b*, and an insulating layer 50 formed between the first substrate 123-1 and the third substrate 123-3. In the solid-state imaging device 123, the third substrate 123-3 is in contact with the second substrates 123-2*a* and 123-2*b*, and is in contact with the insulating layer 50. A fourth substrate 123-4 is formed on first substrate 123-1**.

The fourth substrate 123-4 is a sensor substrate on which photodiodes, a plurality of transistors, and the like constituting pixels are formed. The first substrate 123-1 is, for example, any one circuit board of an analog circuit board on which an analog circuit is formed, a logic circuit board on which a logic circuit is formed, and a memory circuit board on which a memory circuit is formed. The second substrate **123-2*a* is, for example, any one of an analog circuit board on which an analog circuit is formed, a logic circuit board on which a logic circuit is formed, and a memory circuit board on which a memory circuit is formed, and the second substrate 123-2*b* is also, for example, any one of an analog circuit board on which an analog circuit is formed, a logic circuit board on which a logic circuit is formed, and a memory circuit board on which a memory circuit is formed. The third substrate 122-3** is a support substrate.

For the configurations of wells 43PNa and 43PNb constituting the third substrate 123-3, and 430NPa constituting the second substrate **123-2*a* and 430NPb constituting the second substrate 123-2*b***, the contents described in the section of the solid-state imaging device of the first embodiment (first example of the solid-state imaging device) according to the present technology can be applied as they are from the viewpoint of preventing a leakage current.

As described above, the contents described for the solid-state imaging device of the fourth embodiment (fourth example of the solid-state imaging device) according to the present technology can be applied to the solid-state imaging devices of the first to third embodiments according to the present technology described above, the solid-state imaging devices of the fifth to sixth embodiments according to the present technology described later, and the method of manufacturing the solid-state imaging device of the seventh embodiment according to the present technology described later, unless there is no particular technical contradiction.

6. Fifth Embodiment (Fifth Example of Solid-State Imaging Device)

Figure 31:
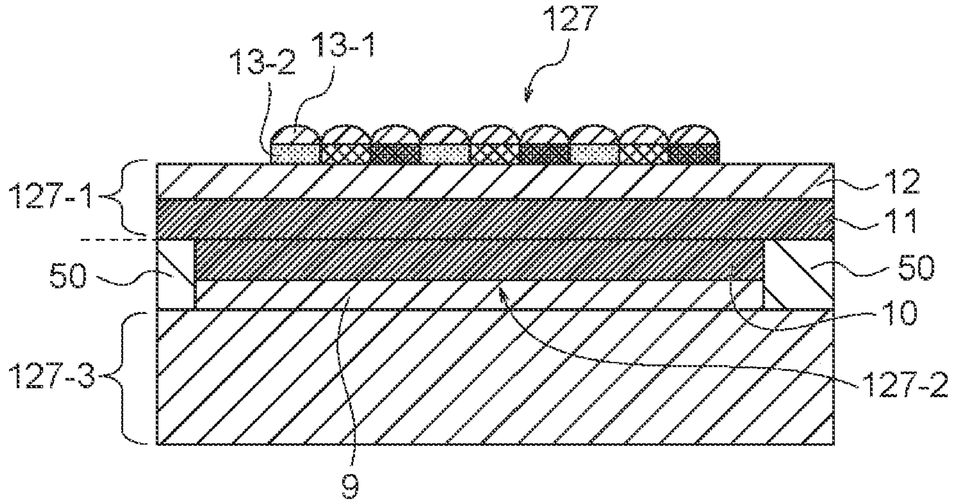
FIG. 31 is a cross-sectional view illustrating a configuration example of a solid-state imaging device according to a fifth embodiment to which the present technology is applied.

A solid-state imaging device according to a fifth embodiment (fifth example of a solid-state imaging device) of the present technology will be described with reference to FIG. 31. FIG. 31 is a cross-sectional view illustrating a configuration example of the solid-state imaging device according to the fifth embodiment of the present technology.

A solid-state imaging device 127 illustrated in FIG. 31 includes a first substrate 127-1, a second substrate 127-2 laminated on the first substrate 127-1 by direct bonding on an opposite side (lower side in FIG. 31) to a light incident side (upper side in FIG. 31) of the first substrate 127-1 and having a size different from a size of the first substrate 127-1, a third substrate 127-3 provided on the opposite side (lower side in FIG. 31) to the light incident side (upper side in FIG. 31) of the second substrate 127-2, and two insulating layers 50 (It can also be said that the insulating layer 50 is formed on each of the left and right side surfaces of the second substrate 127-2.) formed between the first substrate 127-1 and the third substrate 127-3. In the solid-state imaging device 127, the third substrate 127-3 is in contact with the second substrate 127-2 and is in contact with the two insulating layers 50.

The first substrate 127-1 is a sensor substrate on which photodiodes, a plurality of transistors, and the like constituting pixels are formed. The second substrate 127-2 is, for example, any one circuit board of an analog circuit board on which an analog circuit is formed, a logic circuit board on which a logic circuit is formed, and a memory circuit board on which a memory circuit is formed. The third substrate 127-3 is a support substrate.

As described above, the contents described for the solid-state imaging device of the fifth embodiment (fifth example of the solid-state imaging device) according to the present technology can be applied to the solid-state imaging devices of the first to fourth embodiments according to the present technology described above, the solid-state imaging device of the sixth embodiment according to the present technology described later, and the method of manufacturing the solid-state imaging device of the seventh embodiment according to the present technology described later, unless there is no particular technical contradiction.

7. Sixth Embodiment (Sixth Example of Solid-State Imaging Device)

A solid-state imaging device according to a sixth embodiment (sixth example of a solid-state imaging device) of the present technology will be described with reference to FIGS. 32 to 38. Each of FIGS. 32 to 38 is a cross-sectional view illustrating a configuration example of the solid-state imaging device according to the sixth embodiment of the present technology.

Figure 32:
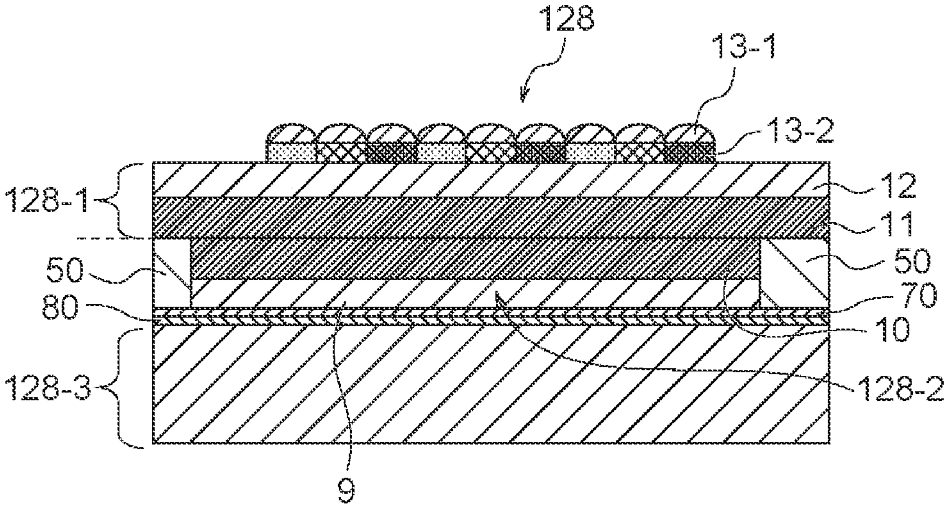
FIG. 32 is a cross-sectional view illustrating a configuration example of a solid-state imaging device according to a sixth embodiment to which the present technology is applied.

A solid-state imaging device 128 illustrated in FIG. 32 includes a first substrate 128-1, a second substrate 128-2 that is laminated on the first substrate 128-1 by direct bonding on an opposite side (the lower side in FIG. 32) to a light incident side (the upper side in FIG. 32) of the first substrate 128-1 and has a size different from a size of the first substrate 128-1, a third substrate 128-3 provided on the opposite side (the lower side in FIG. 32) to the light incident side (the upper side in FIG. 32) of the second substrate 128-2, two insulating layers 50 (It can also be said that the insulating layer 50 is formed on each of the left and right side surfaces of the second substrate 128-2.) formed between the first substrate 128-1 and the third substrate 128-3, and two films 70 and 80 formed between the first substrate 128-1 and the third substrate 128-3 and including a material different from the material constituting the insulating layer 50. In the solid-state imaging device 128, the insulating layer 50, the film 70, and the film 80 are formed in order from the light incident side (upper side in FIG. 32). The film 70 is in contact with the second substrate 128-2 and the insulating layer 50, the film 80 is in contact with the third substrate 128-3, and the film 70 and the film 80 are laminated.

The first substrate 128-1 is a sensor substrate on which photodiodes, a plurality of transistors, and the like constituting pixels are formed. The second substrate 128-2 is, for example, any one circuit board of an analog circuit board on which an analog circuit is formed, a logic circuit board on which a logic circuit is formed, and a memory circuit board on which a memory circuit is formed. The third substrate 128-3 is a support substrate.

The film 70 may include at least one of a heat dissipation member or a member having a film stress larger than a film stress of Si (silicon). Similarly, the film 80 may include at least one of a heat dissipation member or a member having a film stress larger than the film stress of Si, but in particular, may include a member having a linear expansion coefficient larger than a linear expansion coefficient of Si (silicon) for the purpose of relaxing the stress when the support substrate 128-3 is bonded at a high temperature and cooled to normal temperature. The heat dissipation member may contain at least one selected from the group consisting of SiC, AlN, SiN, Cu, Al, and C, and the member having a film stress larger than the film stress of Si may contain at least one selected from the group consisting of $SiO_2$, SiN, Cu, Al, and C.

The insulating layer 50 can include an inorganic oxide film.

Figure 33:
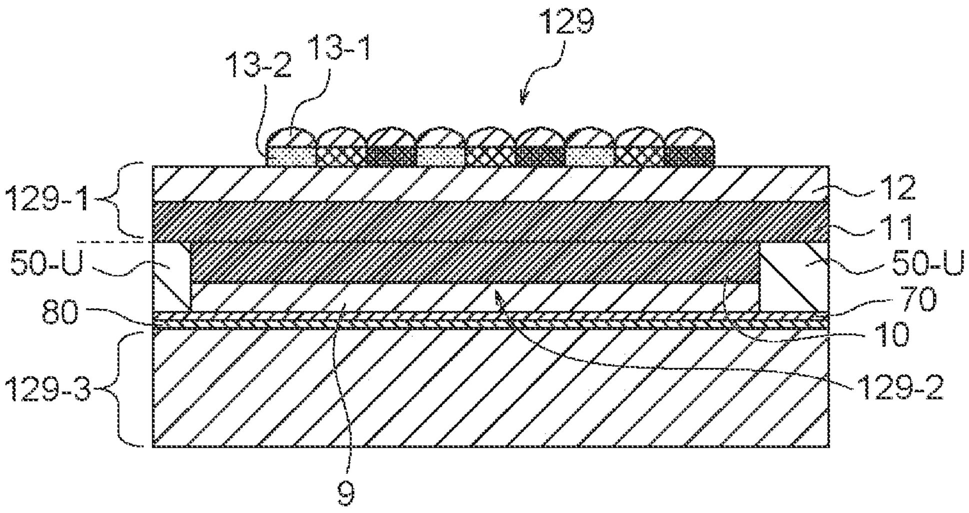
FIG. 33 is a cross-sectional view illustrating a configuration example of the solid-state imaging device according to the sixth embodiment to which the present technology is applied.

A solid-state imaging device 129 illustrated in FIG. 33 includes a first substrate 129-1, a second substrate 129-2 that is laminated on the first substrate 129-1 by direct bonding on an opposite side (the lower side in FIG. 33) to a light incident side (the upper side in FIG. 33) of the first substrate 129-1 and has a size different from a size of the first substrate 129-1, a third substrate 129-3 provided on the opposite side (the lower side in FIG. 33) to the light incident side (the upper side in FIG. 33) of the second substrate 129-2, two insulating layers 50-U (It can also be said that the insulating layer 50-U is formed on each of the left and right side surfaces of the second substrate 129-2.) formed between the first substrate 129-1 and the third substrate 129-3, and two films 70 and 80 formed between the first substrate 129-1 and the third substrate 129-3 and including a material different from the material constituting the insulating layer 50-U. In the solid-state imaging device 129, the insulating layer 50-U, the film 70, and the film 80 are formed in order from the light incident side (upper side in FIG. 33). The film 70 is in contact with the second substrate 129-2 and the insulating layer 50-U, the film 80 is in contact with the third substrate 129-3, and the film 70 and the film 80 are laminated.

The first substrate 129-1 is a sensor substrate on which photodiodes, a plurality of transistors, and the like constituting pixels are formed. The second substrate 127-2 is, for example, any one circuit board of an analog circuit board on which an analog circuit is formed, a logic circuit board on which a logic circuit is formed, and a memory circuit board on which a memory circuit is formed. The third substrate 129-3 is a support substrate.

The film 70 may include at least one of a heat dissipation member or a member having a film stress larger than a film stress of Si (silicon). Similarly, the film 80 may include at least one of a heat dissipation member or a member having a film stress larger than the film stress of Si, but in particular, may include a member having a linear expansion coefficient larger than the linear expansion coefficient of Si (silicon) for the purpose of relaxing the stress when the support substrate 129-3 is bonded at a high temperature and cooled to normal temperature. The heat dissipation member may contain at least one selected from the group consisting of SiC, AlN, SiN, Cu, Al, and C, and the member having a film stress larger than the film stress of Si may contain at least one selected from the group consisting of $SiO_2$, SiN, Cu, Al, and C.

The insulating layer 50-U can include an organic film. Since the organic film is softer and has higher thermal conductivity than an inorganic oxide film, stress relaxation and further improvement of thermal conductivity can be realized.

Figure 34B:
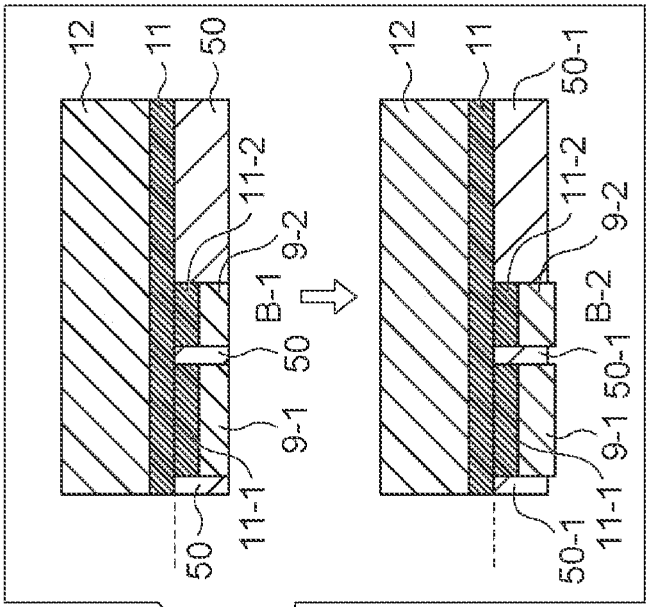
FIGS. 34A and 34B are cross-sectional views illustrating a configuration example of the solid-state imaging device according to the sixth embodiment to which the present technology is applied.
Figure 34A:
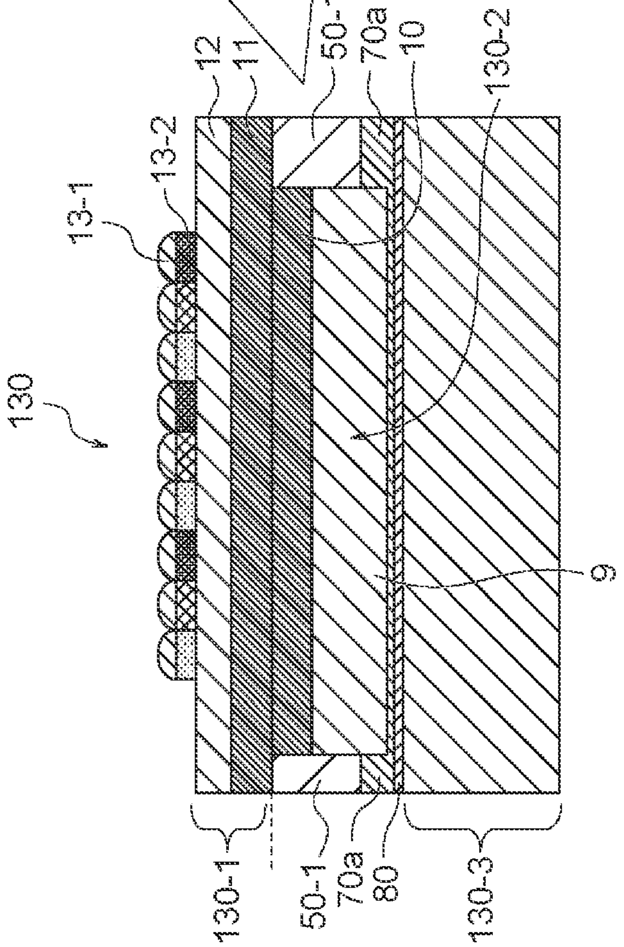

A solid-state imaging device 130 illustrated in FIG. 34A includes a first substrate 130-1, a second substrate 130-2 that is laminated on the first substrate 130-1 by direct bonding on an opposite side (the lower side in FIG. 34A) to a light incident side (the upper side in FIG. 34A) of the first substrate 130-1 and has a size different from a size of the first substrate 130-1, a third substrate 130-3 provided on the opposite side (the lower side in FIG. 34) to the light incident side (the upper side in FIG. 34A) of the second substrate 130-2, two insulating layers 50-1 (It can also be said that the insulating layer 50-1 is formed on each of the left and right side surfaces of the second substrate 130-2.) formed between the first substrate 130-1 and the third substrate 130-3, and two films 70 and 80 formed between the first substrate 130-1 and the third substrate 130-3 and including a material different from the material constituting the insulating layers 50-1. In the solid-state imaging device 130, the insulating layer 50-1, the film 70, and the film 80 are formed in order from the light incident side (upper side in FIG. 34A). The film 70 is in contact with the second substrate 130-2 and the insulating layer 50-1, the film 80 is in contact with the third substrate 130-3, and the film 70 and the film 80 are laminated.

In the solid-state imaging device 130, a surface of the second substrate 130-2 in contact with the film 70 is not flush with a surface of the insulating layer 50-1 in contact with the film 70 (an upper protrusion 70*a* constituting the film 70), and the surface of the insulating layer 50-1 in contact with the film 70 (the upper protrusion 70*a* constituting the film 70) is located closer to the first substrate 130-1 (upper side in FIG. 34A) than the surface of the second substrate 130-2 in contact with the film 70.

As illustrated in FIG. 34B (FIG. 34B-1), a surface of the semiconductor substrates 9-1 and 9-2 in contact with the film 70 (surface of semiconductor substrates 9-1 and 9-2 opposite to a surface on the light incident side (wiring layers 11-1 and 11-2 side)) and a surface of the insulating layer 50 in contact with the film 70 (a surface opposite to a surface of the insulating layer 50 on the light incident side (wiring layer 11 side)) are flush with each other.

On the other hand, as illustrated in FIG. 34B (FIG. 34B-2), the surface (surface of semiconductor substrates 9-1 and 9-2 opposite to a surface on light incident side (wiring layers 11-1 and 11-2 side)) of the semiconductor substrates 9-1 and 9-2 in contact with the film 70 is not flush with the surface of the insulating layer 50-1 in contact with the film 70 (the surface opposite to the surface of the insulating layer 50-1 on the light incident side (the wiring layer 11 side)), and the surface of the insulating layer 50-1 in contact with the film 70 (the surface opposite to the surface of the insulating layer 50-1 on the light incident side (the wiring layer 11 side)) is located on a semiconductor substrate 12 (the wiring layer 11) side (the upper side of FIG. 34B-2). When a back side (the lower side of FIG. 34B-2, opposite to the light incident side.) of the second substrate 130-2 is cleaned after embedding the insulating layer 50-1, the insulating layer 50-1 may be scraped, so that the above structure is obtained.

The first substrate 130-1 is a sensor substrate on which photodiodes, a plurality of transistors, and the like constituting pixels are formed. The second substrate 127-2 is, for example, any one circuit board of an analog circuit board on which an analog circuit is formed, a logic circuit board on which a logic circuit is formed, and a memory circuit board on which a memory circuit is formed. The third substrate 130-3 is a support substrate.

The film 70 may include at least one of a heat dissipation member or a member having a film stress larger than a film stress of Si (silicon). Similarly, the film 80 may include at least one of a heat dissipation member or a member having a film stress larger than the film stress of Si, but in particular, may include a member having a linear expansion coefficient larger than the linear expansion coefficient of Si (silicon) for the purpose of relaxing the stress when the support substrate 130-3 is bonded at a high temperature and cooled to normal temperature. The heat dissipation member may contain at least one selected from the group consisting of SiC, AlN, SiN, Cu, Al, and C, and the member having a film stress larger than the film stress of Si may contain at least one selected from the group consisting of $SiO_2$, SiN, Cu, Al, and C.

The insulating layer 50-1 can include an inorganic oxide film.

Figure 35:
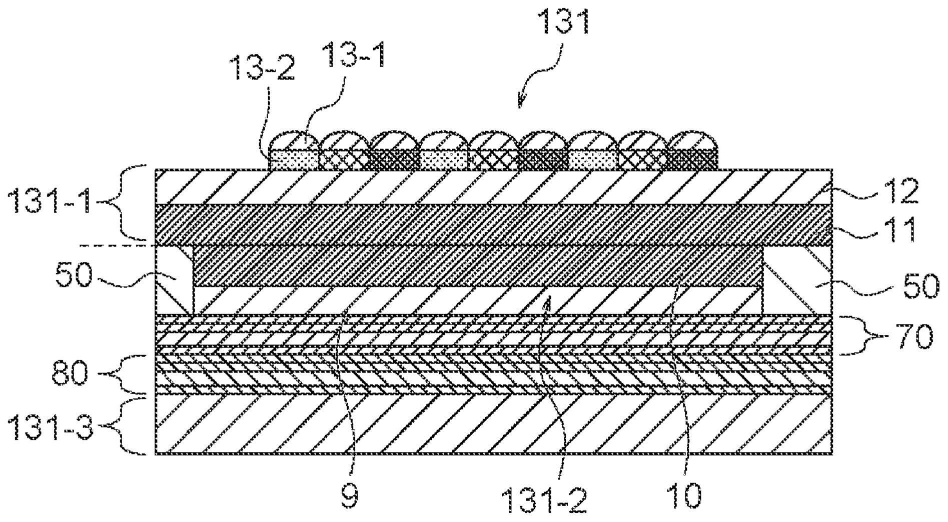
FIG. 35 is a cross-sectional view illustrating a configuration example of the solid-state imaging device according to the sixth embodiment to which the present technology is applied.

A solid-state imaging device 131 illustrated in FIG. 35 includes a first substrate 131-1, a second substrate 131-2 that is laminated on the first substrate 131-1 by direct bonding on an opposite side (the lower side in FIG. 35) to a light incident side (the upper side in FIG. 35) of the first substrate 131-1 and has a size different from a size of the first substrate 131-1, a third substrate 131-3 provided on the opposite side (the lower side in FIG. 35) to the light incident side (the upper side in FIG. 35) of the second substrate 131-2, two insulating layers 50 (It can also be said that the insulating layer 50 is formed on each of the left and right side surfaces of the second substrate 131-2.) formed between the first substrate 131-1 and the third substrate 131-3, and two films 70 and 80 formed between the first substrate 131-1 and the third substrate 131-3 and including a material different from the material constituting the insulating layers 50. In the solid-state imaging device 131, the insulating layer 50, the film 70, and the film 80 are formed in order from the light incident side (upper side in FIG. 35). The film 70 is in contact with the second substrate 131-2 and the insulating layer 50, the film 80 is in contact with the third substrate 131-3, and the film 70 and the film 80 are laminated.

The first substrate 131-1 is a sensor substrate on which photodiodes, a plurality of transistors, and the like constituting pixels are formed. The second substrate 131-2 is, for example, any one of an analog circuit board on which an analog circuit is formed, a logic circuit board on which a logic circuit is formed, and a memory circuit board on which a memory circuit is formed. The third substrate 131-3 is a support substrate.

As illustrated in FIG. 35, the film 70 includes four films (four layers), and the film 80 includes four films (four layers). Note that the film 70 may include a plurality of films (a plurality of layers) other than the four films (four layers), and the film 80 may include a plurality of films (a plurality of layers) other than the four films (four layers).

Each of the four films (each of the four layers) of the film 70 may include at least one of a heat dissipation member or a member having a film stress larger than the film stress of Si (silicon). Each of the four films (each of the four layers) of the film 80 may similarly include at least one of a heat dissipation member or a member having a film stress larger than the film stress of Si. Moreover, each of the four films (each of the four layers) of the film 80 may include a member having a linear expansion coefficient larger than the linear expansion coefficient of silicon (Si) for the purpose of relieving stress when the support substrate 131-3 is bonded at a high temperature and cooled to normal temperature. The heat dissipation member may contain at least one selected from the group consisting of SiC, AlN, SiN, Cu, Al, and C, and the member having a film stress larger than the film stress of Si may contain at least one selected from the group consisting of $SiO_2$, SiN, Cu, Al, and C.

The insulating layer 50 can include an inorganic oxide film.

Figure 36:
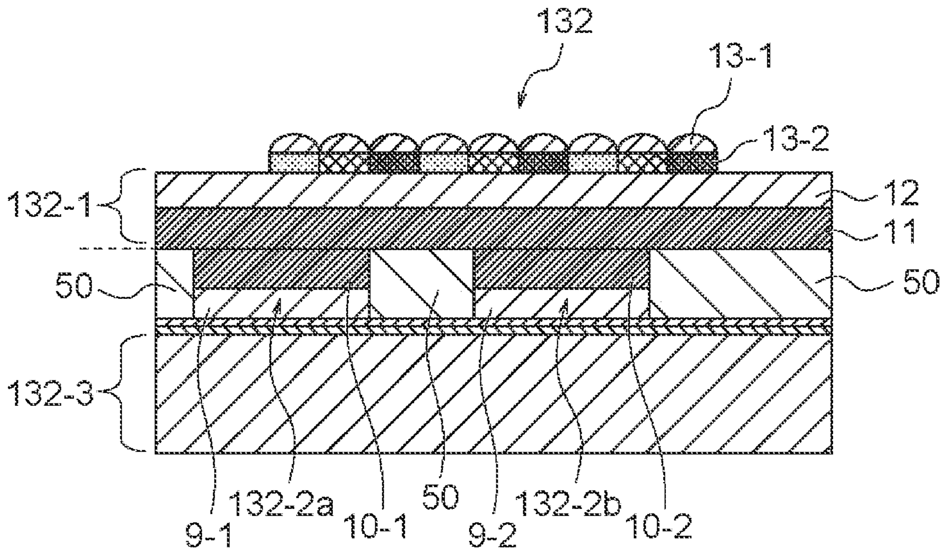
FIG. 36 is a cross-sectional view illustrating a configuration example of the solid-state imaging device according to the sixth embodiment to which the present technology is applied.

A solid-state imaging device 132 illustrated in FIG. 36 includes: a first substrate 132-1; two second substrates 132-2*a* and 132-2*b* that are laminated on the first substrate 132-1 by direct bonding on an opposite side (lower side in FIG. 36) to a light incident side (upper side in FIG. 36) of the first substrate 132-1, have a size different from a size of the first substrate 132-1, and are disposed on the same layer; a third substrate 132-3 provided on the opposite side (lower side in FIG. 36) to the light incident side (upper side in FIG. 36) of the second substrates 132-2*a* and 132-2*b*; three insulating layers 50 (It can also be said that the insulating layer 50 is formed on each of the left side surface side of the second substrate 132-2*a*, the right side surface side of the second substrate 132-2*a* (the left side surface side of the second substrate 132-2*b*), and the right side surface side of the second substrate 132-2*b*.) formed between the first substrate 132-1 and the third substrate 132-3; and a first substrate 132-1 and a third substrate 132-3, two films 70 and 80 including a material different from the material constituting the insulating layers 50. In the solid-state imaging device 132, the insulating layer 50, the film 70, and the film 80 are formed in order from the light incident side (upper side in FIG. 36). The film 70 is in contact with the second substrate 132-2 and the insulating layer 50, the film 80 is in contact with the third substrate 132-3, and the film 70 and the film 80 are laminated. Note that the second substrate 132-2 has been described as two second substrates in FIG. 36, but the second substrate 132-2 may include three or more second substrates.

The first substrate 132-1 is a sensor substrate on which photodiodes, a plurality of transistors, and the like constituting pixels are formed. Each of the second substrates 132-2*a* and 132-2*b* is, for example, any one circuit board of an analog circuit board on which an analog circuit is formed, a logic circuit board on which a logic circuit is formed, and a memory circuit board on which a memory circuit is formed. The third substrate 132-3 is a support substrate.

The film 70 may include at least one of a heat dissipation member or a member having a film stress larger than a film stress of Si (silicon). Similarly, the film 80 may include at least one of a heat dissipation member or a member having a film stress larger than the film stress of Si, but in particular, may include a member having a linear expansion coefficient larger than the linear expansion coefficient of Si (silicon) for the purpose of relaxing the stress when the support substrate 132-3 is bonded at a high temperature and cooled to normal temperature. The heat dissipation member may contain at least one selected from the group consisting of SiC, AlN, SiN, Cu, Al, and C, and the member having a film stress larger than the film stress of Si may contain at least one selected from the group consisting of $SiO_2$, SiN, Cu, Al, and C.

The insulating layer 50 can include an inorganic oxide film.

Figure 37:
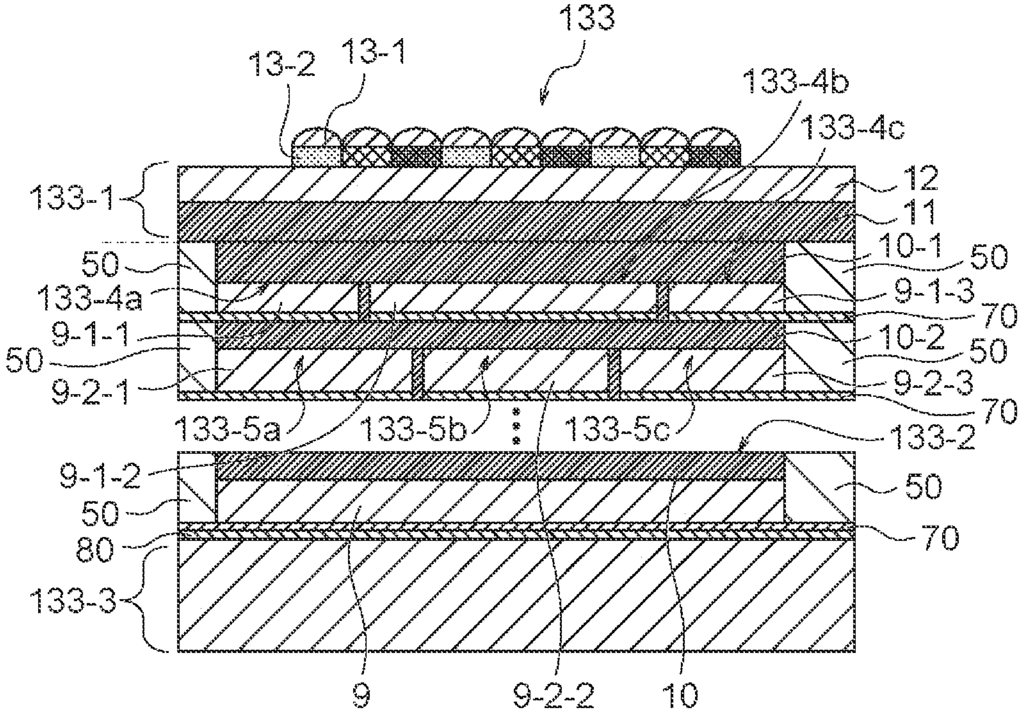
FIG. 37 is a cross-sectional view illustrating a configuration example of the solid-state imaging device according to the sixth embodiment to which the present technology is applied.

A solid-state imaging device 133 illustrated in FIG. 37 includes a first substrate 133-1, n second substrates (second substrates 133-2, 133-4*a* to 4*c*, 133-5*a* to 5*c*) laminated on the first substrate 133-1 by direct bonding on an opposite side (lower side in FIG. 37) to a light incident side (upper side in FIG. 37) of the first substrate 133-1, formed by laminating and formed in the same layer having a size different from a size of the first substrate 133-1, a third substrate 133-3 provided on the opposite side (lower side in FIG. 32) to the light incident side (an upper side in FIG. 37) of the second substrate 133-2, two insulating layers 50 (It can also be said that the insulating layer 50 is formed on each of the left and right side surfaces of the second substrate 133-2.) formed between the first substrate 133-1 and the third substrate 133-3, and a plurality of films 70 and 80 formed between the first substrate 133-1 and the third substrate 133-3, and including a material different from the material constituting the insulating layers 50. In the solid-state imaging device 133, the insulating layer 50 and the film 70 are alternately formed in order from the light incident side (upper side in FIG. 37), and the film 70 and the film 80 are finally formed. The film 70 is in contact with the second substrate 133-2 and the insulating layer 50, the film 80 is in contact with the third substrate 133-3, and the film 70 and the film 80 are laminated.

The first substrate 133-1 is a sensor substrate on which photodiodes, a plurality of transistors, and the like constituting pixels are formed. The second substrate 133-2 and the like are, for example, any one circuit board of an analog circuit board on which an analog circuit is formed, a logic circuit board on which a logic circuit is formed, and a memory circuit board on which a memory circuit is formed. The third substrate 133-3 is a support substrate.

The film 70 may include at least one of a heat dissipation member or a member having a film stress larger than a film stress of Si (silicon). Similarly, the film 80 may include at least one of a heat dissipation member or a member having a film stress larger than the film stress of Si, but in particular, may include a member having a linear expansion coefficient larger than the linear expansion coefficient of Si (silicon) for the purpose of relaxing the stress when the support substrate 133-3 is bonded at a high temperature and cooled to normal temperature. The heat dissipation member may contain at least one selected from the group consisting of SiC, AlN, SiN, Cu, Al, and C, and the member having a film stress larger than the film stress of Si may contain at least one selected from the group consisting of $SiO_2$, SiN, Cu, Al, and C.

The insulating layer 50 can include an inorganic oxide film.

Figure 38:
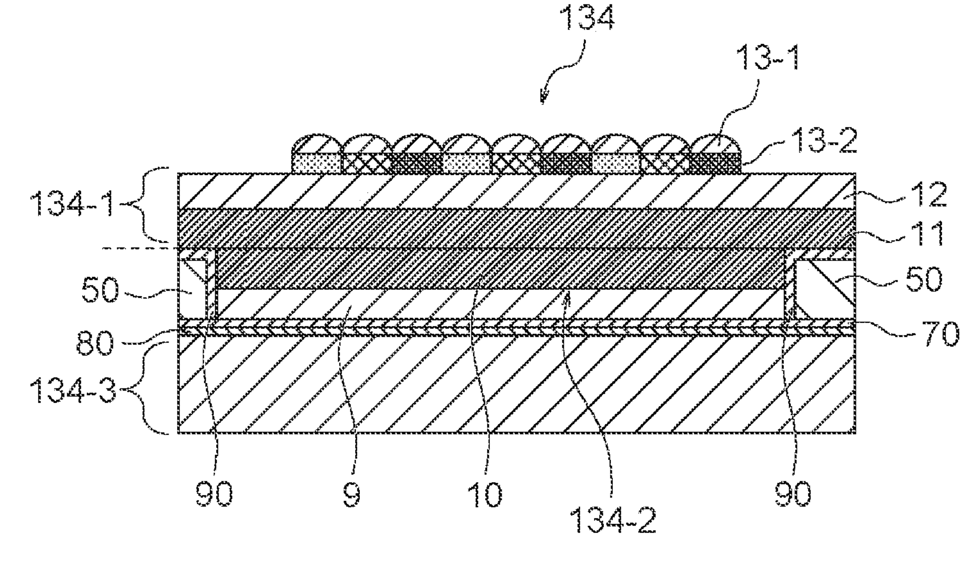
FIG. 38 is a cross-sectional view illustrating a configuration example of the solid-state imaging device according to the sixth embodiment to which the present technology is applied.

A solid-state imaging device 134 illustrated in FIG. 38 includes: a first substrate 134-1; two second substrates 134-2*a* and 134-2*b* that are laminated on the first substrate 134-1 by direct bonding on an opposite side (lower side in FIG. 38) to a light incident side (upper side in FIG. 38) of the first substrate 134-1, have a size different from a size of the first substrate 134-1, and are disposed on the same layer; a third substrate 134-3 provided on the opposite side (lower side in FIG. 38) to the light incident side (upper side in FIG. 38) of the second substrates 134-2*a* and 134-2*b*; three insulating layers 50 (It can also be said that the insulating layer 50 is formed on each of the left side surface side of the second substrate 134-2*a*, the right side surface side of the second substrate 134-2*a* (the left side surface side of the second substrate 134-2*b*), and the right side surface side of the second substrate 134-2*b*.) formed between the first substrate 134-1 and the third substrate 134-3; and two films 70 and 80 formed between the first substrate 134-1 and the third substrate 134-3 and including a material different from the material constituting the insulating layers 50. In the solid-state imaging device 134, the insulating layer 50, the film 70, and the film 80 are formed in order from the light incident side (upper side in FIG. 38). The film 70 is in contact with the second substrate 134-2 and the insulating layer 50, the film 80 is in contact with the third substrate 134-3, and the film 70 and the film 80 are laminated. Note that the second substrate 134-2 has been described as two second substrates in FIG. 38, but the second substrate 134-2 may include three or more second substrates.

The first substrate 134-1 is a sensor substrate on which photodiodes, a plurality of transistors, and the like constituting pixels are formed. Each of the second substrates 134-2*a* and 134-2*b* is, for example, any one circuit board of an analog circuit board on which an analog circuit is formed, a logic circuit board on which a logic circuit is formed, and a memory circuit board on which a memory circuit is formed. The third substrate 134-3 is a support substrate.

The film 70 may include at least one of a heat dissipation member or a member having a film stress larger than a film stress of Si (silicon). Similarly, the film 80 may include at least one of a heat dissipation member or a member having a film stress larger than the film stress of Si, but in particular, may include a member having a linear expansion coefficient larger than the linear expansion coefficient of Si (silicon) for the purpose of relaxing the stress when the support substrate 134-3 is bonded at a high temperature and cooled to normal temperature. The heat dissipation member may contain at least one selected from the group consisting of SiC, AlN, SiN, Cu, Al, and C, and the member having a film stress larger than the film stress of Si may contain at least one selected from the group consisting of $SiO_2$, SiN, Cu, Al, and C.

Then, the solid-state imaging device 134 further includes a metal diffusion prevention film 90, the metal diffusion prevention film 90 is formed so as to cover a surface of the insulating layer 50 not in contact with the film 70, and the metal diffusion prevention film 90 is disposed between the second substrate 134-2 and the insulating layer 50 and between the first substrate 134-1 and the insulating layer 50. By disposing the metal diffusion prevention film 90, metal diffusion in wiring layers 11 and 10 can be prevented.

As described above, the contents described for the solid-state imaging device of the sixth embodiment (sixth example of the solid-state imaging device) according to the present technology can be applied to the solid-state imaging devices of the first to fifth embodiments according to the present technology described above and the method of manufacturing the solid-state imaging device of the seventh embodiment according to the present technology described later, unless there is no particular technical contradiction.

8. Seventh Embodiment (First Example of Method of Manufacturing Solid-State Imaging Device)

A method of manufacturing a solid-state imaging device according to a seventh embodiment (first example of a method of manufacturing a solid-state imaging device) of the present technology will be described with reference to FIGS. 39A-39E. FIGS. 39A, 39B, 39C, 39D and 39E are diagrams explaining the method of manufacturing the solid-state imaging device according to the seventh embodiment of the present technology.

Figure 39A:
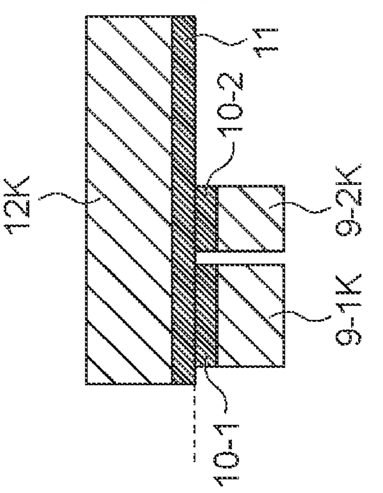
FIGS. 39A, 39B, 39C, 39D and 39E are diagrams explaining a method of manufacturing a solid-state imaging device according to a seventh embodiment to which the present technology is applied.
Figure 39B:
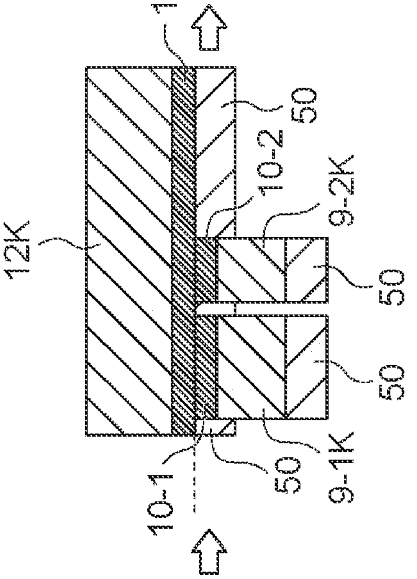
Figure 39C:
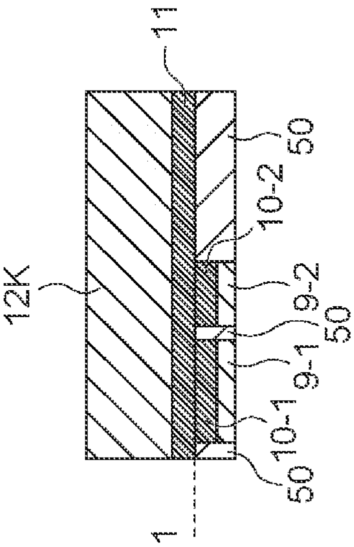
Figure 39D:
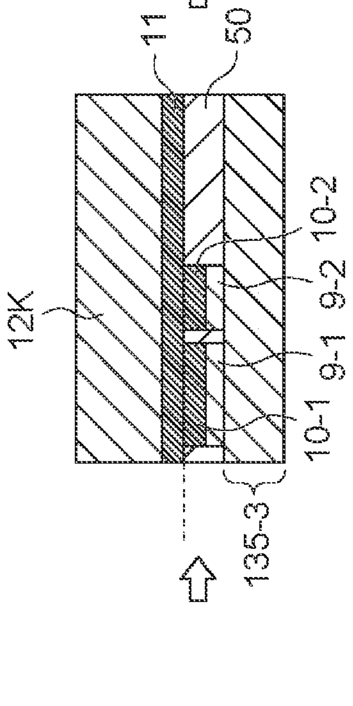
Figure 39E:
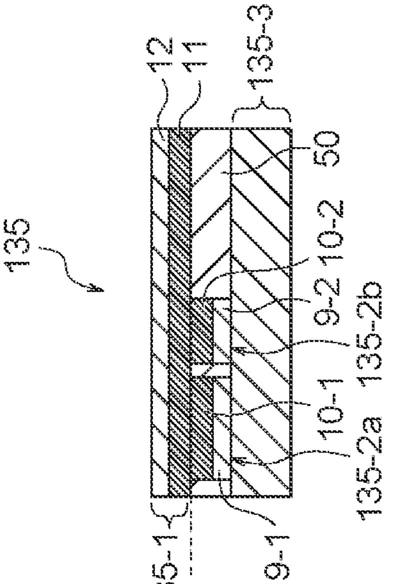

As illustrated in FIG. 39A, by bonding (for example, direct bonding CuCu bonding), as illustrated in FIG. 39B, by embedding and depositing an insulating layer 50, as illustrated in FIG. 39C, by thinning and flattening semiconductor substrates 9-1 and 9-2, as illustrated in FIG. 39D, by bonding a support substrate 135-2, and finally, as illustrated in FIG. 39F, by customization, a solid-state imaging device 135 can be manufactured.

In the manufacturing method illustrated in FIGS. 39A-39E, in the process flow, the substrate (chip) is thinned and embedded after bonding, but here, the substrate (chip) is embedded with an embedded film before being thinned, and Si and the embedded film are simultaneously ground and planarized. As a result, a structure in which the back surface (lower side in FIG. 39) of the substrate (chip) is not embedded can be easily manufactured, and at the same time, the insulating layer 50 (embedded film) functions as a protective film, and an effect of suppressing peeling of the substrate (chip) at the time of thinning and planarizing the substrate (chip, semiconductor substrate) and suppressing remaining of ground Si chips as contamination can also be expected.

As described above, the contents described for the method of manufacturing the solid-state imaging device according to the seventh embodiment (first example of method of manufacturing the solid-state imaging device) of the present technology can be applied to the solid-state imaging devices according to the first to sixth embodiments of the present technology described above unless there is a particular technical contradiction.

9. Eighth Embodiment (Example of Electronic Device)

An electronic device according to an eighth embodiment of the present technology is an electronic device in which the solid-state imaging device according to the first aspect of the present technology is mounted as a first aspect, and the solid-state imaging device according to the first aspect of the present technology is a solid-state imaging device including: a first substrate; a second substrate laminated on the first substrate by direct bonding on a side opposite to a light incident side of the first substrate, the second substrate having a size different from a size of the first substrate; a third substrate provided on a side opposite to the light incident side of the second substrate; and an insulating layer formed between the first substrate and the third substrate, in which the third substrate is in contact with the second substrate, and the third substrate is in contact with the insulating layer.

Furthermore, an electronic device according to an eighth embodiment of the present technology is an electronic device in which the solid-state imaging device according to the second aspect of the present technology is mounted as a second aspect, the solid-state imaging device according to the second aspect of the present technology includes: a first substrate; a second substrate laminated on the first substrate by direct bonding on a side opposite to a light incident side of the first substrate, the second substrate having a size different from a size of the first substrate; a third substrate provided on a side opposite to the light incident side of the second substrate; an insulating layer formed between the first substrate and the third substrate; and at least one film formed between the first substrate and the third substrate and including a material different from a material constituting the insulating layer, in order from the light incident side, the insulating layer; and, at least one film, in which the at least one film is in contact with the second substrate, the at least one film is in contact with the insulating layer, and the at least one film is in contact with the third substrate.

Furthermore, an electronic device according to an eighth embodiment of the present technology is an electronic device on which the solid-state imaging device according to the third aspect of the present technology is mounted as a third aspect, and the solid-state imaging device according to the third aspect of the present technology is a solid-state imaging device including: a first substrate; a second substrate laminated on the first substrate by direct bonding on a side opposite to a light incident side of the first substrate, the second substrate having a size different from a size of the first substrate; a third substrate provided on a side opposite to the light incident side of the second substrate; and a cavity formed between the first substrate and the third substrate, in which the third substrate is in contact with the second substrate, and the third substrate is in contact with the cavity.

Furthermore, an electronic device according to an eighth embodiment of the present technology is an electronic device on which the solid-state imaging device according to the fourth aspect of the present technology is mounted as a fourth aspect, and the solid-state imaging device according to the fourth aspect of the present technology includes: a first substrate; a second substrate that is laminated on the first substrate by direct bonding on a side opposite to a light incident side of the first substrate, and has a size different from a size of the first substrate; a third substrate provided on a side opposite to the light incident side of the second substrate; a cavity formed between the first substrate and the third substrate; and at least one film formed between the first substrate and the third substrate, in which the cavity and the at least one film are formed in order from the light incident side, and the at least one film is in contact with the second substrate, in which at least one film is in contact with the cavity and at least one film is in contact with the third substrate.

An electronic device according to an eighth embodiment of the present technology is, for example, an electronic device on which the solid-state imaging device according to any one of the first to eighth embodiments of the present technology is mounted.

Figure 42:
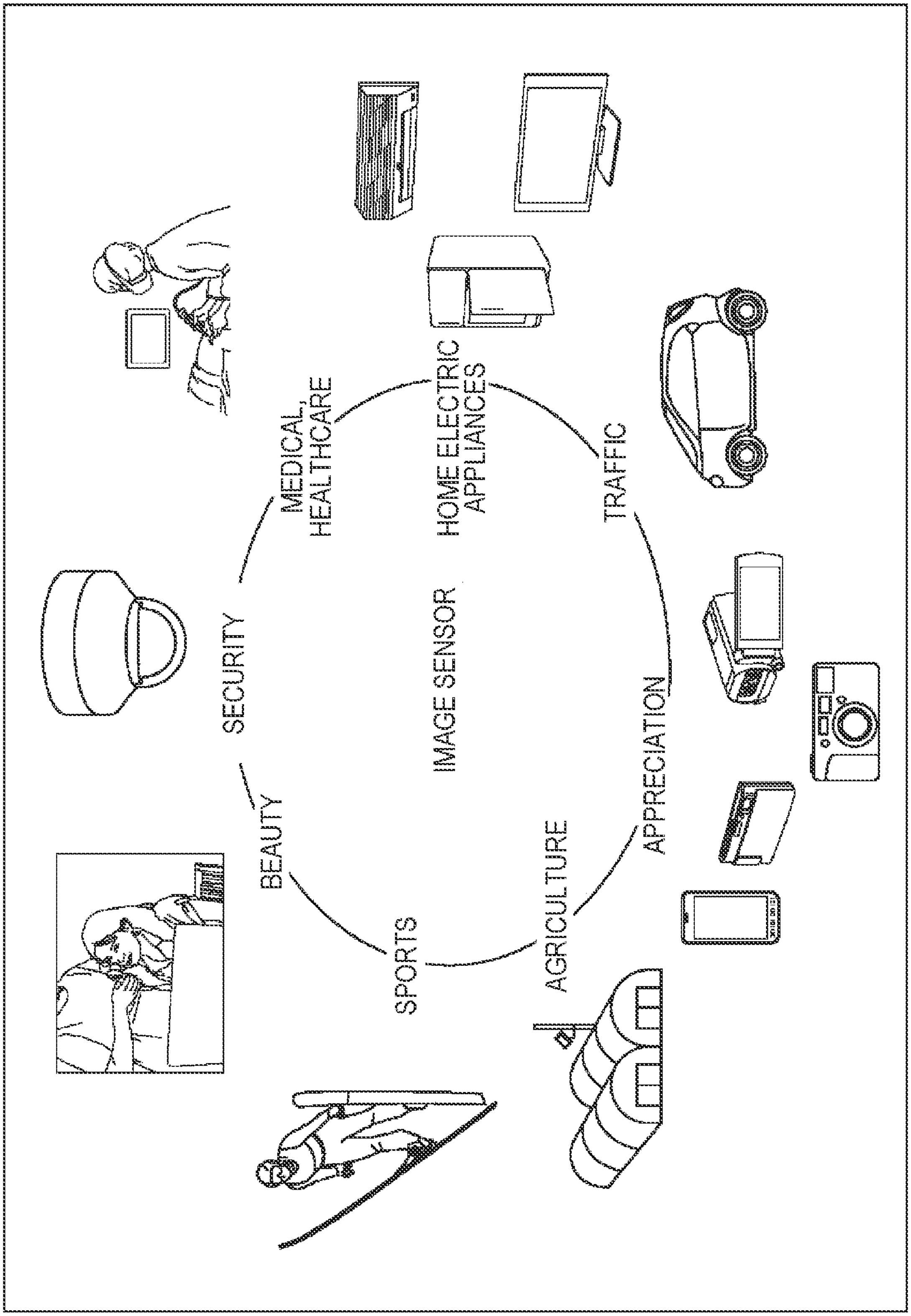
FIG. 42 is a diagram illustrating usage examples of the solid-state imaging devices according to the first to sixth embodiments to which the present technology is applied.

10. Usage Example of Solid-State Imaging Device to which Present Technology is Applied FIG. 42 is a diagram illustrating exemplary use of the solid-state imaging device according to the first to sixth embodiments of the present technology as an image sensor.

The solid-state imaging devices of the first to sixth embodiments described above can be used, for example, in various cases of sensing light such as visible light, infrared light, ultraviolet light, and X-rays as follows. That is, as illustrated in FIG. 42, for example, the solid-state imaging device according to any one of the first to sixth embodiments can be used in a device (for example, the electronic device according to the eighth embodiment described above) used in a field of appreciation in which an image provided for appreciation is captured, a field of traffic, a field of home electric appliances, a field of medical and healthcare, a field of security, a field of beauty, a field of sports, a field of agriculture, or the like.

Specifically, in the field of appreciation, for example, the solid-state imaging device according to any one of the first to sixth embodiments can be used as a device for capturing an image to be provided for appreciation, such as a digital camera, a smartphone, or a mobile phone with a camera function.

In the field of traffic, for example, the solid-state imaging device according to any one of the first to sixth embodiments can be used as a device used for traffic, such as an in-vehicle sensor that captures images of the front, rear, surroundings, inside, and the like of an automobile for safe driving such as automatic stop, recognition of a driver's condition, and the like, a monitoring camera that monitors traveling vehicles and roads, and a distance measuring sensor that measures a distance between vehicles and the like.

In the field of home appliances, for example, the solid-state imaging device according to any one of the first to sixth embodiments can be used in a device provided for home appliances, such as a television receiver, a refrigerator, or an air conditioner, in order to image a gesture of a user and operate the device according to the gesture.

In the medical and healthcare field, for example, the solid-state imaging device according to any one of the first to sixth embodiments can be used for a device provided for medical and healthcare, such as an endoscope or a device that performs angiography by receiving infrared light.

In the field of security, for example, the solid-state imaging device according to any one of the first to sixth embodiments can be used for a device provided for security, such as a monitoring camera for crime prevention or a camera for person authentication.

In the field of beauty, for example, the solid-state imaging device according to any one of the first to sixth embodiments can be used for a device provided for beauty, such as a skin measuring instrument for imaging skin or a microscope for imaging a scalp.

In the field of sports, for example, the solid-state imaging device according to any one of the first to sixth embodiments can be used for a device provided for sports, such as an action camera or a wearable camera for sports or the like.

In the field of agriculture, for example, the solid-state imaging device according to any one of the first to sixth embodiments can be used in a device provided for agricultural use, such as a camera for monitoring the condition of fields and crops.

Figure 43:
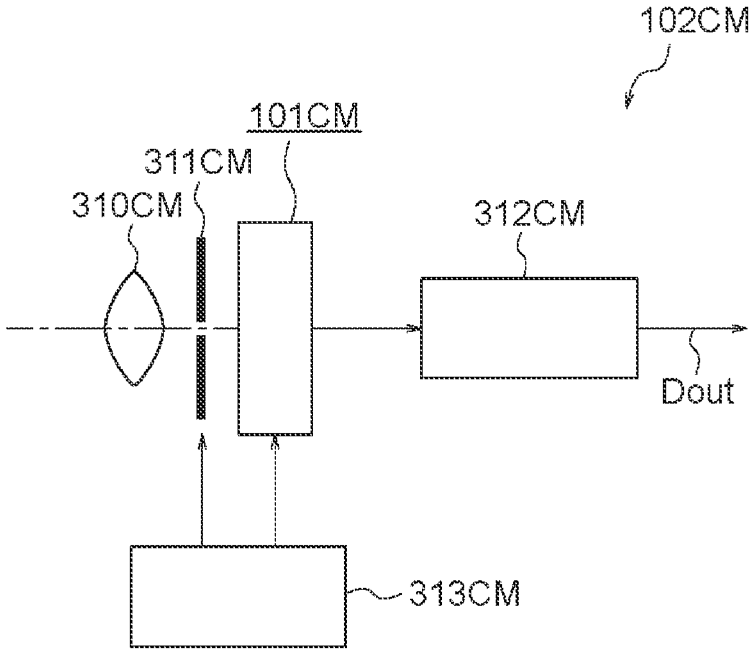
FIG. 43 is a functional block diagram of an example of an electronic device according to an eighth embodiment to which the present technology is applied.

Next, usage examples of the solid-state imaging devices according to the first to sixth embodiments of the present technology will be specifically described. For example, the solid-state imaging device according to any one of the first to sixth embodiments described above can be applied to any type of electronic device having an imaging function, such as a camera system such as a digital still camera or a video camera, or a mobile phone having an imaging function, as the solid-state imaging device 101CM. FIG. 43 illustrates a schematic configuration of an electronic device 102 (camera) CM as an example. The electronic device 102CM is, for example, a video camera capable of capturing a still image or a moving image, and includes a solid-state imaging device 101CM, an optical system (optical lens) 310CM, a shutter device 311CM, a drive unit 313CM that drives the solid-state imaging device 101CM and the shutter device 311CM, and a signal processing unit 312CM.

The optical system 310CM guides image light (incident light) from a subject to a pixel unit included in the solid-state imaging device 101CM. The optical system 310CM may include a plurality of optical lenses. The shutter device 311CM controls a light irradiation period and a light shielding period for the solid-state imaging device 101CM. The drive unit 313CM controls the transfer operation of the solid-state imaging device 101CM and the shutter operation of the shutter device 311CM. The signal processing unit 312CM performs various types of signal processing on a signal output from the solid-state imaging device 101CM. A video signal Dout after the signal processing is stored in a storage medium such as a memory or output to a monitor or the like.

11. Application Example to Endoscopic Surgery System

The present technology can be applied to various products. For example, the technology according to the present disclosure (the present technology) may be applied to an endoscopic surgical system.

Figure 44:
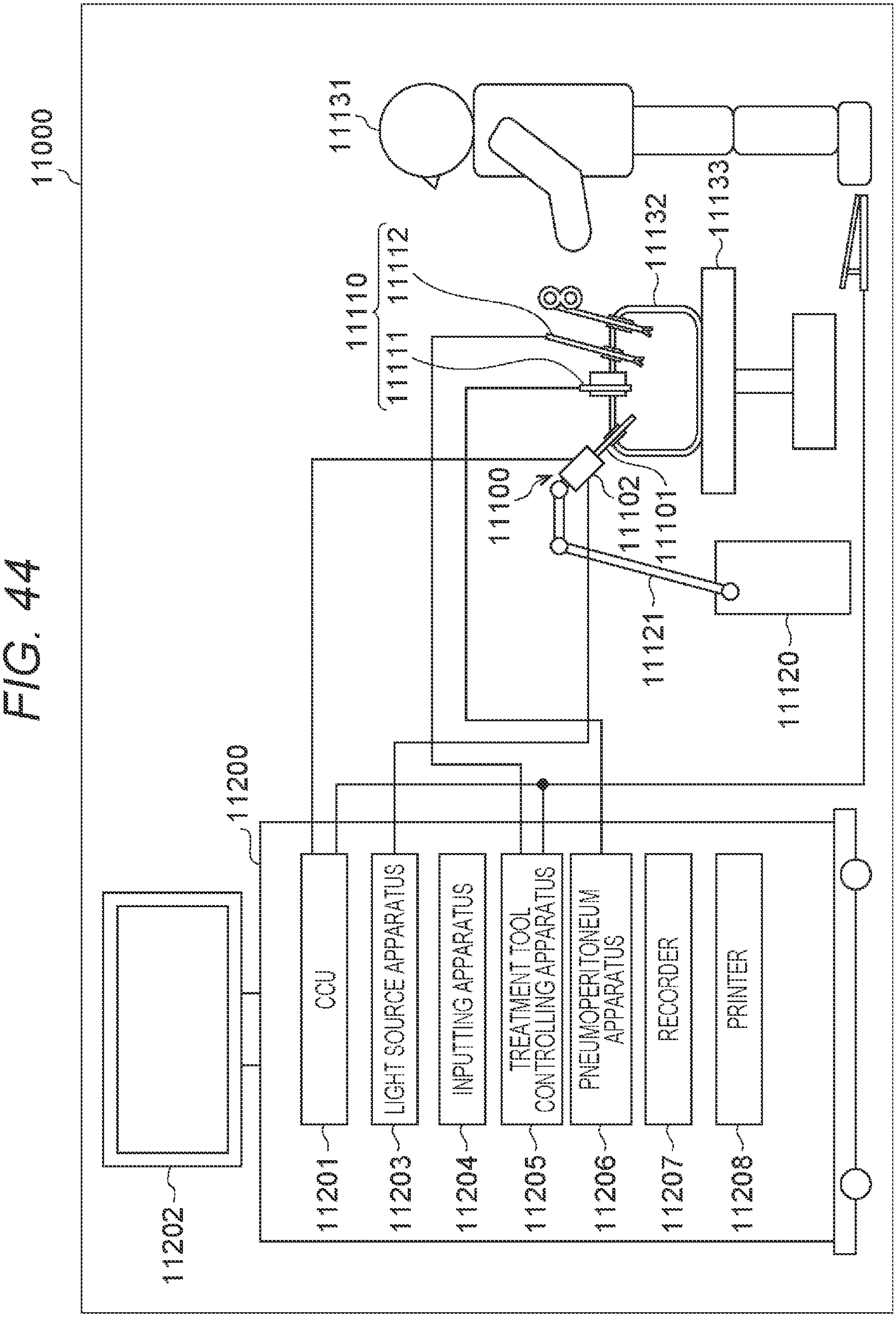
FIG. 44 is a diagram illustrating an example of a schematic configuration of an endoscopic surgery system.

FIG. 44 is a diagram illustrating an example of a schematic configuration of an endoscopic surgery system to which the technology according to an embodiment of the present disclosure (present technology) can be applied.

In FIG. 44, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

Figure 45:
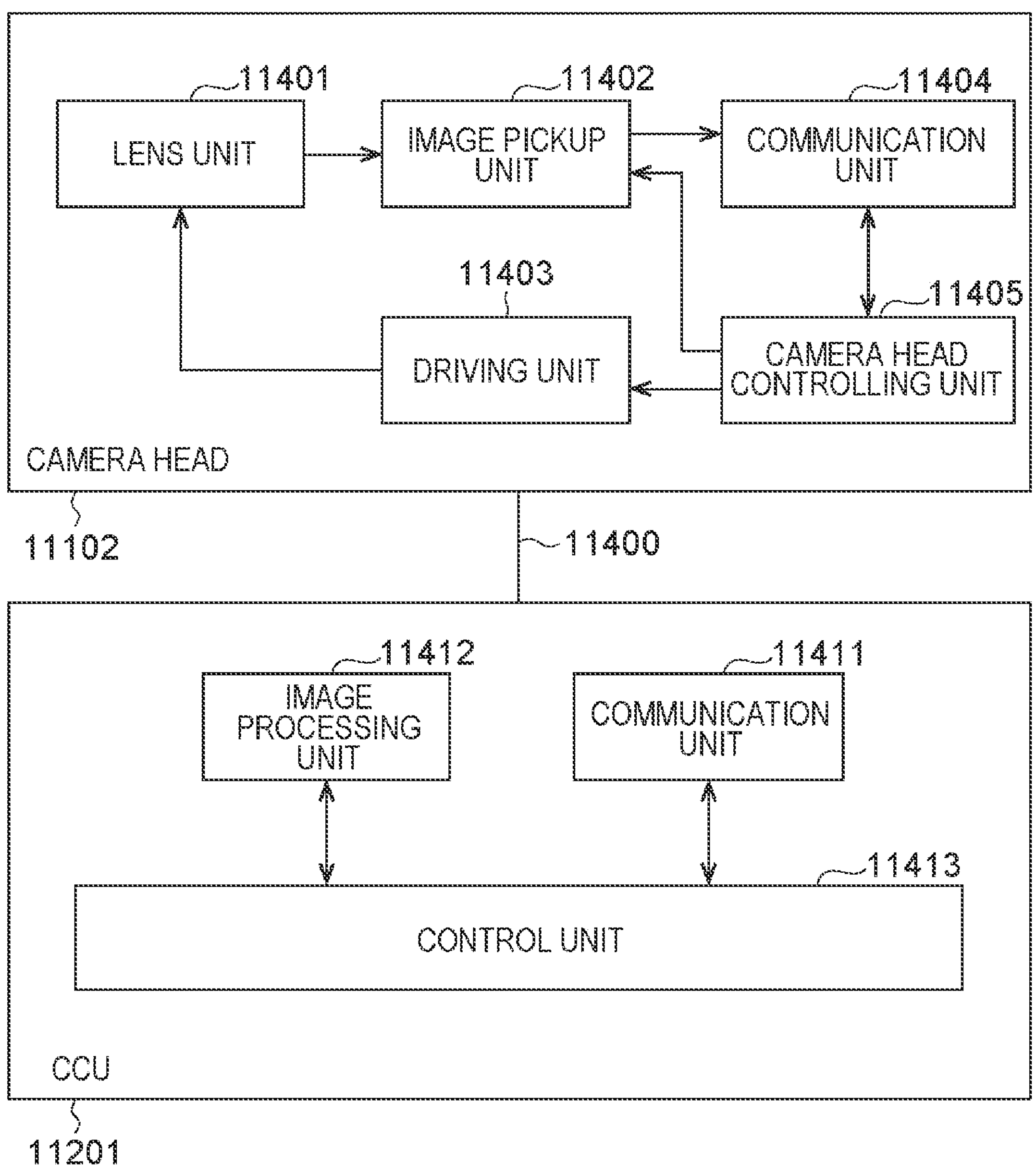
FIG. 45 is a block diagram illustrating an example of a functional configuration of a camera head and a camera control unit (CCU).

FIG. 45 is a block diagram illustrating an example of a functional configuration of the camera head 11102 and the CCU 11201 illustrated in FIG. 44.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The image pickup unit 11402 includes an imaging element. The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. Alternatively, the image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

An example of the endoscopic surgery system to which the technology according to the present disclosure can be applied has been described above. The technology according to the present disclosure can be applied to the endoscope 11100, (the image pickup unit 11402 of) the camera head 11102, and the like among the configurations described above. Specifically, the solid-state imaging device 111 of the present disclosure can be applied to the image pickup unit 10402. By applying the technology according to the present disclosure to (the image pickup unit 11402 of) the endoscope 11100, the camera head 11102, and the like, it is possible to improve the yield and reduce the cost related to manufacturing.

Here, the endoscopic surgery system has been described as an example, but the technology according to the present disclosure may be applied to, for example, a microscopic surgery system or the like.

12. Application Example to Mobile Body

The technology according to the present disclosure (present technology) can be applied to various products. For example, the technology according to the present disclosure may be realized as a device mounted on any type of mobile body such as an automobile, an electric vehicle, a hybrid electric vehicle, a motorcycle, a bicycle, a personal mobility, an airplane, a drone, a ship, and a robot.

Figure 46:
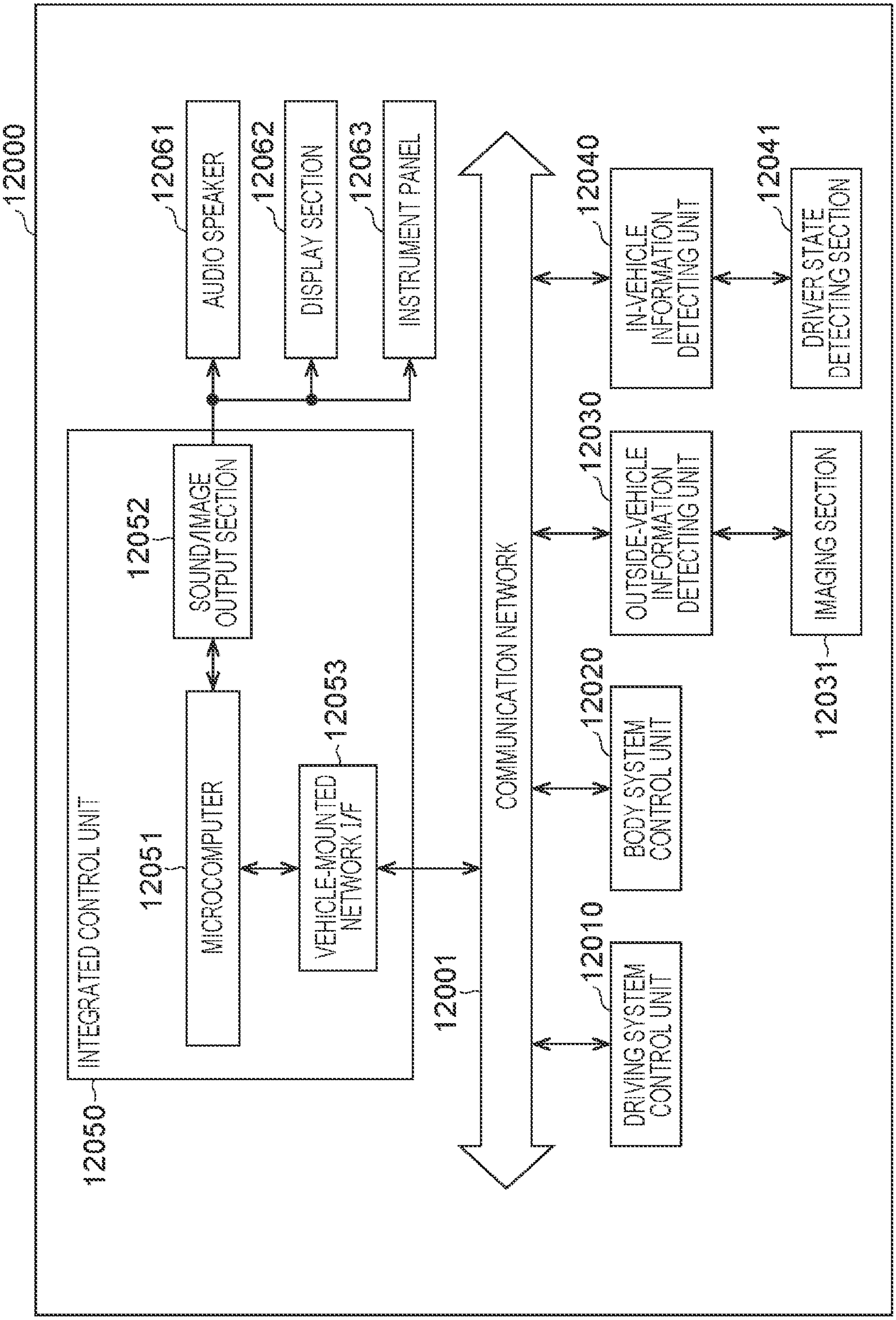
FIG. 46 is a block diagram illustrating an example of schematic configuration of a vehicle control system.

FIG. 46 is a block diagram illustrating an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 46, the vehicle control system 12000 includes a driving system control unit 12010, a body system control unit 12020, an outside-vehicle information detecting unit 12030, an in-vehicle information detecting unit 12040, and an integrated control unit 12050. Furthermore, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automated driving, which makes the vehicle to travel automatedly without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

Furthermore, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 46, an audio speaker 12061, a display section 12062, and an instrument panel 12063 are illustrated as the output device. The display section 12062 may, for example, include at least one of an on-board display and a head-up display.

Figure 47:
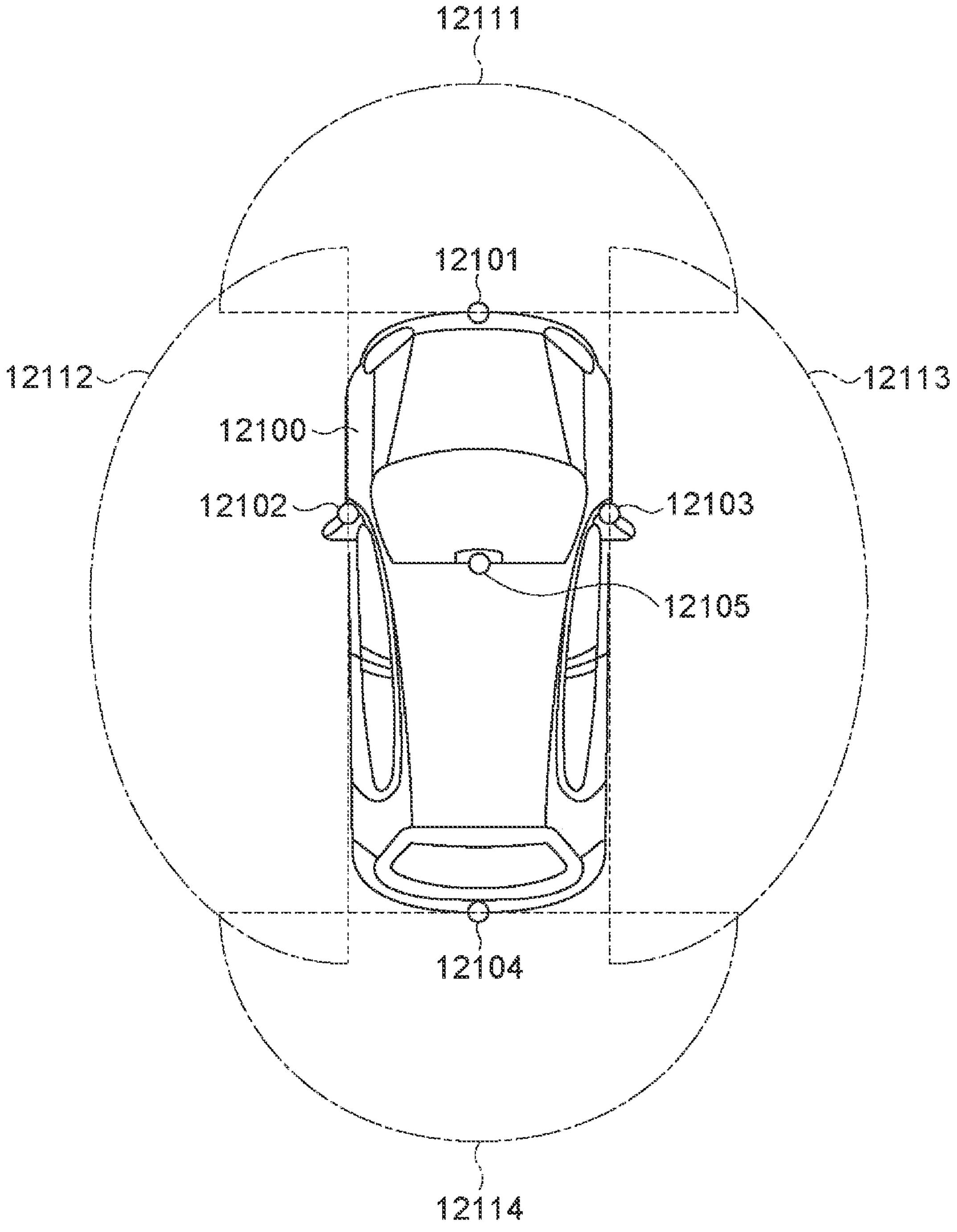
FIG. 47 is an explanatory diagram illustrating an example of installation positions of an outside-vehicle information detecting unit and an imaging section.

FIG. 47 is a diagram illustrating an example of the installation position of the imaging section 12031.

In FIG. 47, the vehicle 12100 includes imaging sections 12101, 12102, 12103, 12104, and 12105 as the imaging section 12031.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The front images acquired by the imaging sections 12101 and 12105 are mainly used for detecting a preceding vehicle, a pedestrian, an obstacle, a traffic light, a traffic sign, a lane, or the like.

Note that FIG. 47 illustrates an example of imaging ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automated driving that makes the vehicle travel automatedly without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

An example of the vehicle control system to which the technology according to the present disclosure (present technology) can be applied has been described above. The technology according to the present disclosure can be applied to, for example, the imaging section 12031 and the like among the configurations described above. Specifically, the solid-state imaging device 111 of the present disclosure can be applied to the imaging section 12031. By applying the technology according to the present disclosure to the imaging section 12031, it is possible to improve the yield and reduce the manufacturing cost.

Note that the present technology is not limited to the above-described embodiments and application examples, and various modifications can be made without departing from the gist of the present technology.

Furthermore, the effects described in the present specification are merely examples and are not limited, and other effects may be provided.

Furthermore, the present technology can also have the following configurations.

[1]

A solid-state imaging device including:

a first substrate;

a second substrate laminated on the first substrate by direct bonding on a side opposite to a light incident side of the first substrate, the second substrate having a size different from a size of the first substrate;

a third substrate provided on a side opposite to a light incident side of the second substrate; and an insulating layer formed between the first substrate and the third substrate, in which the third substrate includes a well formed on a light incident side of the third substrate.

[2]

The solid-state imaging device according to [1], in which the third substrate is in contact with the second substrate, and the third substrate is in contact with the insulating layer.

[3]

The solid-state imaging device according to [1] or [2], in which the well included in the third substrate is formed to separate a different potential region included in the second substrate.

[4]

The solid-state imaging device according to any one of [1] to [3], in which the well included in the third substrate is formed up to a region corresponding to an end surface of the second substrate facing the insulating layer, and an end surface of the well and the end surface of the second substrate are substantially flush with each other.

[5]

The solid-state imaging device according to any one of [1] to [3], in which the well included in the third substrate is formed up to a region corresponding to an outside of an end surface of the second substrate facing the insulating layer, an end surface of the well is not flush with the end surface of the second substrate, and the end surface of the well is located in a region corresponding to the insulating layer.

[6]

The solid-state imaging device according to any one of [1] to [5], in which the second substrate includes a well formed on a side opposite to a light incident side of the second substrate.

[7]

The solid-state imaging device according to any one of [1] to [6], in which

- the third substrate includes a well formed on a light incident side of the third substrate and a substrate, and
- at least one of at least a part of the well or at least a part of the substrate is electrically connected to the second substrate.

[8]

The solid-state imaging device according to any one of [1] to [7], in which at least a partial region of a surface of the third substrate in contact with the second substrate has a resistance of 1 Ωcm or more.

[9]

The solid-state imaging device according to any one of [1] to [8], in which a surface of the second substrate in contact with the third substrate and a surface of the insulating layer in contact with the third substrate are substantially flush with each other.

[10]

The solid-state imaging device according to any one of [1] to [9], in which the insulating layer includes at least one of an inorganic oxide film or an organic film.

[11]

A solid-state imaging device including:

- a first substrate;
- a second substrate laminated on the first substrate by direct bonding on a side opposite to a light incident side of the first substrate, the second substrate having a size different from a size of the first substrate;
- a third substrate provided on a side opposite to a light incident side of the second substrate; and
- an insulating layer formed between the first substrate and the third substrate,
- in which the third substrate is in contact with the second substrate, and
- the third substrate is in contact with the insulating layer.

[12]

The solid-state imaging device according to [11], in which the third substrate includes a well formed on a light incident side of the third substrate.

[13]

The solid-state imaging device according to [12], in which the well included in the third substrate is formed to separate a different potential region included in the second substrate.

[14]

The solid-state imaging device according to [12] or [13], in which the well included in the third substrate is formed up to a region corresponding to an end surface of the second substrate facing the insulating layer, and an end surface of the well and the end surface of the second substrate are substantially flush with each other.

[15]

The solid-state imaging device according to [12] or [13], in which the well included in the third substrate is formed up to a region corresponding to an outside of an end surface of the second substrate facing the insulating layer, an end surface of the well is not flush with the end surface of the second substrate, and the end surface of the well is located in a region corresponding to the insulating layer.

[16]

The solid-state imaging device according to any one of [12] to [15], in which the second substrate includes a well formed on a side opposite to a light incident side of the second substrate.

[17]

The solid-state imaging device according to any one of [11] to [16], in which

- the third substrate includes a well formed on a light incident side of the third substrate and a substrate, and
- at least one of at least a part of the well or at least a part of the substrate is electrically connected to the second substrate.

[18]

The solid-state imaging device according to any one of [11] to [17], in which at least a partial region of a surface of the third substrate in contact with the second substrate has a resistance of 1 Ωcm or more.

[19]

The solid-state imaging device according to any one of [11] to [18], in which a surface of the second substrate in contact with the third substrate and a surface of the insulating layer in contact with the third substrate are substantially flush with each other.

[20]

The solid-state imaging device according to any one of [11] to [19], in which the insulating layer includes at least one of an inorganic oxide film or an organic film.

[21]

A solid-state imaging device including:

- a first substrate;
- a second substrate laminated on the first substrate by direct bonding on a side opposite to a light incident side of the first substrate, the second substrate having a size different from a size of the first substrate;
- a third substrate provided on a side opposite to a light incident side of the second substrate;
- an insulating layer formed between the first substrate and the third substrate; and
- at least one film formed between the first substrate and the third substrate and including a material different from a material constituting the insulating layer,
- in which the insulating layer and the at least one film are formed in order from a light incident side,
- the at least one film is in contact with the second substrate,
- the at least one film is in contact with the insulating layer, and
- the at least one film is in contact with the third substrate.

[22]

The solid-state imaging device according to [21], in which a surface of the second substrate in contact with the at least one film is substantially flush with a surface of the insulating layer in contact with the at least one film.

[23]

The solid-state imaging device according to [21], in which a surface of the second substrate in contact with the at least one film is not flush with a surface of the insulating layer in contact with the at least one film, and the surface of the insulating layer in contact with the at least one film is located closer to a side of the first substrate than the surface of the second substrate in contact with the at least one film.

[24]

The solid-state imaging device according to any one of [21] to [23], in which the insulating layer includes at least one of an inorganic oxide film or an organic film.

[25]

The solid-state imaging device according to any one of [21] to [24], further including a metal diffusion prevention film, in which the metal diffusion prevention film is formed to cover a surface of the insulating layer that is not in contact with the at least one film, and the metal diffusion prevention film is disposed between the second substrate and the insulating layer and between the first substrate and the insulating layer.

[26]

The solid-state imaging device according to any one of [21] to [25], in which the at least one film includes at least one selected from a group consisting of a heat dissipation member, a member having a film stress larger than a film stress of Si, and a member having a linear expansion coefficient larger than a linear expansion coefficient of Si.

[27]

The solid-state imaging device according to [26], in which the heat dissipation member contains at least one selected from a group consisting of SiC, AlN, SiN, Cu, Al, and C.

[28]

The solid-state imaging device according to [26] or [27], in which the member having a film stress larger than the film stress of Si contains at least one selected from a group consisting of $SiO_2$, SiN, Cu, Al, and C.

[29]

An electronic device equipped with a solid-state imaging device according to any one of [1] to [28].

[30]

A solid-state imaging device including:

a first substrate;

a second substrate laminated on the first substrate by direct bonding on a side opposite to a light incident side of the first substrate, the second substrate having a size different from a size of the first substrate;

a third substrate provided on a side opposite to a light incident side of the second substrate; and a cavity formed between the first substrate and the third substrate, in which the third substrate is in contact with the second substrate, and the third substrate is in contact with the cavity.

[31]

The solid-state imaging device according to [30], in which the third substrate includes a well formed on a light incident side of the third substrate.

[32]

The solid-state imaging device according to [31], in which the well included in the third substrate is formed to separate a different potential region included in the second substrate.

[33]

The solid-state imaging device according to [31] or [32], in which the well included in the third substrate is formed up to a region corresponding to an end surface of the second substrate facing the cavity, and an end surface of the well and the end surface of the second substrate are substantially flush with each other.

[34]

The solid-state imaging device according to [31] or [32], in which the well included in the third substrate is formed up to a region corresponding to an outside of an end surface of the second substrate facing the cavity, an end surface of the well is not flush with the end surface of the second substrate, and the end surface of the well is located in a region corresponding to the cavity.

[35]

The solid-state imaging device according to any one of [31] to [34], in which the second substrate includes a well formed on a side opposite to a light incident side of the second substrate.

[36]

The solid-state imaging device according to any one of [30] to [35], in which the third substrate includes a well formed on a light incident side of the third substrate and a substrate, and at least one of at least a part of the well or at least a part of the substrate is electrically connected to the second substrate.

[37]

The solid-state imaging device according to any one of [30] to [36], in which at least a partial region of a surface of the third substrate in contact with the second substrate has a resistance of 1 Ωcm or more.

[38]

The solid-state imaging device according to any one of [30] to [37], in which a surface of the second substrate in contact with the third substrate and a surface of the cavity in contact with the third substrate are substantially flush with each other.

[39]

A solid-state imaging device including:

a first substrate;

a second substrate laminated on the first substrate by direct bonding on a side opposite to a light incident side of the first substrate, the second substrate having a size different from a size of the first substrate;

a third substrate provided on a side opposite to a light incident side of the second substrate;

a cavity formed between the first substrate and the third substrate; and at least one film formed between the first substrate and the third substrate, in which the cavity and the at least one film are formed in order from a light incident side, the at least one film is in contact with the second substrate, the at least one film is in contact with the cavity, and the at least one film is in contact with the third substrate.

[40]

The solid-state imaging device according to [39], in which a surface of the second substrate in contact with the at least one film is substantially flush with a surface of the cavity in contact with the at least one film.

[41]

The solid-state imaging device according to [39], in which a surface of the second substrate in contact with the at least one film is not flush with a surface of the cavity layer in contact with the at least one film, and the surface of the cavity in contact with the at least one film is located closer to a side of the first substrate than the surface of the second substrate in contact with the at least one film.

[42]

The solid-state imaging device according to any one of [39] to [41], further including a metal diffusion prevention film, in which the metal diffusion prevention film is formed to cover a surface of the cavity that is not in contact with the at least one film, and the metal diffusion prevention film is disposed between the second substrate and the cavity and between the first substrate and the cavity layer.

[43]

The solid-state imaging device according to any one of [39] to [42], in which the at least one film includes at least one selected from a group consisting of a heat dissipation member, a member having a film stress larger than a film stress of Si, and a member having a linear expansion coefficient larger than a linear expansion coefficient of Si.

[44]

The solid-state imaging device according to [43], in which the heat dissipation member contains at least one selected from a group consisting of SiC, AlN, SiN, Cu, Al, and C.

[45]

The solid-state imaging device according to [43] or [44], in which the member having a film stress larger than the film stress of Si contains at least one selected from a group consisting of $SiO_2$, SiN, Cu, Al, and C.

[46]

An electronic device equipped with a solid-state imaging device according to any one of [30] to [45].

[47]

A method of manufacturing a solid-state imaging device, the solid-state imaging device including:

a first substrate;

a second substrate laminated on the first substrate by direct bonding on a side opposite to a light incident side of the first substrate, the second substrate having a size different from a size of the first substrate;

a third substrate provided on a side opposite to a light incident side of the second substrate; and an insulating layer formed between the first substrate and the third substrate, in which the third substrate is in contact with the second substrate, and the third substrate is in contact with the insulating layer, the method including:

bonding the first substrate formed by a semiconductor process, and the second substrate determined to be a non-defective product by an electrical inspection out of the second substrates formed by a semiconductor process;

depositing an insulating layer on the first substrate and the second substrate from a side of the second substrate after the bonding; and thinning the second substrate and the insulating layer until the second substrate is exposed after depositing the layer.

[48]

The method of manufacturing the solid-state imaging device according to [47], in which a surface of the second substrate obtained by the thinning is substantially flush with a surface of the insulating layer obtained by the thinning.

[49]

The method of manufacturing a solid-state imaging device according to [47], in which a surface of the second substrate obtained by the thinning and a surface of the insulating layer obtained by the thinning are not flush with each other, and the surface of the insulating layer is located closer to a side of the first substrate than the surface of the second substrate.

REFERENCE SIGNS LIST

50, 50-U Insulating layer

101-1, 102-1, 103-1, 104-1, 105-1, 106-1, 107-1, 108-1, 109-1, 110-1, 111-1, 112-1, 121-1, 122-1, 123-1, 124-1, 126-1, 127-1, 128-1, 129-1, 130-1, 131-1, 132-1, 133-1, 134-1, 135-1, 1001-1, 1002-1, 1003-1, 1004-1, 1005-1, 1250-1, 1360-1, 1370-1 First substrate

101-2, 102-2, 103-2, 104-2, 105-2, 106-2, 107-2, 108-2, 109-2, 110-2, 111-2, 112-2, 121-2, 122-2, 123-2, 124-2, 126-2, 127-2, 128-2, 129-2, 130-2, 131-2, 132-2, 133-2, 134-2, 135-2, 1001-2, 1002-2, 1003-2, 1004-2, 1005-2, 1250-2, 1360-2, 1370-2 Second substrate

101-3, 102-3, 103-3, 104-3, 105-3, 106-3, 107-3, 108-3, 109-3, 110-3, 111-3, 112-3, 121-3, 122-3, 123-3, 124-3, 126-3, 127-3, 128-3, 129-3, 130-3, 131-3, 132-3, 133-3, 134-3, 135-3, 1001-3, 1002-3, 1003-3, 1004-3, 1005-3, 1250-3, 1360-3, 1370-3 Third substrate

101, 102, 103, 104, 105, 106, 107, 108, 109, 110, 111, 112, 113A, 113B, 113C, 114A, 114B, 114C, 115A, 115B, 116A, 116B, 116C, 117A, 117B, 117C, 118A, 118B, 118C, 119A, 119B, 120A, 120B, 120C, 121, 122, 123, 124, 126, 127, 128, 129, 130, 131, 132, 133, 134, 135, 1001, 1002, 1003, 1004, 1005, 1250, 1360, 1370 Solid-state imaging device

What is claimed is:

1. A solid-state imaging device, comprising:

a first substrate;

a second substrate laminated on the first substrate by direct bonding on a side opposite to a light incident side of the first substrate, the second substrate having a size different from a size of the first substrate;

a third substrate provided on a side opposite to a light incident side of the second substrate; and an insulating layer formed between the first substrate and the third substrate, wherein the third substrate includes a well formed on a light incident side of the third substrate, wherein the third substrate is in contact with the second substrate, and wherein the third substrate is in contact with the insulating layer.

2. The solid-state imaging device according to claim 1, wherein the well included in the third substrate has an end surface that is not flush with an end surface of the second substrate.

3. The solid-state imaging device according to claim 1, wherein the second substrate includes a well formed on a side opposite to a light incident side of the second substrate.

4. The solid-state imaging device according to claim 1, wherein at least one of at least a part of the well or at least a part of the third substrate is electrically connected to the second substrate.

5. The solid-state imaging device according to claim 1, wherein the insulating layer includes at least one of an inorganic oxide film or an organic film.

6. The solid-state imaging device according to claim 1, wherein the well included in the third substrate is formed up to a region corresponding to an end surface of the second substrate facing the insulating layer, and wherein an end surface of the well and the end surface of the second substrate are substantially flush with each other.

7. The solid-state imaging device according to claim 1, wherein the well included in the third substrate is formed up to a region corresponding to an outside of an end surface of the second substrate facing the insulating layer, wherein an end surface of the well is not flush with the end surface of the second substrate, and wherein the end surface of the well is located in a region corresponding to the insulating layer.

8. The solid-state imaging device according to claim 1, wherein at least a partial region of a surface of the third substrate in contact with the second substrate has a resistance of 1 Ωcm or more.

9. The solid-state imaging device according to claim 1, wherein a surface of the second substrate in contact with the third substrate and a surface of the insulating layer in contact with the third substrate are substantially flush with each other.

10. A solid-state imaging device, comprising:

a first substrate;

a second substrate laminated on the first substrate by direct bonding on a side opposite to a light incident side of the first substrate, the second substrate having a size different from a size of the first substrate;

a third substrate provided on a side opposite to a light incident side of the second substrate; and an insulating layer formed between the first substrate and the third substrate, wherein the third substrate includes a well formed on a light incident side of the third substrate, wherein the well included in the third substrate is formed up to a region corresponding to an end surface of the second substrate facing the insulating layer, and wherein an end surface of the well and the end surface of the second substrate are substantially flush with each other.

11. The solid-state imaging device according to claim 10, wherein the second substrate includes a well formed on a side opposite to a light incident side of the second substrate.

12. The solid-state imaging device according to claim 10, wherein at least one of at least a part of the well or at least a part of the third substrate is electrically connected to the second substrate.

13. The solid-state imaging device according to claim 10, wherein at least a partial region of a surface of the third substrate in contact with the second substrate has a resistance of 1 Ωcm or more.

14. The solid-state imaging device according to claim 10, wherein a surface of the second substrate in contact with the third substrate and a surface of the insulating layer in contact with the third substrate are substantially flush with each other.

15. The solid-state imaging device according to claim 10, wherein the insulating layer includes at least one of an inorganic oxide film or an organic film.

16. A solid-state imaging device, comprising:

a first substrate;

a second substrate laminated on the first substrate by direct bonding on a side opposite to a light incident side of the first substrate, the second substrate having a size different from a size of the first substrate;

a third substrate provided on a side opposite to a light incident side of the second substrate; and an insulating layer formed between the first substrate and the third substrate, wherein the third substrate includes a well formed on a light incident side of the third substrate, wherein the well included in the third substrate is formed up to a region corresponding to an outside of an end surface of the second substrate facing the insulating layer, wherein an end surface of the well is not flush with the end surface of the second substrate, and wherein the end surface of the well is located in a region corresponding to the insulating layer.

17. The solid-state imaging device according to claim 16, wherein the second substrate includes a well formed on a side opposite to a light incident side of the second substrate.

18. The solid-state imaging device according to claim 16, wherein at least one of at least a part of the well or at least a part of the third substrate is electrically connected to the second substrate.

19. A solid-state imaging device, comprising:

a first substrate;

a second substrate laminated on the first substrate by direct bonding on a side opposite to a light incident side of the first substrate, the second substrate having a size different from a size of the first substrate;

a third substrate provided on a side opposite to a light incident side of the second substrate; and an insulating layer formed between the first substrate and the third substrate, wherein the third substrate includes a well formed on a light incident side of the third substrate, and wherein at least a partial region of a surface of the third substrate in contact with the second substrate has a resistance of 1 Ωcm or more.

20. A solid-state imaging device, comprising:

a first substrate;

a second substrate laminated on the first substrate by direct bonding on a side opposite to a light incident side of the first substrate, the second substrate having a size different from a size of the first substrate;

a third substrate provided on a side opposite to a light incident side of the second substrate; and an insulating layer formed between the first substrate and the third substrate, wherein the third substrate includes a well formed on a light incident side of the third substrate, and wherein a surface of the second substrate in contact with the third substrate and a surface of the insulating layer in contact with the third substrate are substantially flush with each other.

* * * * *